US008168973B2

(12) United States Patent
Yamazaki et al.

(10) Patent No.: US 8,168,973 B2
(45) Date of Patent: May 1, 2012

(54) THIN FILM TRANSISTOR

(75) Inventors: Shunpei Yamazaki, Tokyo (JP); Koji Dairiki, Kanagawa (JP); Hidekazu Miyairi, Kanagawa (JP); Akiharu Miyanaga, Kanagawa (JP); Takuya Hirohashi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 136 days.

(21) Appl. No.: 12/467,005

(22) Filed: May 15, 2009

(65) Prior Publication Data

US 2010/0127261 A1 May 27, 2010

(30) Foreign Application Priority Data

May 16, 2008 (JP) ................................. 2008-130169

(51) Int. Cl.
*H01L 29/786* (2006.01)
(52) U.S. Cl. ................................ 257/57; 257/E29.291
(58) Field of Classification Search .................. 257/57
See application file for complete search history.

(56) References Cited

U.S. PATENT DOCUMENTS

| | | | | |
|---|---|---|---|---|
| 4,226,898 A * | 10/1980 | Ovshinsky et al. | ........... | 438/483 |
| 5,311,040 A * | 5/1994 | Hiramatsu et al. | ........... | 257/57 |
| 6,544,908 B1 * | 4/2003 | Weimer et al. | ............. | 438/798 |
| 6,838,300 B2 * | 1/2005 | Jin et al. | .................... | 438/38 |
| 6,882,031 B2 * | 4/2005 | Weimer et al. | ............. | 257/626 |
| 6,921,937 B2 * | 7/2005 | Weimer | ........................ | 257/319 |
| 7,012,753 B2 * | 3/2006 | Quesnel | ........................ | 359/584 |
| 2003/0148630 A1 * | 8/2003 | Hu | ................................ | 438/781 |
| 2004/0198046 A1 * | 10/2004 | Yu-Chou et al. | ............. | 438/689 |
| 2006/0024866 A1 * | 2/2006 | Gan et al. | ...................... | 438/149 |
| 2008/0121896 A1 * | 5/2008 | Takizawa et al. | ............. | 257/76 |
| 2008/0296704 A1 * | 12/2008 | Wakabayashi | ................ | 257/410 |
| 2009/0321737 A1 * | 12/2009 | Isa et al. | ........................ | 257/57 |
| 2009/0321743 A1 * | 12/2009 | Isa et al. | ........................ | 257/66 |

FOREIGN PATENT DOCUMENTS

| | | |
|---|---|---|
| JP | 64-073671 | 3/1989 |
| JP | 2000-277439 | 10/2000 |
| JP | 2005-049832 | 2/2005 |

OTHER PUBLICATIONS

Lee, et al., "High-Mobility Nanocrystalline Silicon Thin-Film Transistors Fabricated by Plasma-Enhanced Chemical Vapor Deposition", Applied Physics Letters, vol. 86, 2005, pp. 222106-1-222106-3.
Lee, et al. High Mobility N-Channel and P-Channel Nanocrystalline Silicon Thin-Film Transistors, IEDM 05: Technical Digest of International Electron Device Meeting, 2005, pp. 937-940.

(Continued)

*Primary Examiner* — Fernando L Toledo
*Assistant Examiner* — Robert Carpenter
(74) *Attorney, Agent, or Firm* — Nixon Peabody LLP; Jeffrey L. Costellia

(57) ABSTRACT

The thin film transistor includes, over a substrate having an insulating surface, a gate insulating layer covering a gate electrode, an amorphous semiconductor layer over the gate insulating layer, a semiconductor layer including an impurity element imparting one conductivity type over the amorphous semiconductor layer. The amorphous semiconductor layer comprises an NH radical. Defects of the amorphous semiconductor layer are reduced by cross-linking dangling bonds with the NH radical in the amorphous semiconductor layer.

18 Claims, 30 Drawing Sheets

OTHER PUBLICATIONS

Lee, et al., Directly Deposited Nanocrystalline Silicon Thin-Film Transistors With Ultra High Mobilities, Applied Physics Letters, vol. 89, 2006, American Institute of Physics, pp. 252101-1-252101-3.

Lee, et al., "How to Achieve High Mobility Thin Film Transistors by Direct Deposition of Silicon Using 13.56 MHz RF PECVD", IEEE IEDM, 2006, pp. 295-298.

Esmaeili-Rad, et al., "High Stability, Low Leakage Nanocrystalline Silicon Bottom Gate Thin Film Transistors for AMOLED Displays", IEEE IEDM, 2006, pp. 303-306.

Lee, et al., "Leakage Current Mechanisms in Top-Gate Nanocrystalline Silicon Thin Film Transistors", Applied Physics Letters, vol. 92, 2008, American Institute of Physics, pp. 083509-1-083509-3.

Lee, et al., "Stability of nc-Si:H TFTs With Silicon Nitride Gate Dielectric", IEEE Transactions on Electron Device, vol. 54, No. 1, Jan. 2007, pp. 45-51.

Sazonov, et al., "Low-Temperature Materials and Thin Film Transistors for Flexible Electronics", Proceedings of the IEEE, vol. 93, No. 8, Aug. 2005, pp. 1420-1428.

Lee, et al., "Top-Gate TFTS Using 13.56 MNZ PECVD Microcrystalline Silicon", IEEE Electron Device Letters, vol. 26, No. 9, Sep. 2005, pp. 637-639.

Lee, et al., "Postdeposition Thermal Annealing and Material Stability of 75 ° C Hydrogenated Nanocrystalline Silicon Plasma-Enhanced Chemical Vapor Deposition Films", Journal of Applied Physics, vol. 98, 2005 American Institute of Physics, pp. 034305-1-034305-7.

Fujiwara, et al., "Stress-Induced Nucleation of Microcrystalline Silicon From Amorphous Phase", Japanese Journal of Applied Physics, vol. 41, Part 1, No. 5A, May 2002, pp. 2821-2828.

Kamei, et al, "A Significant Reduction of Impurity Contents in Hydrogenated Microcrystalline Silicon Films for Increased Grain Size and Reduced Defect Density", Japanese Journal of Applied Physics, vol. 37, Part 2, No. 3A, Mar. 1, 1998, pp. L265-L268.

Lee, et al., "Stability of nc-Si:H TFTs With Silicon Nitride Gate Dielectric", IEEE Transactions on Electron Devices, vol. 54, No. 1, Jan. 2007, pp. 45-51.

* cited by examiner

FIG. 25A
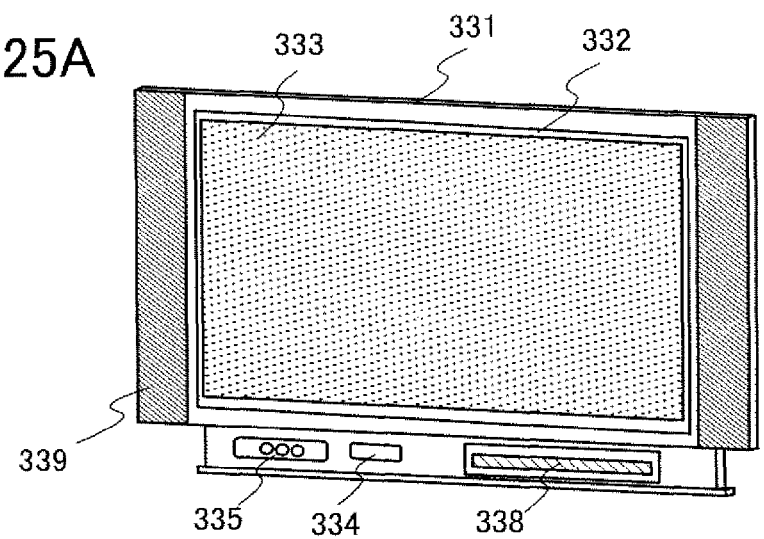
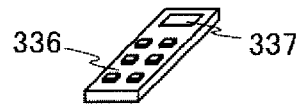
FIG. 25B
FIG. 25C
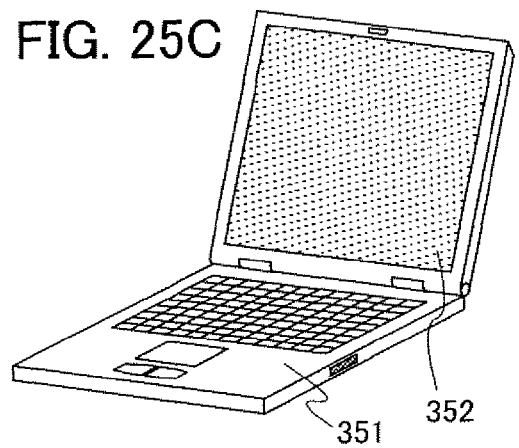
FIG. 25D
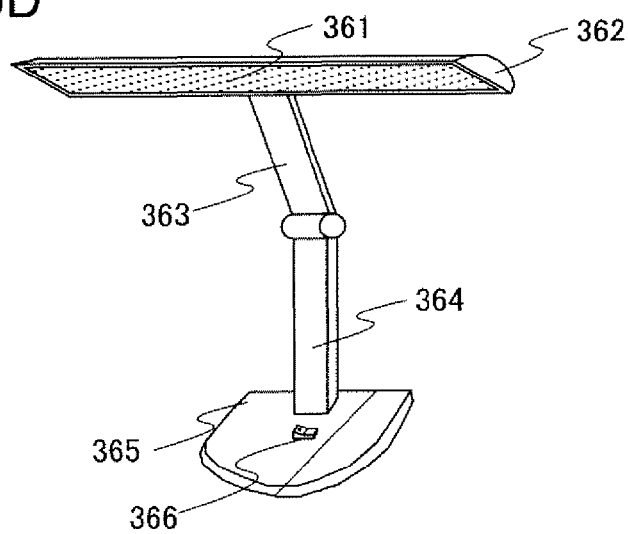

antibonding orbital bonding orbital

_US 8,168,973 B2_

THIN FILM TRANSISTOR

BACKGROUND OF THE INVENTION

1. Field of the Invention

The present invention relates to a thin film transistor and a method for manufacturing the same, and a semiconductor device and a display device using the thin film transistor.

2. Description of the Related Art

Thin film transistors (hereinafter also referred to as "TFTs") are already widely used in a technical field of liquid crystal displays. A TFT is a kind of field-effect transistor, and is named after the fact that a semiconductor film for forming a channel is formed thin. At present, a technique to manufacture a TFT using amorphous silicon as the semiconductor thin film for a channel formation region has already been put into practical use. Further, thin film transistors using amorphous silicon for a channel formation region includes a thin film transistor with high carrier mobility in which photodegradation of amorphous silicon can be prevented from occurring by using amorphous silicon with n$^-$ type conductivity which includes nitrogen at more than or equal to $10^{15}/cm^3$ and less than or equal to $10^{19}/cm^3$ (Patent Document 1).

[Citation List]
[Patent Document 1]
  Japanese Published Patent Application No. S64-73671

SUMMARY OF THE INVENTION

However, use of an n$^-$ type amorphous silicon layer only means change in physical property values of the amorphous silicon layer and it does not always improve element characteristics of a thin film transistor or the like. A semiconductor element is operated by intentionally controlling flow of carriers (electrons or holes) through a semiconductor; however, there is no effect unless film quality of an amorphous silicon layer can be improved in consideration of a place where the carriers flow.

It is an object of one embodiment of the present invention to provide an amorphous semiconductor layer in which defects is reduced, and a method for manufacturing the amorphous semiconductor layer. It is another object of one embodiment of the present invention to control film quality of an amorphous semiconductor layer so that operation characteristics of a semiconductor element typified by a thin film transistor can be improved. It is still another object of one embodiment of the present invention to improve characteristics of a semiconductor element typified by a TFT by controlling a process of forming an amorphous semiconductor layer. It is yet another object of one embodiment of the present invention to improve an on-state current and mobility of a thin film transistor.

It is a gist of one embodiment of the present invention to reduce defects of an amorphous semiconductor layer by cross-linking dangling bonds with an NH radical in the amorphous semiconductor layer, or to form an amorphous semiconductor layer including an NH radical with which dangling bonds are cross-linked.

An amorphous semiconductor layer is formed using a semiconductor source gas (for example, a silicon hydride gas, a silicon fluoride gas, or a silicon chloride gas) and a dilution gas as reaction gases. The reaction gases are introduced into an ultrahigh vacuum reaction chamber in which the oxygen concentration is reduced, and glow discharge plasma is produced with a predetermined pressure kept. Thus, a film is deposited on a substrate placed in the reaction chamber. Further, deposition of a film is performed such that an NH radical, or a nitrogen element and a hydrogen element is/are introduced into a reaction chamber at an early stage of deposition or in deposition, and defects in the film are cross-linked with an NH radical. Thus, an amorphous semiconductor layer in which defects are reduced is formed.

Dangling bonds in a semiconductor layer are defects, which inhibit movement of carriers. However, by cross-linking dangling bonds with an NH radical, a path through which carriers move is formed. An amorphous semiconductor layer has a short-range order and, unlike a crystal lattice, does not have regularly repeated patterns in structure. Therefore, many dangling bonds are included. The region including a large number of dangling bonds becomes a defect and thus becomes a portion by which carriers are captured. However, by cross-linking dangling bonds in an amorphous semiconductor layer with an NH radical, a defect level can be reduced. Further, electric conductivity of an amorphous semiconductor layer is increased by forming a path through which carriers move.

The concentration of nitrogen included in the amorphous semiconductor layer is preferably in the range that semiconductivity is kept and electric conductivity is increased.

Here, among impurity elements such as oxygen or nitrogen which suppress generation of crystal nuclei, an impurity element which does not form a carrier trap in silicon (for example, nitrogen) is selected. Further, the coordination number of silicon is reduced and the concentration of an impurity element which forms a dangling bond (for example, two-coordinate oxygen) is reduced. That is, it is preferable that the oxygen concentration measured by secondary ion mass spectroscopy be set to be lower than or equal to $5 \times 10^{18}$ cm$^{-3}$.

A thin film transistor which is one embodiment of the present invention is a thin film transistor in which an amorphous semiconductor layer having an NH radical with which semiconductors are cross-linked is included in a channel formation region. Further, the thin film transistor includes an amorphous semiconductor layer having an NH radical with which semiconductors are cross-linked, and includes a buffer layer formed using a conventional amorphous semiconductor over the amorphous semiconductor layer. The buffer layer is provided on the side opposite to a surface of the amorphous semiconductor layer in contact with a gate insulating layer; in other words, the buffer layer is provided on a so-called back channel side. That is, the buffer layer is provided between a pair of impurity semiconductor layers with one conductivity type which form source and drain regions, so that the amorphous semiconductor layer serving as a channel formation region is not exposed on the back channel side.

Note that in this specification, a concentration without mention of a measuring method is a concentration measured by secondary ion mass spectrometry (SIMS).

Note that, in this specification, an on-state current refers to a current which flows between a source electrode and a drain electrode when a transistor is in an on state. For example, in the case of an n-channel transistor, the on-state current refers to a current which flows between a source electrode and a drain electrode when a gate voltage is higher than a threshold voltage of a transistor.

In addition, an off-state current is a current which flows between a source electrode and a drain electrode when a transistor is in an off state. For example, in the case of an n-channel transistor, the off-state current refers to a current which flows between a source electrode and a drain electrode when the gate voltage is lower than the threshold voltage of a transistor.

According to one embodiment of the present invention, an amorphous semiconductor layer including an NH radical with which dangling bonds are cross-linked can be formed. By using such an amorphous semiconductor layer for a channel formation region of a thin film transistor, an on-state current and electron field-effect mobility can be improved.

BRIEF DESCRIPTION OF THE DRAWINGS

FIGS. 11A-1, 11A-2, 11B-1, and 11B-2 are diagrams illustrating examples of a method for manufacturing a thin film transistor according to an embodiment of the present invention.

FIGS. 25A to 25D are diagrams illustrating electronic devices or the like in each of which a thin film transistor of one embodiment of the present invention can be used.

DETAILED DESCRIPTION OF THE INVENTION

Figure 1A:
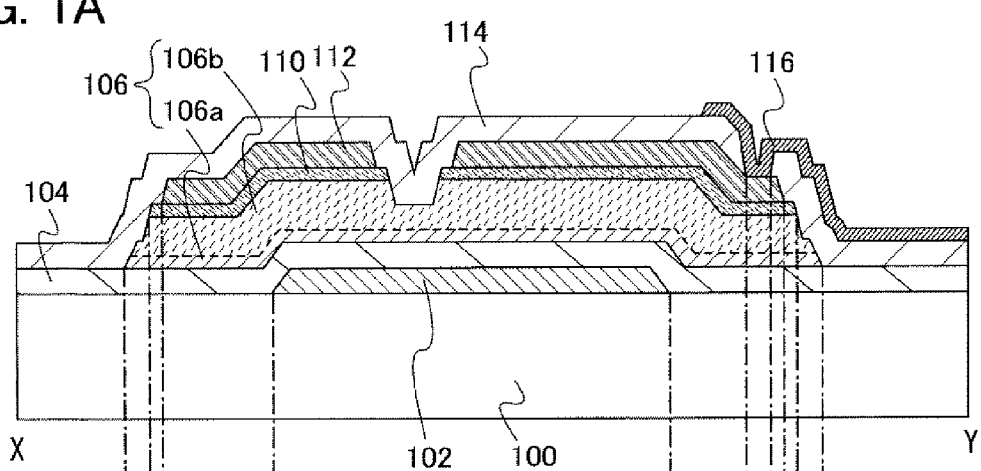
FIGS. 1A and 1B are diagrams illustrating an example of a thin film transistor according to an embodiment of the present invention.

Embodiments of the present invention will be described below with reference to drawings. However, the present invention is not limited to the following description. It is easily understood by those skilled in the art that the mode and detail can be variously changed unless departing from the scope and spirit of the present invention. Therefore, the present invention should not be construed as being limited to the description of the embodiments to be given below. Note that in describing structures of the present invention with reference to drawings, the same reference numerals are used in common for the same portions in different drawings. Further, the same hatching pattern is applied to similar parts, and the similar parts are not especially denoted by reference numerals in some cases.

(Embodiment 1)

In this embodiment, an example of a mode of a thin film transistor is described with reference to drawings.

Figure 1B:
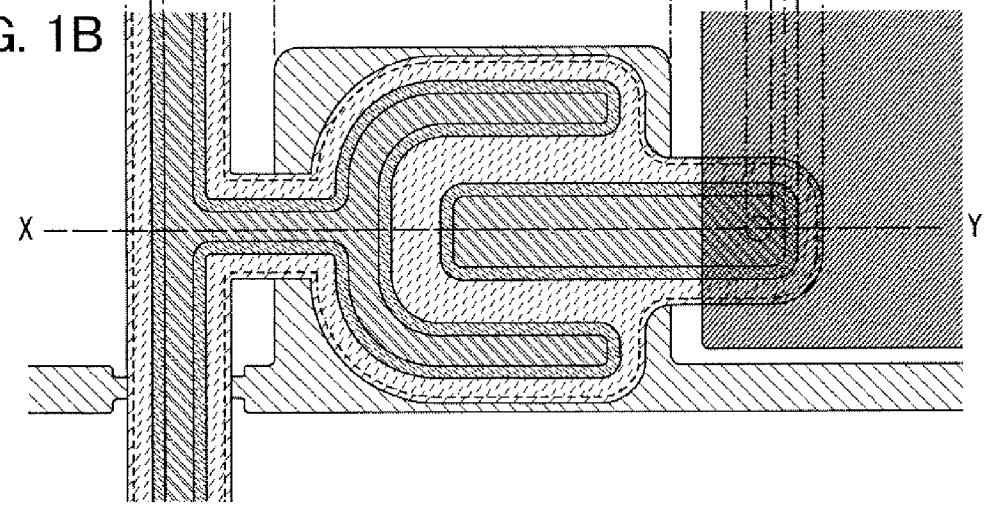

FIGS. 1A and 1B are a top view and a cross-sectional view of a thin film transistor according to this embodiment. The thin film transistor shown in FIG. 1A includes a gate electrode layer 102 over a substrate 100, a gate insulating layer 104 covering the gate electrode layer 102, an amorphous semiconductor layer 106 on and in contact with the gate insulating layer 104, and source and drain regions 110 on and in contact with part of the amorphous semiconductor layer 106. The amorphous semiconductor layer 106 includes an amorphous semiconductor layer 106a on the gate insulating layer 104 side and an amorphous semiconductor layer 106b on the source and drain regions 110 side. In addition, the thin film transistor includes wiring layers 112 on and in contact with the source and drain regions 110. The wiring layers 112 form source and drain electrodes. The thin film transistor further includes an insulating layer 114 which serves as a protective layer over the wiring layers 112. Each layer is patterned into a desired shape.

Note that the thin film transistor shown in FIGS. 1A and 1B can be applied to a pixel transistor provided in a pixel portion of a display device typified by a liquid crystal display device, a light-emitting device, or the like. Therefore, in the shown example, an opening portion is provided in the insulating layer 114 and a pixel electrode layer 116 is provided over the insulating layer 114, so that the pixel electrode layer 116 and one of the wiring layers 112 are connected to each other.

Further, one of the source and drain electrodes formed with a U-shape (or a reversed C shape or a horseshoe shape) surrounds the other of the source and drain electrodes. The source electrode is kept at an almost uniform distance from the drain electrode (see FIG. 1B).

By forming source and drain electrodes of a thin film transistor with the above-described shape, the channel width of the thin film transistor can be increased, and the amount of current is increased. In addition, variations in electric characteristics can be reduced. Further, reduction of reliability due to the misalignment of mask patterns in a manufacturing process can be prevented. However, this embodiment is not limited thereto, and one of the source and drain electrodes are not necessarily formed with a U-shape.

Here, the amorphous semiconductor layer 106 which is one of primary features of this embodiment is described. The amorphous semiconductor layer 106 serves as a channel formation region of a thin film transistor. A feature of the amorphous semiconductor layer 106 is to include an NH radical with which dangling bonds are cross-linked. An amorphous semiconductor layer has a short-range order and, unlike a crystal lattice, does not have regularly repeated patterns in structure. Thus, an amorphous semiconductor layer includes a large number of dangling bonds. The region including a large number of dangling bonds becomes a defect and thus becomes a portion by which carriers are captured. In addition, electric conductivity is lowered. These cause low on-state current and low electron field-effect mobility of a thin film transistor. However, in the amorphous semiconductor layer 106 of this embodiment, the dangling bonds are cross-linked with an NH radical and thus the number of dangling bonds therein is reduced. That is, a defect level is reduced. Further, carriers pass through the bonding portion formed by cross-linking dangling bonds with an NH radical. Therefore, high electric conductivity is obtained as compared to a conventional amorphous semiconductor layer. As a result, by using the amorphous semiconductor layer described in this embodiment for a channel formation region of a thin film transistor, an on-state current and electron field-effect mobility of a thin film transistor can be improved.

Note that the phrase "dangling bonds of an amorphous semiconductor layer are cross-linked with an NH radical" means that different bonds of an NH radical are bonded to different semiconductor elements of an amorphous semiconductor layer. Thus, a first bond of an N atom is bonded to an H atom, a second bond of the N atom is bonded to a first semiconductor atom, and a third bond of the N atom is bonded to a second semiconductor atom. That is, an N atom is bonded to a first semiconductor atom, a second semiconductor atom, and an H atom.

Note that in the amorphous semiconductor layer 106 of this embodiment, the amorphous semiconductor layer 106a on the gate insulating layer 104 side is an amorphous semiconductor layer including an NH radical with which dangling bonds are cross-linked and the amorphous semiconductor layer 106b on the source and drain regions 110 side is a conventional amorphous semiconductor layer without an NH radical with which dangling bonds are cross-linked. In order to improve electron field-effect mobility and an on-state current in a thin film transistor, it is preferable that the number of defects be small and that electric conductivity be high in the amorphous semiconductor layer on the gate insulating layer side. Therefore, it is preferable that at least the amorphous semiconductor layer 106a be the amorphous semiconductor layer including an NH radical with which dangling bonds are cross-linked. The amorphous semiconductor layer 106a is preferably formed to a thickness of greater than or equal to 5 nm and less than or equal to 60 nm, more preferably to a thickness of greater than or equal to 10 nm and less than or equal to 30 nm. Further, the amorphous semiconductor layer 106b is preferably formed to a thickness of greater than or equal to 30 nm and less than or equal to 200 nm. Moreover, in order to obtain low off-state current in a thin film transistor, an amorphous semiconductor layer on the source and drain regions side is preferably formed of an amorphous semiconductor layer with low electric conductivity. Therefore, it is preferable that the amorphous semiconductor layer 106b be the conventional amorphous semiconductor layer without an NH radical with which dangling bonds are cross-linked. Thus, in the thin film transistor described in this embodiment, electron field-effect mobility is high, the on-state current is high, and the off-state current is low.

In this embodiment, the amorphous semiconductor layer 106 includes two layers, the amorphous semiconductor layer 106a and the amorphous semiconductor layer 106b. However, the amorphous semiconductor layer 106 may be formed using an amorphous semiconductor including an NH radical with which dangling bonds are cross-linked. That is, the amorphous semiconductor layer 106 may be formed using only an amorphous semiconductor which is used for forming the amorphous semiconductor layer 106a. An amorphous semiconductor including an NH radical with which dangling bonds are cross-linked has a low defect level, and thus, carriers are not easily captured. Therefore, by using the amorphous semiconductor layer for a channel formation region of a thin film transistor, an on-state current and electron field-effect mobility can be improved.

Here, among impurity elements such as oxygen or nitrogen, an impurity element which does not form a carrier trap in silicon (for example, nitrogen) is selected. Further, the coordination number of silicon is reduced and the concentration of an impurity element which forms a dangling bond (for example, two-coordinate oxygen) is reduced. Therefore, it is preferable that the oxygen concentration of an amorphous semiconductor layer be reduced. In specific, it is preferable that the oxygen concentration measured by secondary ion mass spectroscopy be set to be lower than or equal to $5 \times 10^{18}$ cm$^{-3}$.

The nitrogen concentration of an amorphous semiconductor layer is preferably in the range that semiconductivity is kept and electric conductivity is increased. If the nitrogen concentration is too high, semiconductivity is lowered and insulation is increased. Thus, such an amorphous semiconductor layer does not serve as a channel formation region. In contrast, if the nitrogen concentration is too low, an amorphous semiconductor layer is similar to a conventional amorphous semiconductor layer, which means that electric conductivity is not improved.

Hereinafter, a model is described in which, by cross-link of a plurality of dangling bonds included in an amorphous semiconductor layer as described above with nitrogen, typically an NH radical, carriers easily flow.

Figure 2:
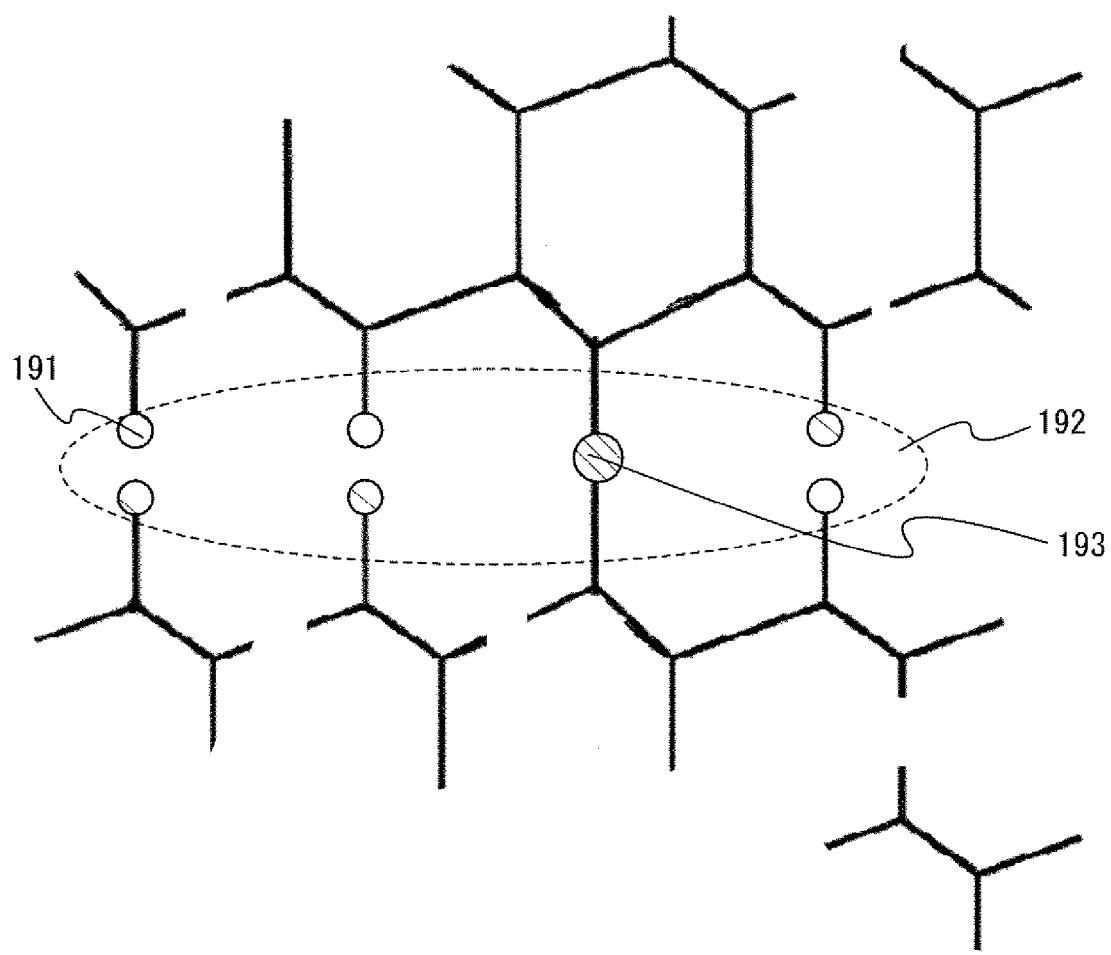
FIG. 2 is a diagram illustrating a semiconductor layer included in a thin film transistor according to an embodiment of the present invention.
Figure 3:
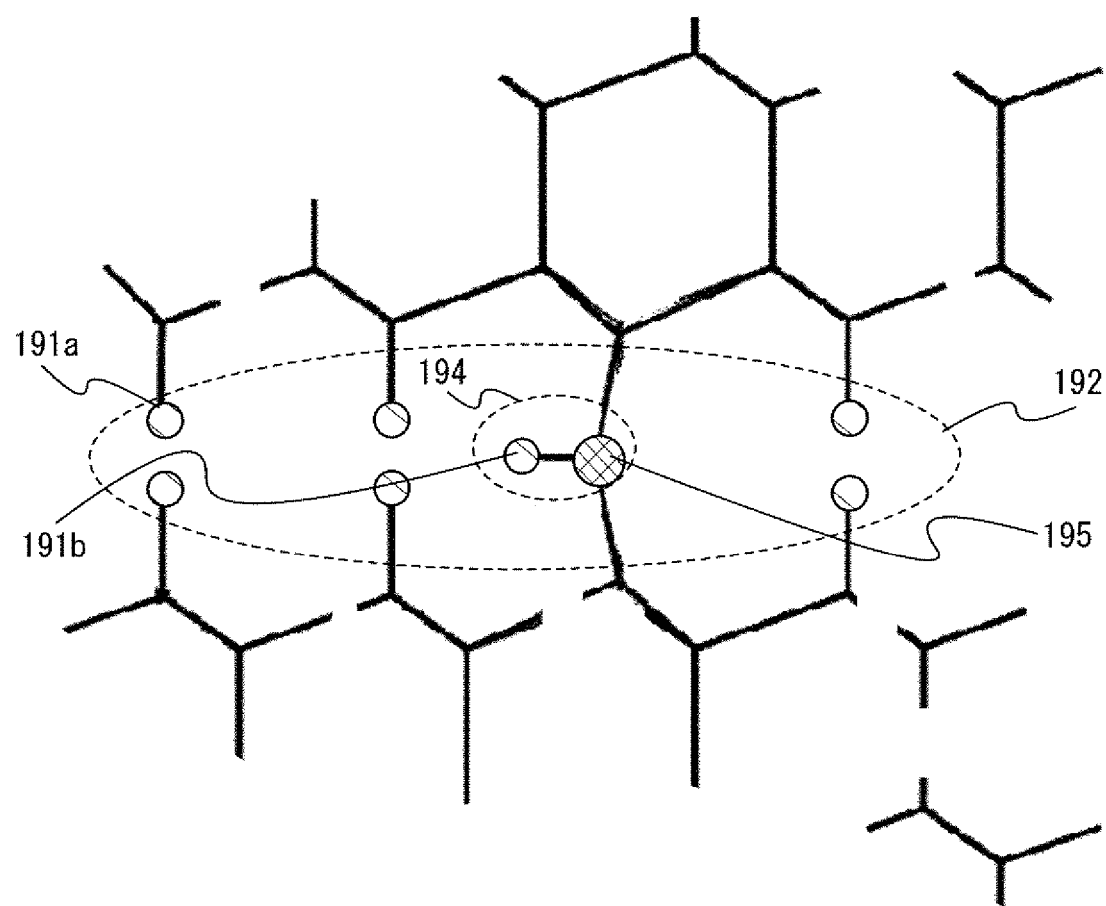
FIG. 3 is a diagram illustrating a semiconductor layer included in a thin film transistor according to an embodiment of the present invention.

Here, the lowest unoccupied molecular orbital (LUMO) of an amorphous silicon layer, which is at a level contributing to conduction of n-type carriers (that is, the lowest level in a conduction band), is simulated with respect to a model (model 1) as shown in FIG. 2 and a model (model 2) as shown in FIG. 3. In the model 1, in a silicon layer including a defect 192 in which dangling bonds of Si atoms are terminated by an H atom 191, one pair of the dangling bonds is cross-linked with an O atom 193. In the model 2, in a silicon layer including a defect 192 in which dangling bonds of Si atoms are terminated by an H atom 191a, one pair of the dangling bonds is cross-linked with an NH radical 194. As software for the simulation, first-principle calculation software using a density functional theory is used. Note that in FIG. 3, the NH radical 194 includes a nitrogen atom 195 and a hydrogen atom 191b. In addition, an intersection point of lines corresponds to a silicon atom, and each line corresponds to a bond of a silicon atom. Further, in order to evaluate effectiveness of an oxygen atom and an NH radical, all dangling bonds except dangling bonds which are cross-linked with an oxygen atom or an NH radical are terminated by hydrogen atoms.

Figure 4:
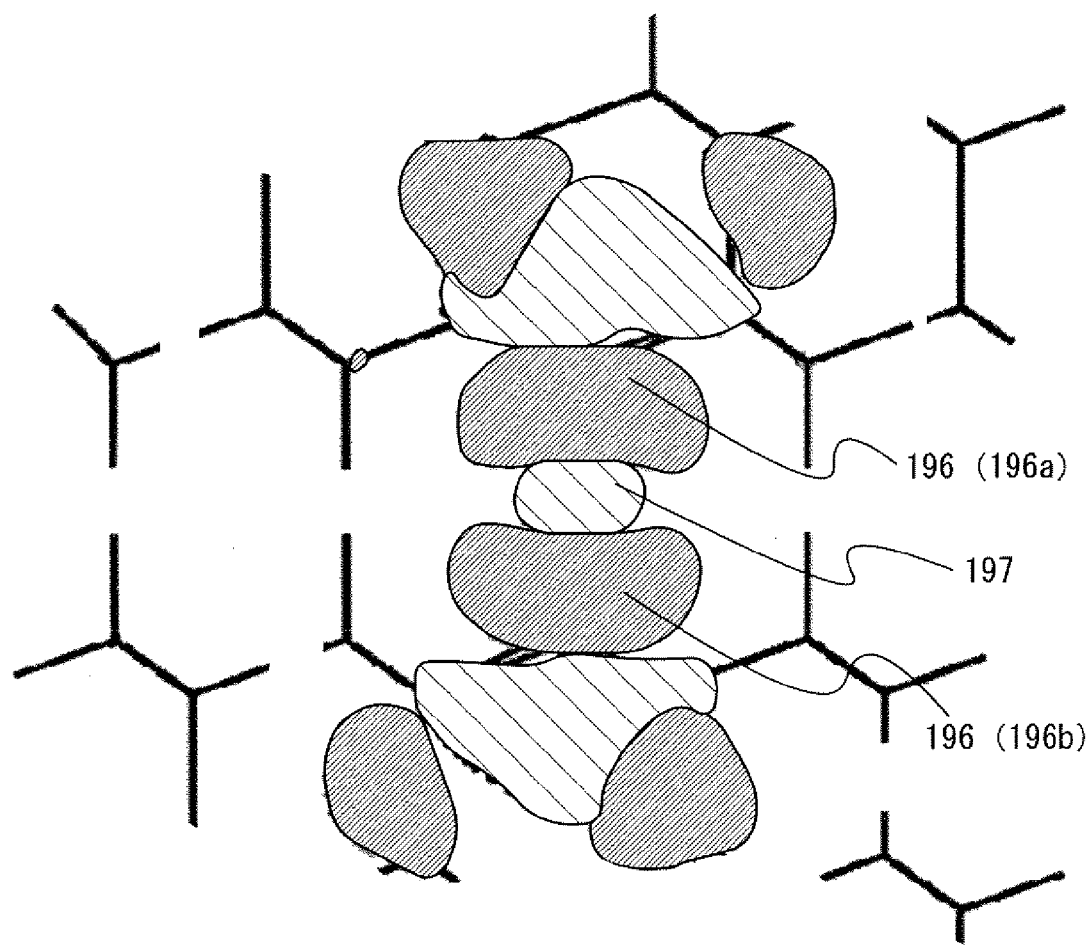
FIG. 4 is a diagram illustrating a semiconductor layer included in a thin film transistor according to an embodiment of the present invention.
Figure 5:
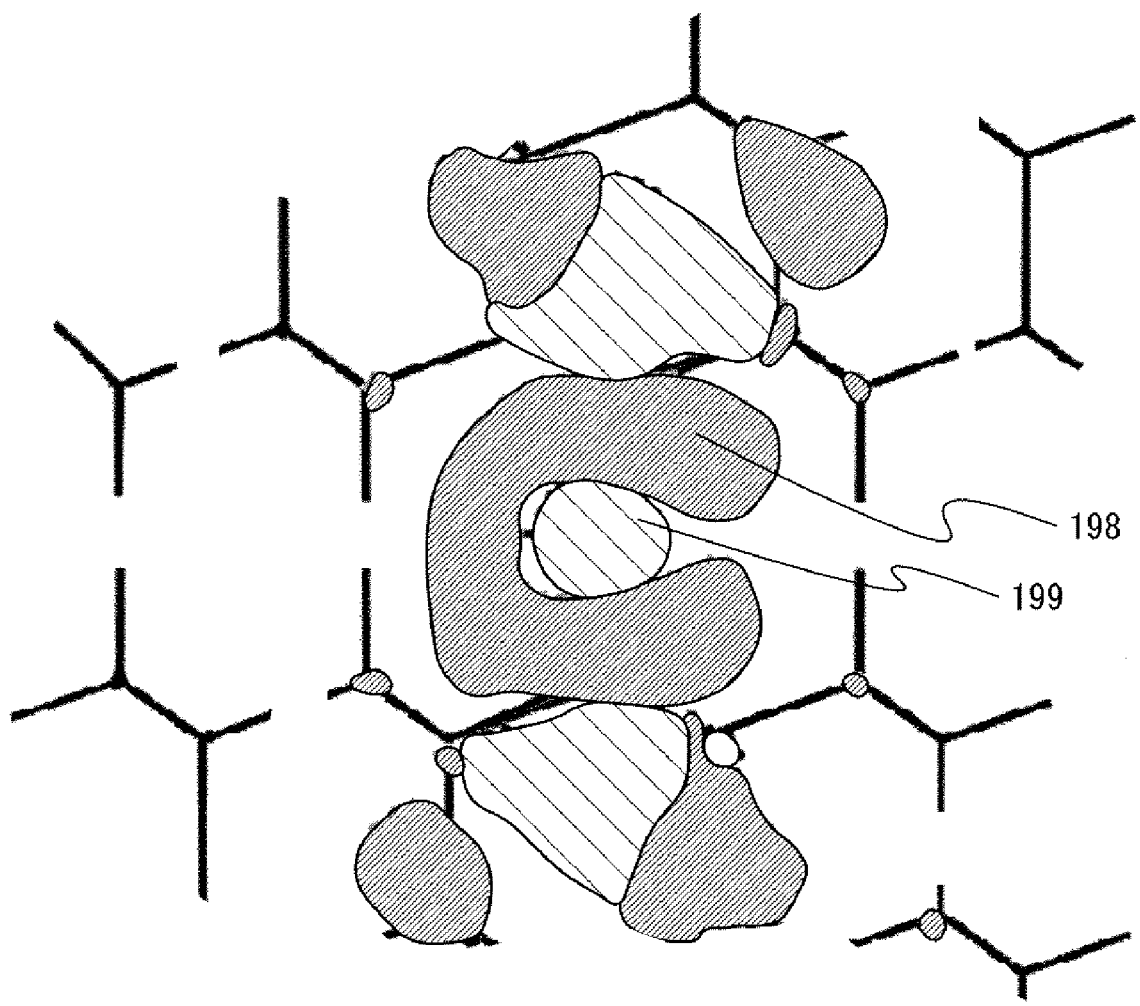
FIG. 5 is a diagram illustrating a semiconductor layer included in a thin film transistor according to an embodiment of the present invention.

FIG. 4 shows the result of calculation using the model 1, and FIG. 5 shows the result of calculation using the model 2.

FIG. 4 shows the shape of a wave function of a region in which Si atoms are cross-linked with an O atom and of the periphery of the region. In FIG. 4, regions 196 have a positive phase or a negative phase which is opposite to a region 197, and the regions 196 and the region 197 have the same absolute value. FIG. 5 shows the shape of a wave function of a region in which Si atoms are cross-linked with an NH radical and of the periphery of the region. In FIG. 5, a region 198 has a positive phase or a negative phase which is opposite to a region 199, and the region 198 and the region 199 have the same absolute value.

As shown in FIG. 4, in the case where dangling bonds of Si atoms are cross-linked with an O atom, regions with the same absolute value and the same phase of a wave function (for example, regions 196a and 196b) are separated. Therefore, carriers do not easily flow. That is, it is revealed that a bond which hinders movement of carriers is formed by including oxygen in an amorphous silicon layer, so that the amorphous silicon layer is reduced in carrier mobility.

In contrast, as shown in FIG. 5, in the case where dangling bonds of Si atoms are cross-linked with an NH radical, a region 198 having the same absolute value and the same phase of a wave function is connected to both a dangling bond of an Si atom and a dangling bond of another Si atom adjacent to the aforementioned Si atom. Therefore, carriers easily flow. That is, it is revealed that a bond which facilitates movement of carriers at a crystal grain boundary is formed by including an NH radical in an amorphous silicon layer, so that an amorphous silicon layer increases in carrier mobility. Further, it is likely that a thin film transistor increases in mobility.

From the above description, by cross-linking dangling bonds with an NH radical in an amorphous semiconductor layer, the bond becomes a bond through which carriers can be moved, whereby an amorphous semiconductor layer can increase in carrier mobility. Furthermore, by reducing oxygen concentration of an amorphous semiconductor layer, bonds which hinder movement of carriers in a defect can be reduced.

In an amorphous semiconductor layer, oxygen concentration is reduced and nitrogen concentration is controlled, and in addition, an NH radical is included, whereby defects can be reduced and carrier mobility can be improved. Further, by using the amorphous semiconductor layer for a channel formation region, electron field-effect mobility and an on-state current of a thin film transistor can be improved.

Further, an amorphous semiconductor layer in which dangling bonds are cross-linked with an NH radical may be used for a semiconductor layer to which an impurity element imparting one conductivity type is added which forms the source and drain regions 110, like the amorphous semiconductor layer 106a. In this case, an impurity element to be a donor or an acceptor is included in the amorphous semiconductor layer in which dangling bonds are cross-linked with an NH radical. In a semiconductor layer to which an impurity element imparting one conductivity type is added which forms the source and drain regions 110, dangling bonds are cross-linked with an NH radical, whereby defects can be reduced and the semiconductor layer to which an impurity element imparting one conductivity type is added can increase in carrier mobility. As a result, source and drain regions with low resistivity can be formed.

Next, a method for manufacturing the thin film transistor illustrated in FIGS. 1A and 1B will be described. An n-channel thin film transistor has higher carrier mobility than a p-channel thin film transistor. In addition, it is preferable that all thin film transistors formed over the same substrate have the same polarity because the number of manufacturing steps can be reduced. Therefore, in this embodiment, a method for manufacturing an n-channel thin film transistor is described.

Figure 6A:
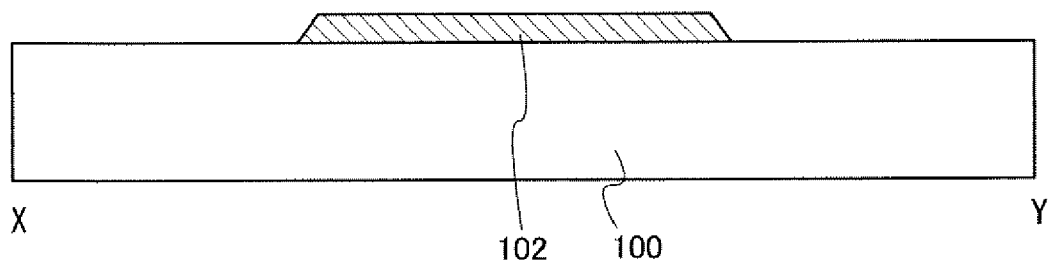
FIGS. 6A to 6C are diagrams illustrating an example of a method for manufacturing a thin film transistor according to an embodiment of the present invention.

First, the gate electrode layer 102 is formed over the substrate 100 (see FIG. 6A).

As the substrate 100, a substrate having an insulating surface is preferable. Typically, in addition to a glass substrate and a ceramic substrate, a plastic substrate or the like with heat resistance which can withstand a process temperature in this manufacturing step can be used. In the case where a substrate does not need a light-transmitting property, a substrate in which an insulating layer is provided over a surface of a substrate of a metal such as a stainless steel alloy may be used. As a glass substrate, for example, an alkali-free glass substrate formed using barium borosilicate glass, aluminoborosilicate glass, aluminosilicate glass, or the like may be used. In the case where the substrate 100 is a mother glass, the substrate may have any of the following sizes: the first generation (e.g., 320 mm×400 mm) to the seventh generation (e.g., 1870 mm×2200 mm), the eighth generation (e.g., 2200 mm×2400 mm), the ninth generation (e.g., 2400 mm×2800 mm), or the tenth generation (e.g., 2950 mm×3400 mm).

The gate electrode layer 102 can be formed in a single layer or a stacked layer using a metal material such as molybdenum, titanium, chromium, tantalum, tungsten, aluminum, copper, neodymium, or scandium, or an alloy material which includes any of these materials as a main component. In the case of using aluminum, an Al—Ta alloy in which aluminum is alloyed with tantalum added thereto is preferably used because generation of hillocks is suppressed. Further, an Al—Nd alloy in which aluminum is alloyed with neodymium added thereto is more preferably used because resistance can be reduced and generation of hillocks can be suppressed. Alternatively, a semiconductor layer typified by polycrystalline silicon doped with an impurity element such as phosphorus, or an AgPdCu alloy may be used. For example, a two-layer structure in which a molybdenum layer is stacked over an aluminum layer, a two-layer structure in which a molybdenum layer is stacked over a copper layer, or a two-layer structure in which a titanium nitride layer or a tantalum nitride layer is stacked over a copper layer is preferable. When a metal layer functioning as a barrier layer is stacked over a layer with low electric resistance, electric resistance can be reduced and a metal element can be prevented from diffusing from the metal layer into an amorphous semiconductor layer. Alternatively, a two-layer structure including a titanium nitride layer and a molybdenum layer, or a three-layer structure in which a tungsten layer having a thickness of 50 nm, an alloy layer of aluminum and silicon having a thickness of 500 nm, and a titanium nitride layer having a thickness of 30 nm are stacked may be used. In the case where a three-layer structure is employed, tungsten nitride layer may be used instead of tungsten layer of the first conductive layer; an aluminum-titanium alloy layer may be used instead of the aluminum-silicon alloy layer of the second conductive layer; or a titanium layer may be used instead of the titanium nitride layer of the third conductive layer. For example, when a molybdenum layer is stacked over an aluminum-neodymium alloy layer, a conductive layer which has high heat resistance and low electric resistance can be formed.

The gate electrode layer 102 can be formed in the following manner: a conductive layer is formed over the substrate 100 using the above-described material by a sputtering method or a vacuum evaporation method; a mask is formed over the conductive layer by a photolithography method, an inkjet method, or the like; and the conductive layer is etched using the mask. Further, the gate electrode layer 102 can be formed by discharging a conductive nanopaste of silver, gold, copper, or the like over the substrate by an inkjet method and baking the conductive nanopaste. Note that as a barrier metal which increases adhesion between the gate electrode layer 102 and the substrate 100 and prevents diffusion to a base, a nitride layer of any of the above-described metal materials may be provided between the substrate 100 and the gate electrode layer 102. Here, a conductive layer is formed over the substrate 100, and the conductive layer is etched using a resist mask formed using a photomask.

Note that side surfaces of the gate electrode layer 102 are preferably tapered in order to prevent disconnection at a step portion, because an amorphous semiconductor layer and a wiring layer are formed over the gate electrode layer 102 in later steps. In order that the side surfaces of the gate electrode layer 102 are tapered, etching may be performed while a resist mask is made to recede. For example, by making an oxygen gas contained in an etching gas, etching can be performed while a resist mask is made to recede.

Through the step of forming the gate electrode layer 102, a gate wiring (a scan line) can also be formed at the same time. Further, a capacitor line included in a pixel portion can also be formed at the same time. Note that the term "scan line" used herein means a wiring which selects a pixel, while the term "capacitor line" means a wiring which is connected to one electrode of a storage capacitor in a pixel. However, this embodiment is not limited thereto, and the gate electrode layer 102 and one or both of a gate wiring and a capacitor wiring may be formed separately.

Figure 6B:
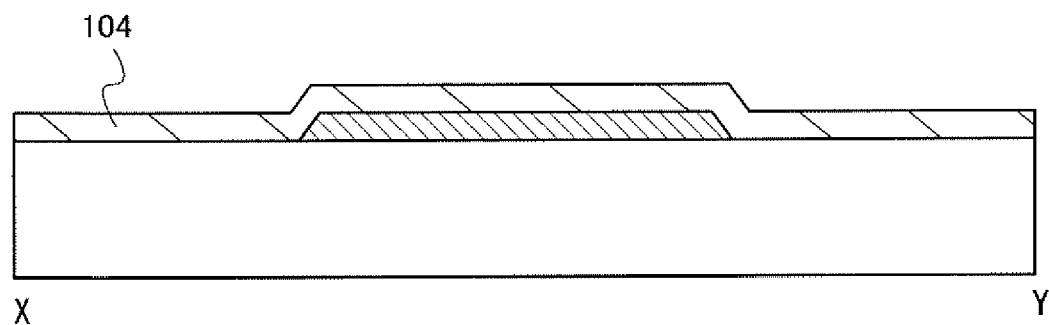

Next, the gate insulating layer 104 is formed so as to cover the gate electrode layer 102 (see FIG. 6B). The gate insulating layer 104 can be formed in a single layer or a stacked layer using a silicon oxide layer, a silicon nitride layer, a silicon oxynitride layer, or a silicon nitride oxide layer by a CVD method, a sputtering method, or the like. Further, in the case where the gate insulating layer 104 is formed by a CVD method, the gate insulating layer 104 can be formed by a plasma CVD method with a high-frequency electric power of 1 MHz to 20 MHz, typically 13.56 MHz, or a high-frequency electric power of 20 MHz to about 120 MHz, typically, 27.12 MHz or 60 MHz. Further, it is preferable that the gate insulating layer 104 be formed using a microwave plasma CVD apparatus with a high frequency (about 1 GHz). When the gate insulating layer 104 is formed by a microwave plasma CVD apparatus, the withstand voltage between a gate electrode and drain and source electrodes can be improved; therefore, a highly reliable thin film transistor can be obtained. Further, by formation of the gate insulating layer 104 using a silicon oxynitride layer, fluctuation in a threshold voltage of a transistor can be suppressed.

In this specification, silicon oxynitride contains more oxygen than nitrogen, and in the case where measurements are performed using Rutherford backscattering spectrometry (RBS) and hydrogen forward scattering (HFS), silicon oxynitride preferably includes oxygen, nitrogen, silicon, and hydrogen as composition ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen as composition ranging from 5 at. % to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Next, a method for forming the amorphous semiconductor layer 106 is described. The amorphous semiconductor layer 106 is preferably formed to a thickness of greater than or equal to 5 nm and less than or equal to 60 nm, more preferably formed to a thickness of greater than or equal to 10 nm and less than or equal to 30 nm.

Further, as described above, in the amorphous semiconductor layer 106, dangling bonds are cross-linked with an NH radical. The amorphous semiconductor layer 106 of which dangling bonds are cross-linked with an NH radical can be obtained, for example, by forming an amorphous semiconductor layer while the oxygen concentration of the amorphous semiconductor layer is kept low and the nitrogen concentration is made higher than the oxygen concentration. Here, the nitrogen concentration is preferably higher than the oxygen concentration by one or more digit. In more specific, the oxygen concentration at the interface between the gate insulating layer 104 and the amorphous semiconductor layer 106 which is measured by secondary ion mass spectroscopy is set to $5\times10^{18}$ cm$^{-3}$ or lower. As formation methods in which the oxygen concentration is kept low and the nitrogen concentration is made higher than the oxygen concentration, the following are given.

One method for keeping the oxygen concentration low and making the nitrogen concentration higher than the oxygen concentration is that a large amount of nitrogen is made present in a reaction chamber just before formation of the amorphous semiconductor layer 106. In order to make a large amount of nitrogen present in a reaction chamber just before formation of the amorphous semiconductor layer, a gas including nitrogen (typically, a gas including an NH bond such as ammonia, chloramine, or fluoramine; a nitrogen gas; or the like) may be made to blow upon a surface of the gate insulating layer 104 after formation of the gate insulating layer 104 and just before formation of the amorphous semiconductor layer 106, so that nitrogen may be adsorbed to the reaction chamber and the gate insulating layer 104. Further, plasma may be produced after a gas including nitrogen is introduced into the reaction chamber.

Another method for keeping the oxygen concentration low and making the nitrogen concentration higher than the oxygen concentration is that nitrogen is included at high concentration into the gate insulating layer 104 in contact with the amorphous semiconductor layer 106. In order to include nitrogen at high concentration into the gate insulating layer 104, the gate insulating layer 104 is formed of a silicon nitride layer. Further, a gas including nitrogen (typically, a gas including an NH bond such as ammonia, chloramine, or fluoramine; a nitrogen gas; or the like) may be used as a material of the silicon nitride layer, and the gas may be introduced into a reaction chamber. Note that this method is described in Embodiment 2.

Another method for keeping the oxygen concentration low and making the nitrogen concentration higher than the oxygen concentration is that an inner wall of a treatment chamber (chamber) used for forming the amorphous semiconductor layer 106 is covered with a layer including nitrogen at high concentration. As a layer including nitrogen at high concentration, for example, a silicon nitride layer is given. Further, as a material of the silicon nitride layer, a gas including nitrogen (typically, a nitrogen gas; a gas including an NH bond such as ammonia, chloramine, or fluoramine; or the like) may be used and the gas may be adsorbed onto a reaction chamber. Note that it is preferable that the layer including nitrogen at high concentration with which the inner wall of a treatment chamber (chamber) is covered be formed concurrently with the gate insulating layer 104 because a process can be simplified. Further, in this case, the gate insulating layer 104 and the amorphous semiconductor layer 106 are formed in the same treatment chamber (chamber); therefore, a small-sized apparatus is used. Note that this method is described in Embodiment 3.

Another method for keeping the oxygen concentration low and making the nitrogen concentration higher than the oxygen concentration is that the concentration of oxygen included in a gas used for forming the amorphous semiconductor layer 106 is made low and that the concentration of nitrogen is made high. Further, a gas including nitrogen (typically, a gas including an NH bond such as ammonia, chloramine, or fluoramine; or a nitrogen gas) is preferably used. Note that this method is described in Embodiment 4.

Another method for keeping the oxygen concentration low and making the nitrogen concentration higher than the oxygen concentration is that the concentration of oxygen included in a gas used for forming the amorphous semiconductor layer 106 is kept low to form an amorphous semiconductor layer, and then nitrogen is added to the amorphous semiconductor layer. Typically, after formation of an amorphous semiconductor layer, a gas including nitrogen (typically, a gas including an NH bond such as ammonia, chloramine, or fluoramine; a mixed gas of a nitrogen gas and a hydrogen gas; or the like) is introduced into a reaction chamber and plasma is produced, so that an NH bond is formed in the amorphous semiconductor layer and dangling bonds are cross-linked with an NH radical. Note that this method is described in Embodiment 5.

Figure 6C:
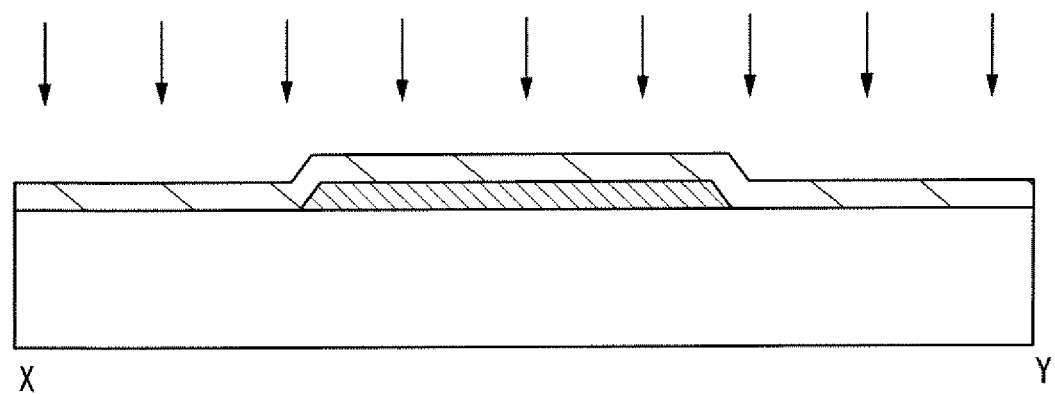

Note that in this embodiment, one of the above-described methods may be used or any of the above-described methods may be used in combination. In this embodiment, the gate insulating layer 104 has a structure in which a silicon oxynitride layer is stacked over a silicon nitride layer. A gas including nitrogen (an ammonia gas here) is supplied to a reaction chamber, whereby the gate insulating layer 104 is exposed to the gas including nitrogen, so that nitrogen is adsorbed to the reaction chamber and the gate insulating layer 104 (see FIG. 6C).

Figure 9:
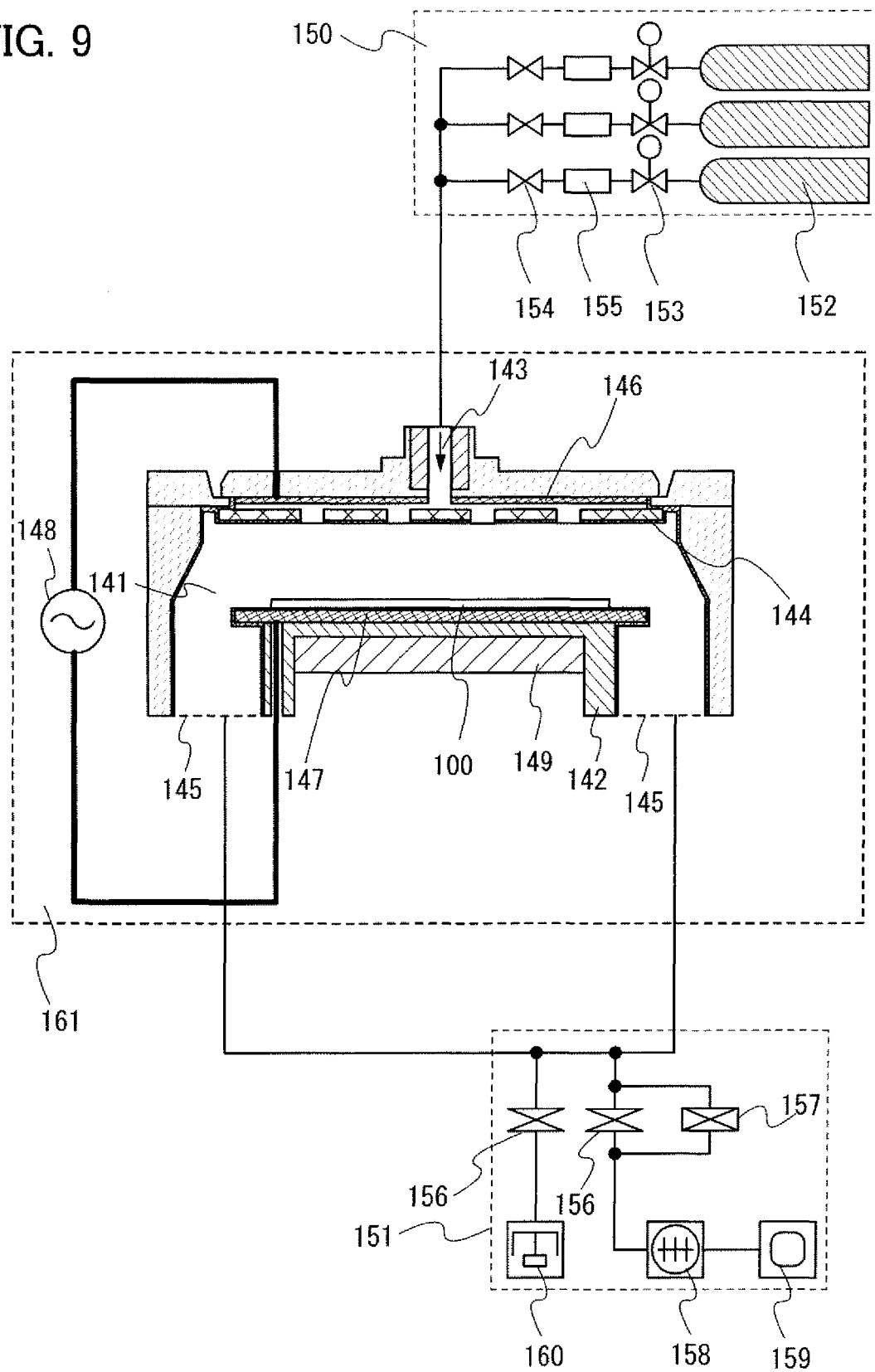
FIG. 9 is a view illustrating an apparatus which can be applied to a method for manufacturing a thin film transistor according to an embodiment of the present invention.

Here, an example of forming the gate insulating layer 104, the amorphous semiconductor layer 106, and the source and drain regions 110 is described in detail. These layers are formed by a CVD method or the like. Further, the gate insulating layer 104 has a stacked structure in which a silicon oxynitride layer is formed over a silicon nitride layer. By employing such a structure, the silicon nitride layer prevents an element included in the substrate (an element such as sodium in the case where the substrate is a glass substrate) which adversely affects electric characteristics from entering the amorphous semiconductor layer 106 or the like. FIG. 9 is a schematic view of a CVD apparatus which is used for forming these layers.

A plasma CVD apparatus 161 illustrated in FIG. 9 is connected to a gas supply means 150 and an exhaust means 151.

The plasma CVD apparatus 161 illustrated in FIG. 9 includes a treatment chamber 141, a stage 142, a gas supply portion 143, a shower plate 144, an exhaust port 145, an upper electrode 146, a lower electrode 147, an alternate-current power source 148, and a temperature control portion 149.

The treatment chamber 141 is formed using a material having rigidity and the inside thereof can be evacuated to vacuum. The treatment chamber 141 is provided with the upper electrode 146 and the lower electrode 147. Note that in FIG. 9, a structure of a capacitive coupling type (a parallel plate type) is illustrated; however, another structure such as a structure of an inductive coupling type can be used, as long as plasma can be produced in the treatment chamber 141 by applying two or more different high-frequency powers.

When treatment is performed with the plasma CVD apparatus illustrated in FIG. 9, a given gas is supplied from the gas supply portion 143. The supplied gas is introduced into the treatment chamber 141 through the shower plate 144. High-frequency power is applied with the alternate-current power source 148 connected to the upper electrode 146 and the lower electrode 147 to excite the gas in the treatment chamber 141, whereby plasma is produced. Further, the gas in the treatment chamber 141 is exhausted through the exhaust port 145 which is connected to a vacuum pump. Further, the temperature control portion 149 makes it possible to perform plasma treatment while an object to be processed is being heated.

The gas supply means 150 includes a cylinder 152 which is filled with a reaction gas, a pressure adjusting valve 153, a stop valve 154, a mass flow controller 155, and the like. The treatment chamber 141 includes a shower plate 144 which is processed in a plate-like shape and provided with a plurality of pores, between the upper electrode 146 and the substrate 100. An inner portion of the upper electrode 146 has a hollow structure. A reaction gas supplied to the upper electrode 146 is supplied to the treatment chamber 141 from these pores of the shower plate 144 through the inner portion of the upper electrode 146.

The exhaust means 151 which is connected to the treatment chamber 141 has a function of vacuum evacuation and a function of controlling the pressure inside the treatment chamber 141 to be maintained at a predetermined level when a reaction gas is made to flow. The exhaust means 151 includes in its structure a butterfly valve 156, a conductance valve 157, a turbo molecular pump 158, a dry pump 159, and the like. In the case of arranging the butterfly valve 156 and the conductance valve 157 in parallel, the butterfly valve 156 is closed and the conductance valve 157 is operated, so that the evacuation speed of the reaction gas is controlled and thus the pressure in the treatment chamber 141 can be kept in a predetermined range. Moreover, the butterfly valve 156 having higher conductance is opened, so that high-vacuum evacuation can be performed.

In the case of performing ultra-high vacuum evacuation up to a pressure lower than $10^{-5}$ Pa on the treatment chamber 141, a cryopump 160 is preferably used together. Alternatively, when exhaust is performed up to ultra-high vacuum as ultimate vacuum, the inner wall of the treatment chamber 141 may be polished into a mirror surface, and the treatment chamber 141 may be provided with a heater for baking in order to reduce gas emission from the inner wall.

Note that as illustrated in FIG. 9, precoating treatment is performed so that a layer which covers the entire treatment chamber 141 is formed (deposited). Accordingly, impurity elements attached to the inner wall of the treatment chamber (chamber) or elements contained in the inner wall of the treatment chamber (chamber) are prevented from being mixed into an object to be processed (a device). In this embodiment, a silicon layer may be formed by the precoating treatment. For example, an amorphous silicon layer or the like may be formed. However, it is preferable that oxygen be not contained in this layer.

The formation of components from the gate insulating layer 104 up to the semiconductor layer 109 including an impurity element imparting one conductivity type (also referred to as an impurity semiconductor layer) is described below with reference to FIG. 10. Note that the gate insulating layer 104 is formed by stacking a silicon oxynitride layer over a silicon nitride layer.

Figure 10:
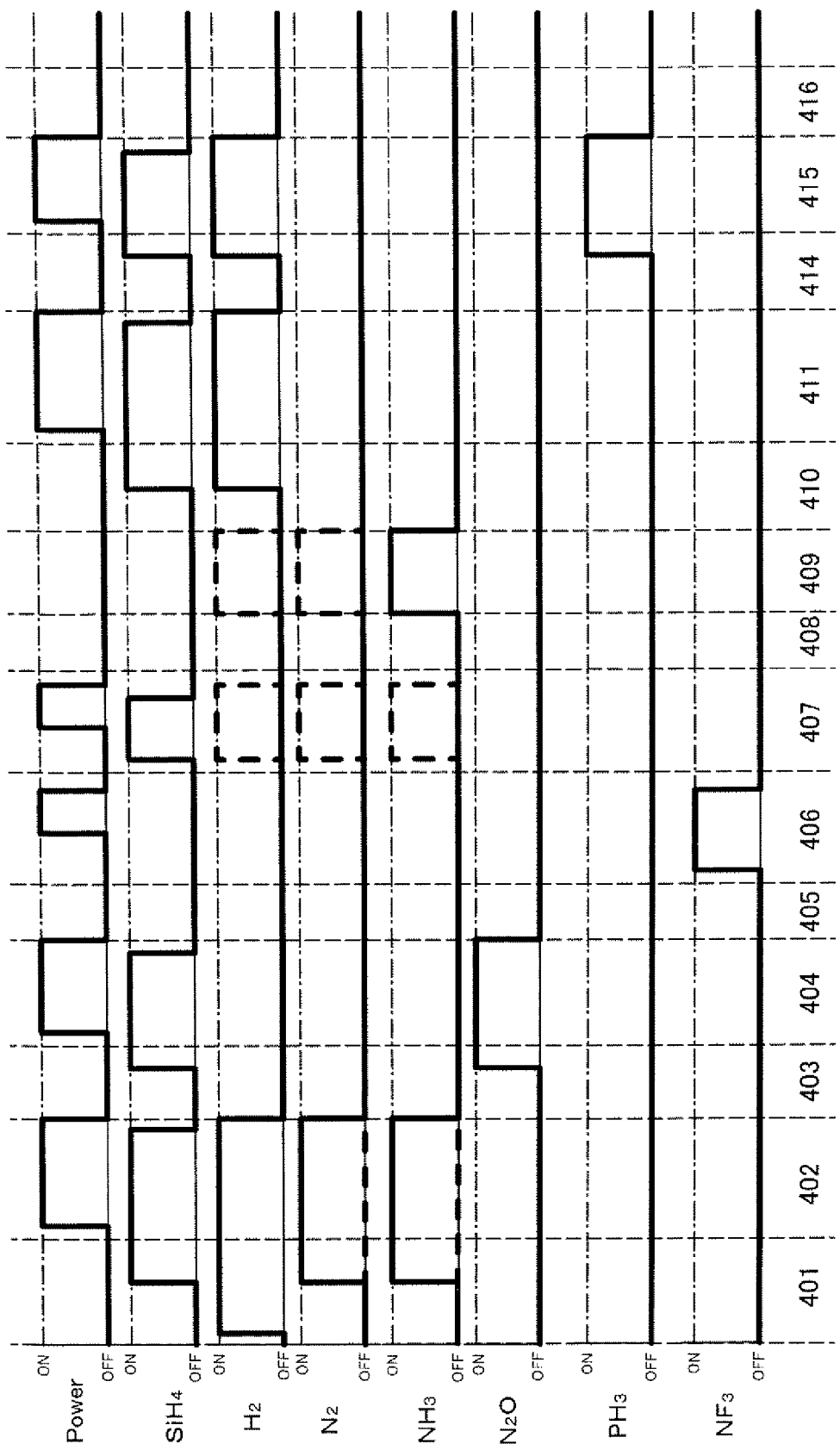
FIG. 10 is a diagram illustrating an example of a method for manufacturing a thin film transistor according to an embodiment of the present invention.

First, a substrate provided with the gate electrode layer 102 is heated in a treatment chamber 141 of a CVD apparatus, and in order to form a silicon nitride layer, source gases used for deposition of a silicon nitride layer are introduced into the treatment chamber 141 (preliminary treatment 401 in FIG. 10). Here, as an example, $SiH_4$, $H_2$, $N_2$, and $NH_3$ are introduced as source gases at flow rates of 40 sccm, 500 sccm, 550 sccm, and 140 sccm, respectively, and are stabilized. In addition, the pressure in the treatment chamber 141 is set to be 100 Pa; the substrate temperature is set to be 280° C.; and plasma discharge is performed using an RF power source frequency of 13.56 MHz and power of an RF power source of 370 W. Thus, a silicon nitride layer with a thickness of about 110 nm is formed. After that, only the introduction of $SiH_4$ is halted, and several seconds later, plasma discharge is halted (formation of SiN 402 in FIG. 10). When plasma discharge is halted in a state where there is still $SiH_4$ in the treatment chamber, granular compounds or mealy compounds which contain silicon as main components are formed, which may cause reduction in yield. Note that in the formation of SiN 402, as source gases used for deposition of the silicon nitride layer, at least one of $N_2$ and $NH_3$ may be used.

Note that the flow rate of a gas to be introduced into the reaction chamber is preferably set according to the volume of the reaction chamber, as appropriate.

Next, the source gases used for deposition of the silicon nitride layer are exhausted, and source gases used for formation of the silicon oxynitride layer are introduced into the treatment chamber 141 (replacement of gases 403 in FIG. 10). Here, as an example, $SiH_4$ and $N_2O$ are introduced as source gases at flow rates of 30 sccm and 1200 sccm, respectively, and are stabilized. In addition, the pressure in the treatment chamber is set to be 40 Pa; the substrate temperature is set to be 280° C.; and plasma discharge is performed using an RF power source frequency of 13.56 MHz and power of an RF power source of 50 W. Thus, a silicon oxynitride layer with a thickness of about 110 nm is formed. After that, as in the case of the silicon nitride layer, only the introduction of $SiH_4$ is halted, and several seconds later, plasma discharge is halted (formation of SiON 404 in FIG. 10).

Through the above-described steps, the gate insulating layer 104 in which silicon nitride layer and silicon oxynitride layer are stacked can be formed. After formation of the gate insulating layer 104, the substrate 100 is transferred from the treatment chamber 14i (the unload 405 in FIG. 10).

After the substrate 100 is transferred from the treatment chamber 141, an $NF_3$ gas, for example, is introduced into the treatment chamber 141, so that the inside of the treatment chamber 141 is cleaned (cleaning 406 in FIG. 10). Then, treatment by which an amorphous silicon layer is formed on the treatment chamber 141 is performed (pre-coating treatment 407 in FIG. 10). The treatment is performed in a manner similar to formation of the amorphous semiconductor layer 105 to be described later; however, hydrogen may be, but not necessarily be introduced into the treatment chamber 141. By this treatment, an amorphous silicon layer is formed on the inner wall of the treatment chamber 141. Alternatively, pre-coating treatment may be performed using a silicon nitride layer. The treatment in this case is similar to treatment by which the gate insulating layer 104 is formed. After that, the substrate 100 is transferred to the treatment chamber 141 (load 408 in FIG. 10).

Next, a gas including nitrogen is supplied to the reaction chamber so that nitrogen is adsorbed to the reaction chamber and the gate insulating layer 104 (here, it is referred to as flushing treatment). Here, by exposing the surface of the gate insulating layer 104 to an ammonia gas, nitrogen is adsorbed (flushing treatment 409 in FIG. 10). Further, hydrogen gas may be contained in the ammonia gas. A nitrogen gas and a hydrogen gas may be used instead of an ammonia gas. Furthermore, an ammonia gas and a nitrogen gas may be used. Here, as an example, the pressure in the treatment chamber 141 may be set to be about 20 Pa to 30 Pa, the substrate temperature may be set to be 280° C., and the treatment time may be set to be 60 seconds. Further, after the flushing treatment, the pressure is controlled by reducing or applying a pressure in the treatment chamber, so that the amount of nitrogen contained in the treatment chamber 141 may be controlled. Note that in the treatment of this step, only exposure to an ammonia gas is performed; however, plasma treatment may also be performed. After that, these gases are exhausted and source gases used for formation of the amorphous semiconductor layer 105 are introduced into the treatment chamber 141 (replacement of gases 410 in FIG. 10).

Next, amorphous semiconductor layers 105a and 105b are stacked over an entire surface of the gate insulating layer 104 to which nitrogen is adsorbed, to form the amorphous semiconductor layer 105. The amorphous semiconductor layers 105a and 105b are patterned into the amorphous semiconductor layers 106a and 106b in later steps. First, source gases used for deposition of the amorphous semiconductor layers 105a and 105b are introduced into the treatment chamber 141. Here, as an example. $SiH_4$ and $H_2$ are introduced as source gases at flow rates of 280 sccm and 300 sccm, respectively, and are stabilized. In addition, the pressure in the treatment chamber is set to be 280 Pa; the substrate temperature is set to be 280° C.; and plasma discharge is performed using an RF power source frequency of 13.56 MHz and power of an RF power source of 60 W. Thus, the amorphous semiconductor layer 105a (an amorphous silicon layer here) with a thickness of about 50 nm can be formed. In this step, the ammonia gas adsorbed to the reaction chamber and the gate insulating layer 104 by the flushing treatment is decomposed by plasma discharge, so that an NH radical is generated. Further, at the time of deposition of the amorphous semiconductor layer, different dangling bonds included in the amorphous semiconductor layer can be cross-linked with the NH radical. Note that, in the case where a nitrogen gas is introduced as a gas including nitrogen into the reaction chamber, reaction occurs between the nitrogen gas and a hydrogen gas which is a source gas for the amorphous semiconductor layer by plasma discharge, so that an NH radical is generated. With the NH radical, different dangling bonds included in the amorphous semiconductor layer are cross-linked.

After the gas including nitrogen (an ammonia gas here) in the reaction chamber is consumed in formation of the amorphous semiconductor layer 105a, the amorphous semiconductor layer 105b is formed. After the amorphous semiconductor layer 105b is formed, as in the above-described formation of the silicon nitride layer or the like, only the introduction of SiH$_4$ is halted, and several seconds later, plasma discharge is halted (formation of a-Si layer 411 in FIG. 10). Then, these gases are exhausted, and gases used for deposition of the semiconductor layer 109 including an impurity element imparting one conductivity type are introduced (replacement of gases 414 in FIG. 10).

In this embodiment, before the amorphous semiconductor layer is formed, a gas including nitrogen is supplied to the reaction chamber. The gas including nitrogen forms an NH radical by plasma discharge. Further, as described above, with an NH radical, dangling bonds included in an amorphous silicon layer are cross-linked. Thus, by forming the amorphous semiconductor layer 105a over the gate insulating layer 104 in the reaction chamber to which a gas including nitrogen is supplied, an amorphous semiconductor layer including an NH radical with which dangling bonds are cross-linked can be formed.

Next, the semiconductor layer 109 including an impurity element imparting one conductivity type is formed over an entire surface of the amorphous semiconductor layer 105. The semiconductor layer 109 including an impurity element imparting one conductivity type is patterned into the source and drain regions 110 in later steps. First, source gases used for deposition of the semiconductor layer 109 including an impurity element imparting one conductivity type are introduced into the treatment chamber 141. Here, as an example, SiH$_4$ and a mixed gas in which PH$_3$ is diluted with H$_2$ to 0.5 vol % are introduced as source gases at flow rates of 100 sccm and 170 sccm, respectively, and are stabilized. In addition, the pressure in the treatment chamber 141 is set to be 280 Pa; the substrate temperature is set to be 280° C.; and plasma discharge is performed using an RF power source frequency of 13.56 MHz and power of an RF power source of 60 W. Thus, a semiconductor layer 109 including an impurity element imparting one conductivity type with a thickness of about 50 nm can be formed. After that, as in the above-described formation of the silicon nitride layer or the like, only the introduction of SiH$_4$ is halted, and several seconds later, plasma discharge is halted (formation of impurity semiconductor layer 415 in FIG. 10). Then, these gases are exhausted (exhaust 416 in FIG. 10).

Note that as the semiconductor layer 109 including an impurity element imparting one conductivity type, a semiconductor layer in which dangling bonds are cross-linked with an NH radical may be used like the amorphous semiconductor layer 106. In this case, in a method for forming the amorphous semiconductor layer 106, a mixed gas in which PH$_3$ is diluted with H$_2$ to 0.5 vol % is used, whereby a semiconductor layer including an impurity element imparting one conductivity type in which dangling bonds are cross-linked with an NH radical can be formed.

Alternatively, a mixed gas in which PH$_3$ is diluted with a silane gas may be used as a source gas for the semiconductor layer 109 including an impurity element imparting one conductivity type.

Figure 7A:
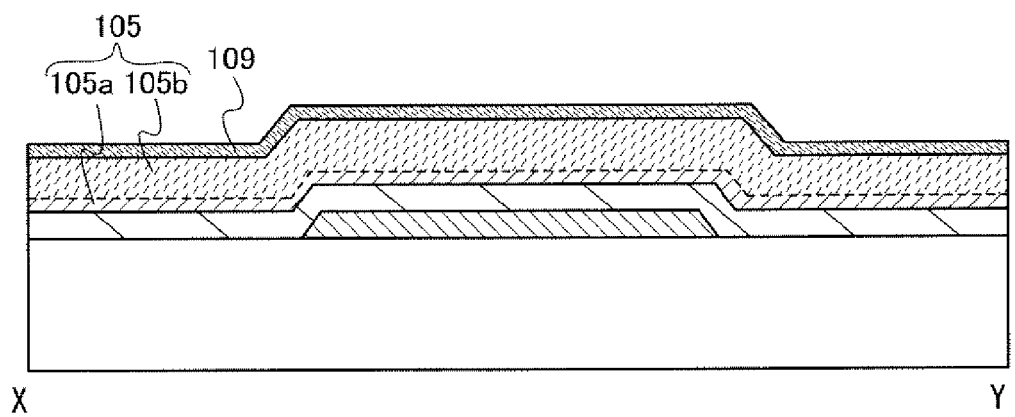
FIGS. 7A to 7C are diagrams illustrating an example of a method for manufacturing a thin film transistor according to an embodiment of the present invention.

As described above, steps of forming components up to the semiconductor layer 109 including an impurity element imparting one conductivity type can be performed (see FIG. 7A).

Next, a conductive layer 111 is formed over the semiconductor layer 109 including an impurity element imparting one conductivity type.

The conductive layer 111 can be formed in a single layer or a stacked layer of aluminum, copper, titanium, neodymium, scandium, molybdenum, chromium, tantalum, tungsten, or the like. The conductive layer 111 may be formed using an aluminum alloy to which an element to prevent a hillock is added (e.g., an aluminum-neodymium alloy or the like which can be used for the gate electrode layer 102). Alternatively, crystalline silicon to which an impurity element imparting one conductivity type is added may be used. The conductive layer 111 may have a stacked structure in which a layer on the side which is in contact with the crystalline silicon to which an impurity element imparting one conductivity type is added is formed using titanium, tantalum, molybdenum, tungsten, or nitride of any of these elements and aluminum or an aluminum alloy is formed thereover. Further alternatively, the conductive layer 111 may have a stacked structure in which aluminum or an aluminum alloy is sandwiched with titanium, tantalum, molybdenum, tungsten, or nitride of any of these elements. For example, the conductive layer 111 preferably has a three-layer stacked structure in which an aluminum layer is sandwiched between molybdenum layers.

The conductive layer 111 is formed by a CVD method, a sputtering method, or a vacuum evaporation method. Further, the conductive layer 111 may be formed using a conductive nanopaste of silver, gold, copper, or the like by a screen printing method, an inkjet method, or the like and baking the conductive nanopaste.

Figure 7B:
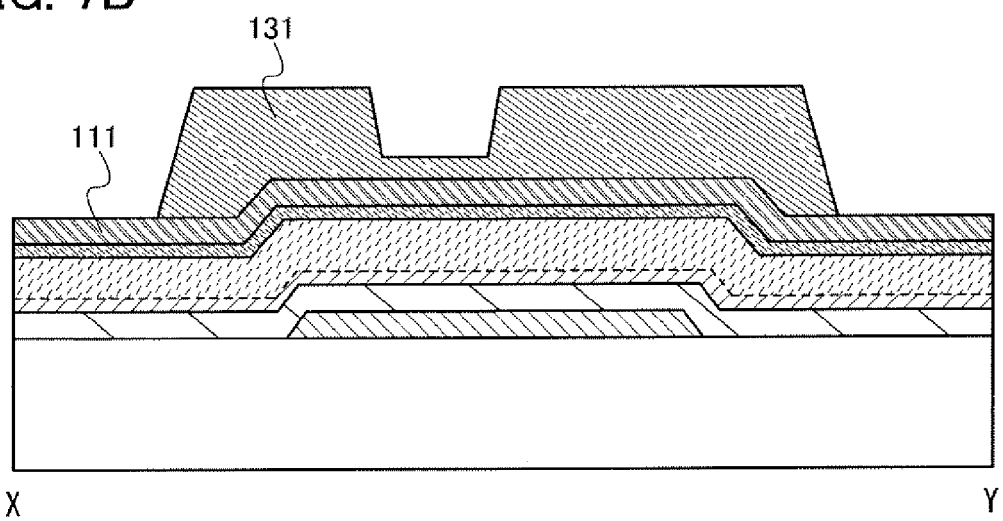

Next, a first resist mask 131 is formed over the conductive layer 111 (see FIG. 7B). The first resist mask 131 has two regions with different thicknesses and can be formed using a multi-tone mask. The multi-tone mask is preferably used because the number of photomasks used and the number of manufacturing steps are reduced. In this embodiment, a resist mask formed using a multi-tone mask can be used in a step of forming a pattern of the amorphous semiconductor layer and a step of separating a source region and a drain region.

A multi-tone mask is a mask capable of light exposure with multi-level light intensity, and typically, light exposure is performed with three levels of light intensity to provide an exposed region, a half-exposed region, and an unexposed region. When the multi-tone mask is used, a resist mask with plural thicknesses (typically, two levels of thicknesses) can be formed in a one-time light exposure and development process. Therefore, by using a multi-tone mask, the number of photomasks can be reduced.

FIGS. 11(A-1) and 11(B-1) are cross-sectional views of typical multi-tone photomasks. FIG. 11(A-1) illustrates a gray-tone mask 180 and FIG. 11(B-1) illustrates a half-tone mask 185.

Figures 1, 11A:
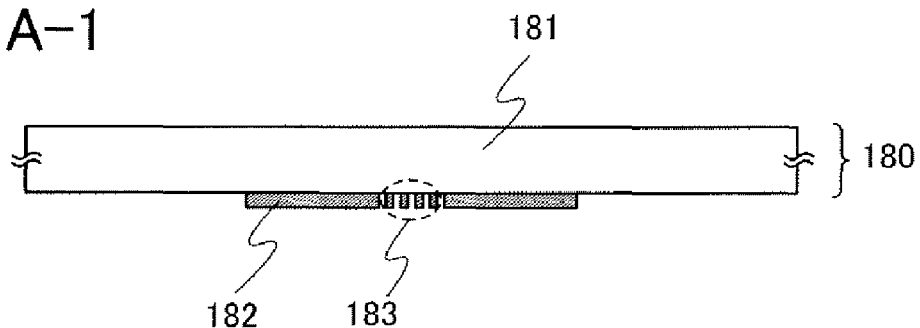
Figures 2, 11A:
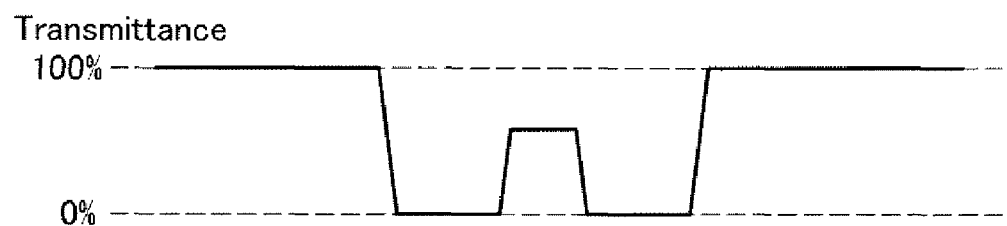

The gray-tone mask 180 illustrated in FIG. 11A-1 includes a light shielding portion 182 formed using a light shielding layer and a diffraction grating portion 183 provided with a pattern of the light shielding layer on a substrate 181 having a light-transmitting property.

The diffraction grating portion 183 has slits, dots, meshes, or the like that are provided at intervals which are less than or equal to the resolution limit of light used for the exposure, whereby the light transmittance is controlled. Note that the slits, dots, or mesh provided at the diffraction grating portion 183 may be provided periodically or nonperiodically.

For the substrate 181 having a light-transmitting property, a quartz substrate or the like can be used. The light shielding layer for forming the light shielding portion 182 and the diffraction grating portion 183 may be formed using metal and preferably provided using chromium, chromium oxide, or the like.

In the case where the gray-tone mask 180 is irradiated with light for light exposure, as illustrated in FIG. 11A-2, the transmittance in the region overlapping with the light shielding portion 182 is 0%, and the transmittance in the region where the light shielding portion 182 or the diffraction grating portion 183 is not provided is 100%. Further, the transmittance at the diffraction grating portion 183 is basically in the range of 10% to 70%, which can be adjusted by the interval of slits, dots, or mesh of the diffraction grating, or the like.

Figures 1, 11B:
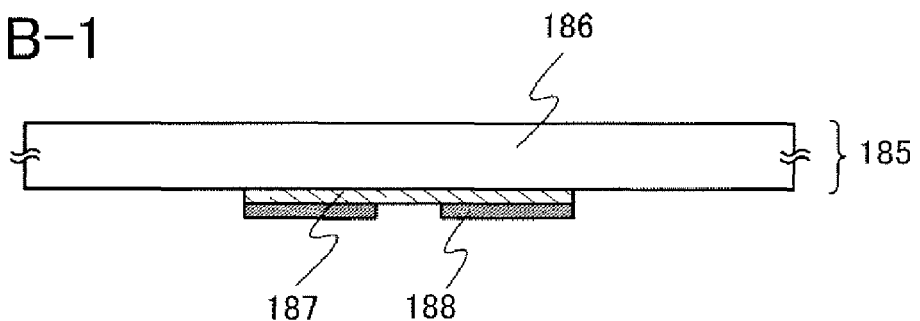
Figures 2, 11B:
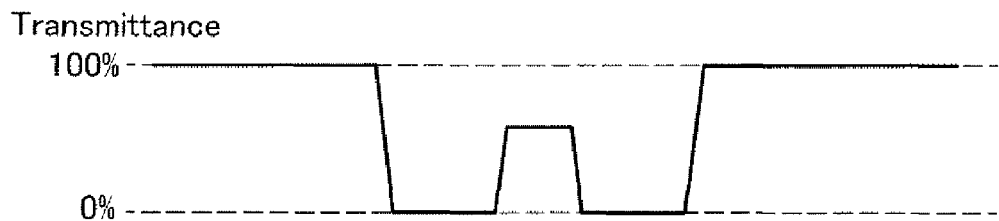

The half-tone mask 185 illustrated in FIG. 11B-1 includes a semi-light-transmitting portion 187 which is formed using a semi-light-transmitting layer and a light shielding portion 188 formed using a light shielding layer on a substrate 186 having a light-transmitting property.

The semi-light-transmitting portion 187 can be formed using a film of MoSiN, MoSi, MoSiO, MoSiON, CrSi, or the like. The light shielding portion 188 may be formed using metal similar to that of the light shielding layer of the gray-tone mask, and chromium, chromium oxide, or the like is preferably used.

In the case where the half-tone mask 185 is irradiated with light for light exposure, as illustrated in FIG. 11B-2, the transmittance in the region overlapping with the light shielding portion 188 is 0%, and the transmittance in the region where the light shielding portion 188 or the semi-light-transmitting portion 187 is not provided is 100%. Further, the transmittance in the semi-light-transmitting portion 187 is basically in the range of 10% to 70%, which can be adjusted by the kind, the thickness, or the like of the material to be formed.

By light exposure using the multi-tone mask and development, a resist mask which includes regions having different thicknesses can be formed.

Figure 7C:
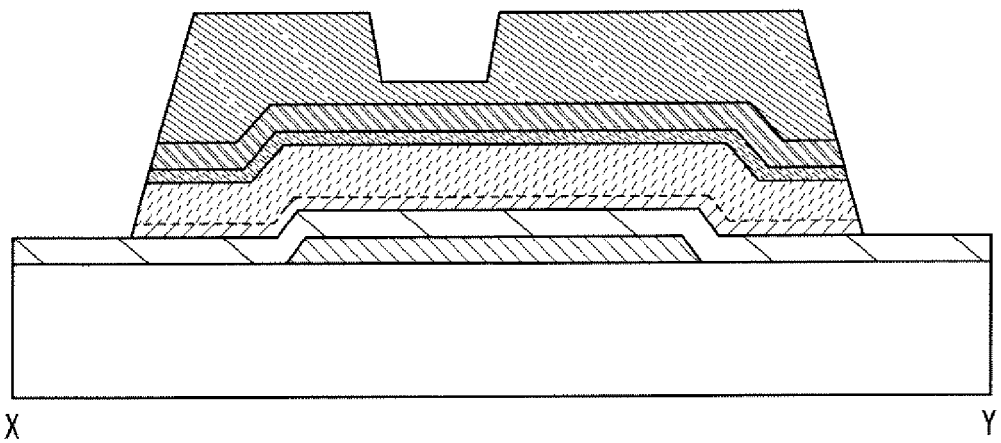

Next, with the use of the first resist mask 131, the amorphous semiconductor layer 105, the semiconductor layer 109 including an impurity element imparting one conductivity type, and the conductive layer 111 are etched. Through this step, the amorphous semiconductor layer 105, the semiconductor layer 109 including an impurity element imparting one conductivity type, and the conductive layer 111 are separated for each element (see FIG. 7C).

Here, the first resist mask 131 is made to recede to form a second resist mask 132. Ashing using oxygen plasma may be performed in order that the resist mask is made to recede.

Figure 8A:
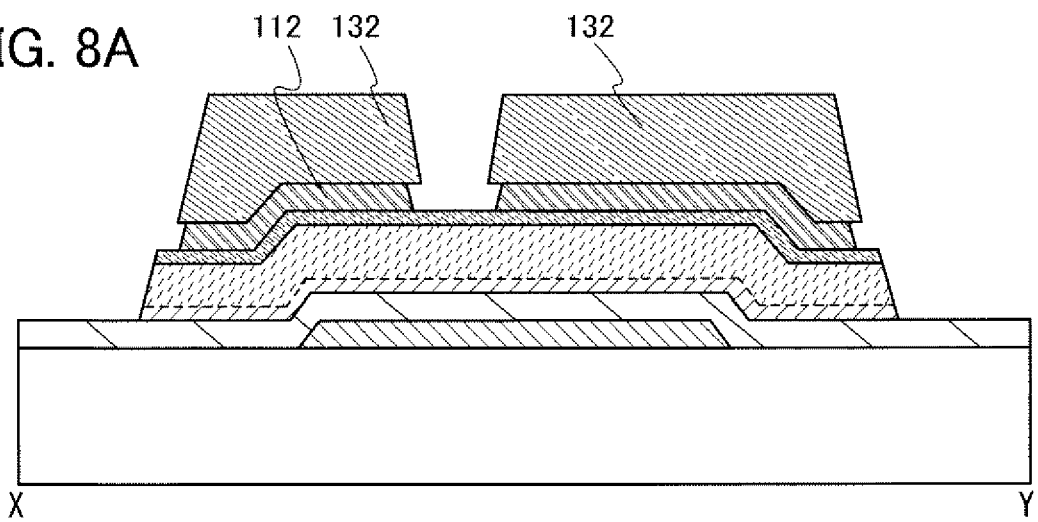
FIGS. 8A to 8C are diagrams illustrating an example of a method for manufacturing a thin film transistor according to an embodiment of the present invention.

Next, with the use of the second resist mask 132, the conductive layer 111 is etched to form the wiring layers 112 (see FIG. 8A). The wiring layers 112 form the source and drain electrodes. It is preferable that this etching of the conductive layer 111 be performed by wet etching. By wet etching, the conductive layer is isotropically etched. As a result, a side surface of the conductive layer recedes to an inner side than that of the second resist mask 132, and thus the wiring layers 112 are formed. Accordingly, the side surfaces of the wiring layers 112 are not aligned with the side surfaces of the etched semiconductor layer 109 including an impurity element imparting one conductivity type, and the side surfaces of the source and drain regions 110 are formed on an outer side than the side surfaces of the wiring layers 112. The wiring layers 112 serve not only as source and drain electrodes but also as signal lines. However, this embodiment is not limited thereto, and the wiring layer 212 and the signal lines may be provided separately.

Figure 8B:
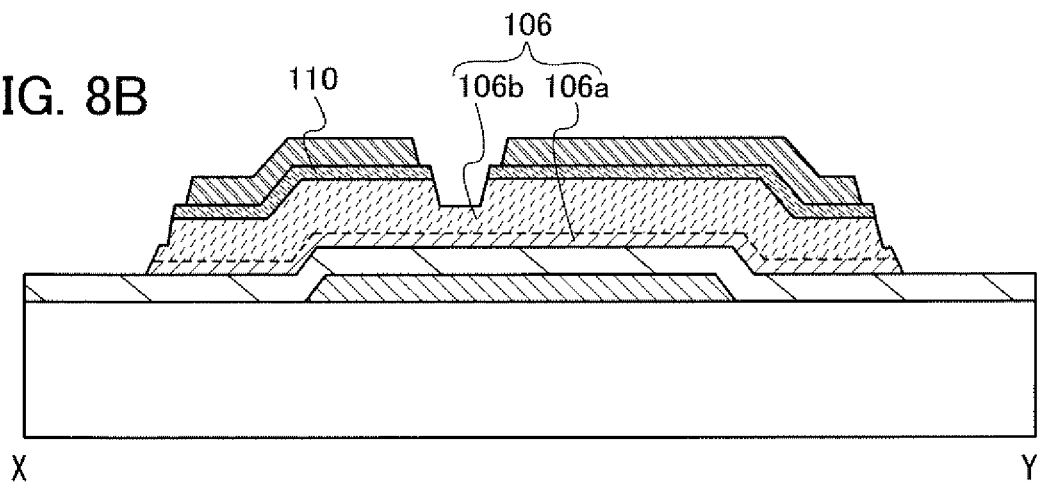

Next, in a state where the second resist mask 132 is formed, part of the amorphous semiconductor layer 105b and the semiconductor layer 109 including an impurity element imparting one conductivity type are etched to form the amorphous semiconductor layer 106b and the source and drain regions 110 (see FIG. 8B).

Next, in a state where the second resist mask 132 is formed, dry etching is preferably performed. Here, a condition of dry etching is set so that the exposed surface of the amorphous semiconductor layer 106b is not damaged and the etching rate with respect to the amorphous semiconductor layer 106b can be low. In other words, a condition which gives almost no damage to the exposed surface of the amorphous semiconductor layer 106b and hardly reduces the thickness of the exposed portion of the amorphous semiconductor layer 106b is applied. As an etching gas, a chlorine based gas, fluorine based gas (typically, $CF_4$), or a nitrogen gas is used, and typically, a $Cl_2$ gas is used. There is no particular limitation on an etching method, and an ICP method, a CCP method, an ECR method, a reactive ion etching (RIE) method, or the like can be used.

An example of a condition of dry etching which can be used here is as follows: the flow rate of $Cl_2$ gas is 100 sccm; the pressure in a chamber is 0.67 Pa; the temperature of the lower electrode is set to be −10° C.; an RF (13.56 MHz) power of 2000 W is applied to the coil of upper electrode to produce plasma with no power (i.e. 0 W, non-biased) applied to the substrate 100 side; thus, etching is performed for 30 seconds. The temperature of the inner wall of the chamber is preferably set to be about 80° C.

Next, in a state where the second resist mask 132 is formed, plasma treatment is preferably performed, so that the second resist mask 132 is removed. Here, plasma treatment may be performed using water plasma, as a typical example of plasma treatment.

Water plasma treatment can be performed in such a manner that a gas containing water as its main component typified by water vapor ($H_2O$ vapor) is introduced into a reaction space to produce plasma. The second resist mask 132 can be removed with water plasma. Further, when water plasma treatment is performed or water plasma treatment is performed after exposure to air, an oxide layer is formed over the exposed surface of the amorphous semiconductor layer 106b in some cases.

Note that without the use of water plasma treatment, dry etching may be performed under such a condition that the exposed surface of the amorphous semiconductor layer 106b is not damaged and an etching rate with respect to the amorphous semiconductor layer 106b is low.

As described above, after the pair of source and drain regions 110 are formed, dry etching is further performed under such a condition that the amorphous semiconductor layer 106b is not damaged, whereby an impurity element such as a residue existing on the exposed surface of the amorphous semiconductor layer 106b can be removed. Further, dry etching is performed, and then water plasma treatment is performed, whereby the second resist mask 132 can also be removed. By water plasma treatment, insulation between the source region and the drain region can be secured, and thus, in a thin film transistor which is completed, the off-state current can be reduced, the on-state current can be increased, and variations in the electric characteristics can be reduced.

Note that order of steps of plasma treatment and the like is not limited thereto. After the second resist mask 132 is removed, etching with non-bias applied or plasma treatment may be performed.

Figure 8C:
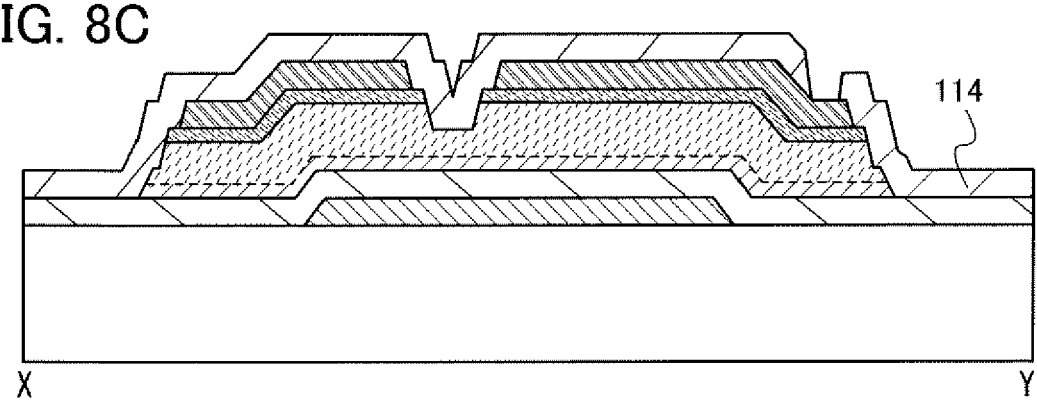

Through the above-described steps, a thin film transistor according to this embodiment can be manufactured (see FIG. 8B). The thin film transistor according to this embodiment can be applied to a switching transistor provided in a pixel of a display device typified by a liquid crystal display device. For that purpose, the insulating layer 114 having an opening portion is formed so as to cover this thin film transistor (see FIG. 8C). The pixel electrode layer 116 is formed over the insulating layer 114 so as to be connected, through the opening portion, to one of the wiring layers 112. The opening portion can be formed by a photolithography method. The wiring layers 112 form the source and drain electrodes of the thin film transistor. Thus, a switching transistor provided in the pixel of the display device which is shown in FIGS. 1A and 1B can be manufactured.

Note that the insulating layer 114 can be formed in a manner similar to the gate insulating layer 104. The insulating layer 114 is preferably formed using a dense silicon nitride layer so that entry of a contaminant impurity element such as an organic substance, a metal, or moisture which floats in the atmosphere can be prevented.

Note that the pixel electrode layer 116 can be formed using a conductive composition including a conductive high molecule (also referred to as a conductive polymer) having a light-transmitting property. The pixel electrode layer 116 preferably has a sheet resistance of less than or equal to 10000 Ω/square and a light transmittance of greater than or equal to 70% at a wavelength of 550 nm. Further, the resistivity of the conductive high molecule included in the conductive composition is preferably less than or equal to 0.1 Ω·cm.

As a conductive high molecule, a so-called π electron conjugated conductive high molecule can be used. For example, polyaniline and/or a derivative thereof, polypyrrole and/or a derivative thereof, polythiophene and/or a derivative thereof, and a copolymer of two or more kinds of those materials can be given.

The pixel electrode layer 116 can be formed using indium oxide including tungsten oxide, indium zinc oxide including tungsten oxide, indium oxide including titanium oxide, indium tin oxide including titanium oxide, indium tin oxide (hereinafter also referred to as ITO), indium zinc oxide, indium tin oxide to which silicon oxide is added, or the like.

The pixel electrode layer 116 may be etched by a photolithography method to be patterned as in the case of the wiring layer 112 or the like.

Note that although not illustrated, an insulating layer formed using an organic resin by a spin coating method or the like may be present between the insulating layer 114 and the pixel electrode layer 116.

As described in this embodiment, a thin film transistor in which the on-state current is high and the off-state current is small can be obtained.

(Embodiment 2)

In this embodiment, a method for manufacturing a thin film transistor shown in FIGS. 1A and 1B which is different from Embodiment 1 is described. In this embodiment, an amorphous semiconductor layer including an NH radical with which dangling bonds are cross-linked is formed in a manner similar to Embodiment 1. However, a method for including nitrogen in an amorphous semiconductor layer is different.

In this embodiment, a gate insulating layer in contact with an amorphous semiconductor layer is formed of a silicon nitride layer, whereby the nitrogen concentration of the amorphous semiconductor layer is controlled. Thus, an amorphous semiconductor layer in which dangling bonds are cross-linked with an NH radical is formed. The steps of forming components from the gate insulating layer 104 up to the semiconductor layer 109 including an impurity element imparting one conductivity type are described with reference to FIG. 12.

Figure 12:
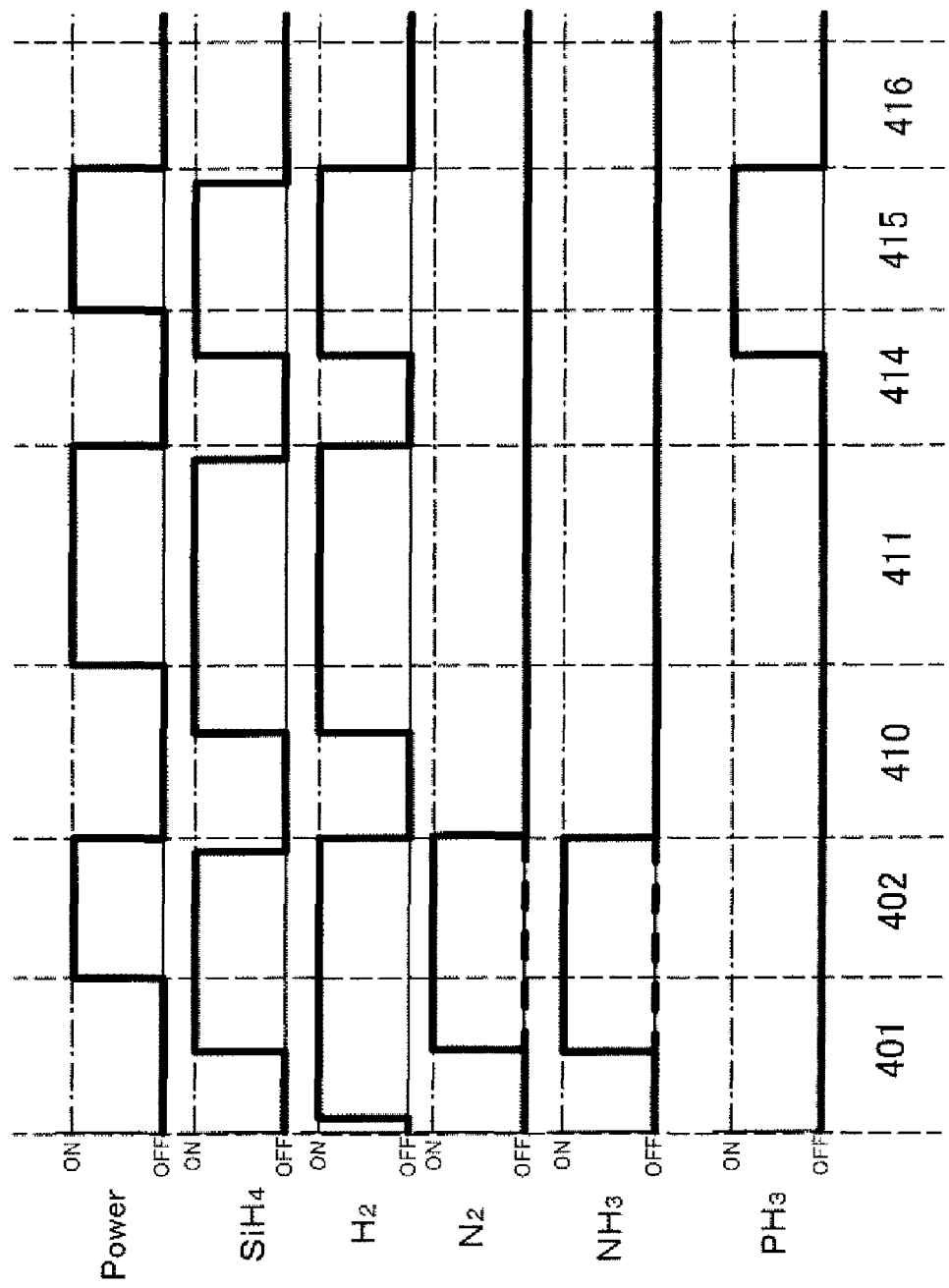
FIG. 12 is a diagram illustrating an example of a method for manufacturing a thin film transistor according to an embodiment of the present invention.

First, the substrate provided with the gate electrode layer 102 is heated in a treatment chamber (chamber) of a CVD apparatus, and in order to form a silicon nitride layer, source gases used for formation of a silicon nitride layer are introduced into the treatment chamber (the preliminary treatment 401 in FIG. 12). Here, as an example, $SiH_4$, $H_2$, $N_2$, and $NH_3$ are introduced as source gases at flow rates of 40 sccm, 500 sccm, 550 sccm, and 140 sccm, respectively, and are stabilized. In addition, the pressure in the treatment chamber is set to be 100 Pa; the substrate temperature is set to be 280° C.; and plasma discharge is performed using an RF power source frequency of 13.56 MHz and power of an RF power source of 370 W. Thus, a silicon nitride layer with a thickness of about 300 nm is formed. After that, only the supply of $SiH_4$ is halted, and several seconds later, plasma discharge is halted (the formation of SiN 402 in FIG. 12). Note that in the formation of SiN 402, as source gases used for deposition of the silicon nitride layer, at least one of $N_2$ and $NH_3$ may be used.

Next, the source gases used for deposition of the silicon nitride layer are exhausted, and source gases used for formation of the amorphous semiconductor layer 105 are introduced into the treatment chamber (the replacement of gases 410 in FIG. 12).

Next, the amorphous semiconductor layers 105a and 105b are stacked over an entire surface of the gate insulating layer 104 to faint the amorphous semiconductor layer 105. The amorphous semiconductor layers 105a and 105b are patterned into the amorphous semiconductor layers 106a and 106b in later steps. First, source gases used for formation of the amorphous semiconductor layers 105a and 105b are introduced into the treatment chamber. Here, as an example, $SiH_4$ and $H_2$ are introduced as source gases at flow rates of 280 sccm and 300 sccm, respectively, and are stabilized. In addition, the pressure in the treatment chamber is set to be 170 Pa; the substrate temperature is set to be 280° C.; and plasma discharge is performed using an RF power source frequency of 13.56 MHz and power of an RF power source of 60 W. Thus, the amorphous semiconductor layer 105a (an amorphous silicon layer here) with a thickness of about 50 nm can be formed. In this step, the ammonia gas introduced into a reaction chamber at the time of formation of the SiN layer is dissociated by plasma discharge, so that an NH radical is generated. Note that in the case where a nitrogen gas is introduced as a source gas at the time of formation of the SiN layer, reaction occurs between the nitrogen gas and a hydrogen gas which is a source gas for the amorphous semiconductor layer by plasma discharge, so that an NH radical is generated. Furthermore, at the time of deposition of the amorphous semiconductor layer, different dangling bonds included in the amorphous semiconductor layer can be cross-linked with the NH radical.

After the gas including nitrogen (an ammonia gas and a nitrogen gas here) in the reaction chamber is consumed in formation of the amorphous semiconductor layer 105a, the amorphous semiconductor layer 105b is formed. After the amorphous semiconductor layer 105b is formed, as in the above-described formation of the silicon nitride layer or the like, only the supply of $SiH_4$ is halted, and several seconds later, plasma discharge is halted (the formation of a-Si layer 411 FIG. 12). Then, these gases are exhausted, and gases used for deposition of the semiconductor layer 109 including an impurity element imparting one conductivity type are introduced (the replacement of gases 414 in FIG. 12).

In this embodiment, to the reaction chamber in which the gate insulating layer is formed, a gas including nitrogen is supplied. As described above, dangling bonds included in an amorphous semiconductor layer are cross-linked with an NH radical. Thus, by forming the amorphous semiconductor layer 105a over the gate insulating layer 104 in the reaction chamber to which a gas including nitrogen is supplied, an amorphous semiconductor layer including an NH radical with which dangling bonds are cross-linked can be formed.

Next, the semiconductor layer 109 including an impurity element imparting one conductivity type is formed over an entire surface of the amorphous semiconductor layer 105. The semiconductor layer 109 including an impurity element imparting one conductivity type is patterned into the source and drain regions 110 in later steps. First, source gases used for formation of the semiconductor layer 109 including an impurity element imparting one conductivity type are introduced into the treatment chamber. Here, as an example, $SiH_4$ and a mixed gas in which $PH_3$ is diluted with $H_2$ to 0.5 vol % are introduced as source gases at flow rates of 100 sccm and 170 sccm, respectively, and are stabilized. In addition, the pressure in the treatment chamber is set to be 280 Pa; the substrate temperature is set to be 280° C.; and plasma discharge is performed using an RF power source frequency of 13.56 MHz and power of an RF power source of 60 W. Thus, a semiconductor layer including an impurity element imparting one conductivity type with a thickness of about 50 nm can be formed. After that, as in the above-described formation of the silicon nitride layer or the like, only the introduction of $SiH_4$ is halted, and several seconds later, plasma discharge is halted (the formation of impurity semiconductor layer 415 in FIG. 12). Then, these gases are exhausted (the exhaust 416 in FIG. 12).

As described above, by forming at least a gate insulating layer in contact with an amorphous semiconductor layer, using a silicon nitride layer, the oxygen concentration can be kept low and the nitrogen concentration can be made higher than the oxygen concentration, and thus, an amorphous semiconductor layer including an NH radical with which dangling bonds are cross-linked can be formed.

(Embodiment 3)

In this embodiment, a method for manufacturing a thin film transistor shown in FIGS. 1A and 1B which is different from Embodiment 1 and Embodiment 2 is described. In this embodiment, an amorphous semiconductor layer in which dangling bonds are cross-linked with an NH radical is formed in a manner similar to Embodiment 1 and Embodiment 2. However, a method for including nitrogen in an amorphous semiconductor layer is different.

In this embodiment, a treatment chamber is cleaned before deposition of an amorphous semiconductor layer, and after that, the inner wall of the chamber is covered with a silicon nitride layer, whereby nitrogen is included in the amorphous semiconductor layer. Thus, the oxygen concentration is kept low and the nitrogen concentration is made higher than the oxygen concentration. The steps of forming components from the gate insulating layer 104 up to the semiconductor layer 109 including an impurity element imparting one conductivity type are described with reference to FIG. 13.

Figure 13:
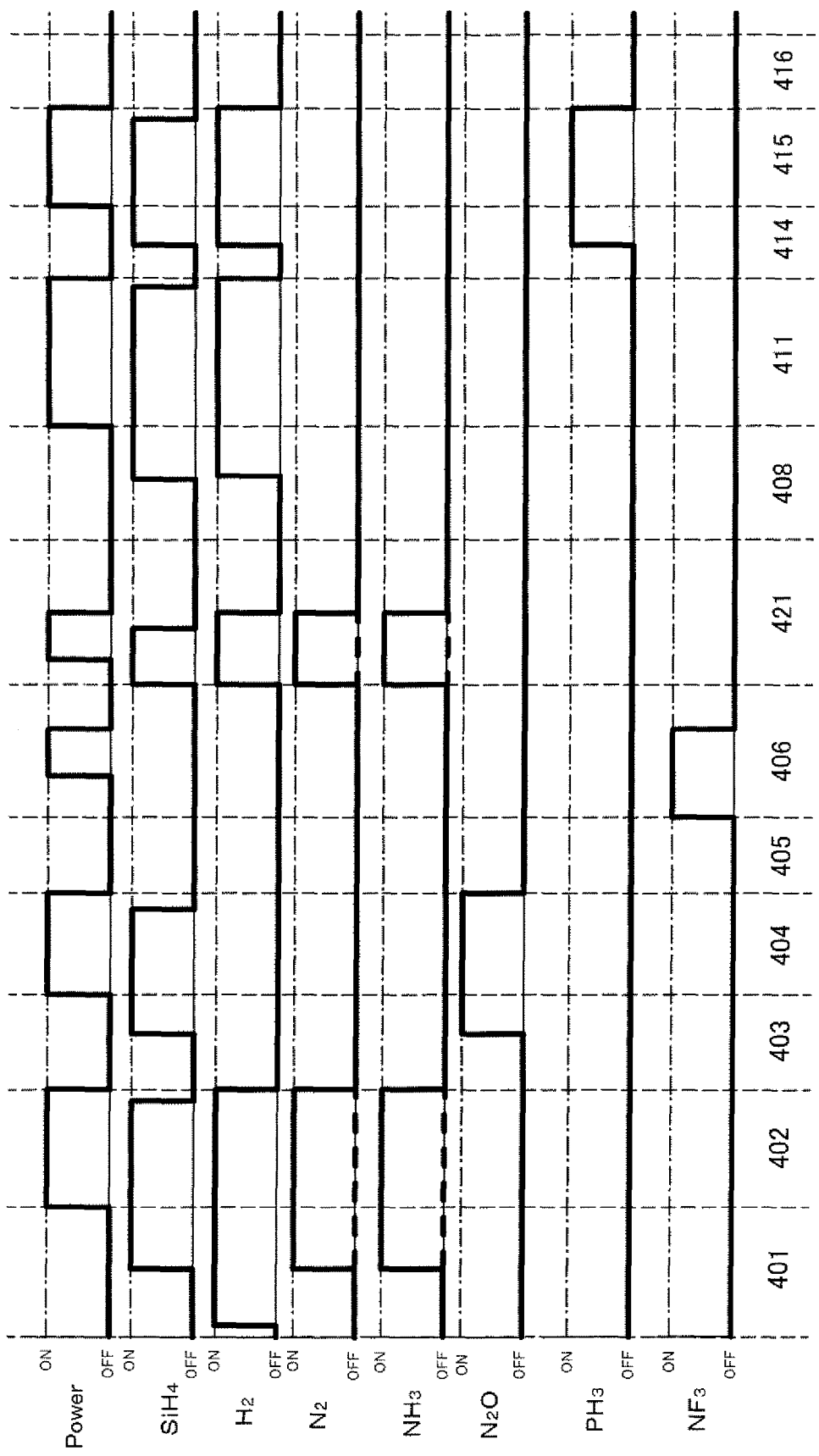
FIG. 13 is a diagram illustrating an example of a method for manufacturing a thin film transistor according to an embodiment of the present invention.

First, the substrate provided with the gate electrode layer 102 is heated in a treatment chamber (in a chamber) of a CVD apparatus, and in order to form a silicon nitride layer, source gases used for formation of a silicon nitride layer are introduced into the treatment chamber (the preliminary treatment 401 in FIG. 13). Here, as an example, $SiH_4$, $H_2$, $N_2$, and $NH_3$ are introduced as source gases at flow rates of 40 sccm, 500 sccm, 550 sccm, and 140 sccm, respectively, and are stabilized. In addition, the pressure in the treatment chamber is set to be 100 Pa; the substrate temperature is set to be 280° C.; and plasma discharge is performed using an RF power source frequency of 13.56 MHz and power of an RF power source of 370 W. Thus, a silicon nitride layer with a thickness of about 110 nm is formed. After that, only the introduction of $SiH_4$ is halted, and several seconds later, plasma discharge is halted (the formation of SiN 402 in FIG. 13). Note that in the formation of SiN 402, as source gases used for deposition of the silicon nitride layer, at least one of $N_2$ and $NH_3$ may be used.

Next, the source gases used for deposition of the silicon nitride layer are exhausted, and source gases used for formation of a silicon oxynitride layer are introduced into the treatment chamber (the replacement of gases 403 in FIG. 13). Here, as an example, $SiH_4$ and $N_2O$ are introduced as source gases at flow rates of 30 sccm and 1200 sccm, respectively, and are stabilized. In addition, the pressure in the treatment chamber is set to be 40 Pa; the substrate temperature is set to be 280° C.; and plasma discharge is performed using an RF power source frequency of 13.56 MHz and power of an RF power source of 50 W. Thus, a silicon oxynitride layer with a thickness of about 110 nm is formed. After that, as in the silicon nitride layer, only the introduction of $SiH_4$ is halted, and several seconds later, plasma discharge is halted (the formation of SiON 404 in FIG. 13).

Through the above-described steps, the gate insulating layer 104 can be formed. After formation of the gate insulating layer 104, the substrate 100 is transferred from the treatment chamber 141 (the unload 405 in FIG. 13).

After the substrate 100 is transferred from the treatment chamber 141, an $NF_3$ gas is introduced into the treatment chamber 141 to clean the inside of the treatment chamber (the cleaning 406 in FIG. 13). Then, treatment by which a silicon nitride layer is formed is performed (pre-coating treatment 421 in FIG. 13) as in the case of the gate insulating layer 104. By this treatment, a silicon nitride layer is formed on the inner wall of the treatment chamber 141. Further, as a gas including nitrogen introduced into the reaction chamber, typically a gas including an NH bond such as ammonia, chloramine, or fluoramine; a nitrogen gas; or the like can be used.

After that, the substrate 100 is transferred to the treatment chamber 141, and source gases used for deposition of the amorphous semiconductor layers 105a and 105b are introduced into the treatment chamber (the load 408 in FIG. 13).

Next, the amorphous semiconductor layers 105a and 105b are stacked over an entire surface of the gate insulating layer 104 to form the amorphous semiconductor layer 105. The amorphous semiconductor layers 105a and 105b are patterned into the amorphous semiconductor layers 106a and 106b in later steps. First, source gases used for formation of the amorphous semiconductor layers 105a and 105b are introduced into the treatment chamber. Here, as an example, $SiH_4$ and $H_2$ are introduced as source gases at flow rates of 280 sccm and 300 sccm, respectively, and are stabilized. In addition, the pressure in the treatment chamber is set to be 170 Pa; the substrate temperature is set to be 280° C.; and plasma discharge is performed using an KF power source frequency of 13.56 MHz and power of an RF power source of 60 W. Thus, the amorphous semiconductor layer 105a (an amorphous silicon layer here) with a thickness of about 50 nm can be formed. In this step, the ammonia gas introduced into a reaction chamber by the pre-coating treatment is dissociated by plasma discharge, so that an NH radical is generated. Further, reaction occurs between the nitrogen gas introduced into a reaction chamber by the pre-coating treatment and a hydrogen gas which is a source gas for the amorphous semiconductor layer by plasma discharge, so that an NH radical is generated. Further, at the time of deposition of the amorphous semiconductor layer, different dangling bonds in the amorphous semiconductor layer can be cross-linked with the NH radical.

After gases including nitrogen (an ammonia gas and a nitrogen gas here) in the reaction chamber are consumed in formation of the amorphous semiconductor layer 105a, the amorphous semiconductor layer 105b is formed. After the amorphous semiconductor layer 105b is formed, as in the above-described formation of the silicon nitride layer or the like, only the supply of $SiH_4$ is halted, and several seconds later, plasma discharge is halted (the formation of a-Si layer 411 in FIG. 13). Then, these gases are exhausted, and gases used for formation of the semiconductor layer 109 including an impurity element imparting one conductivity type are introduced (the replacement of gases 414 in FIG. 13).

In this embodiment, the silicon nitride layer is formed as a protective layer in the treatment chamber. Therefore, by exposing the protective layer to plasma, nitrogen is included in the amorphous semiconductor layer 105a. As described above, with an NH radical, dangling bonds included in an amorphous silicon layer are cross-linked. Thus, by forming the amorphous semiconductor layer 105a over the gate insulating layer 104 in the reaction chamber to which the pre-coating treatment is performed using a gas including nitrogen, an amorphous semiconductor layer including an NH radical with which dangling bonds are cross-linked can be formed.

Next, the semiconductor layer 109 including an impurity element imparting one conductivity type is formed over an entire surface of the amorphous semiconductor layer 105. The semiconductor layer 109 including an impurity element imparting one conductivity type is patterned into the source and drain regions 110 in later steps. First, source gases used for deposition of the semiconductor layer 109 including an impurity element imparting one conductivity type are introduced into the treatment chamber.

Here, as an example, $SiH_4$ and a mixed gas in which $PH_3$ is diluted with $H_2$ to 0.5 vol % are introduced as source gases at flow rates of 100 sccm and 170 sccm, respectively, and are stabilized. In addition, the pressure in the treatment chamber is set to be 280 Pa; the substrate temperature is set to be 280° C.; and plasma discharge is performed using an RF power source frequency of 13.56 MHz and power of an RF power source of 60 W. Thus, a semiconductor layer including an impurity element imparting one conductivity type with a thickness of about 50 nm can be formed. After that, as in the silicon nitride layer or the like, only the introduction of $SiH_4$ is halted, and several seconds later, plasma discharge is halted (the formation of impurity semiconductor layer 415 in FIG. 13). Then, these gases are exhausted (the exhaust 416 in FIG. 13).

As described above, at least by covering the inner wall of the treatment chamber with a silicon nitride layer just before formation of the amorphous semiconductor layer, the oxygen concentration can be kept low and the nitrogen concentration can be made higher than the oxygen concentration, and thus, an amorphous semiconductor layer including an NH radical with which dangling bonds are cross-linked can be formed.

Further, by covering the inner wall of the treatment chamber with a silicon nitride layer, an element forming the inner wall of the treatment chamber, or the like can be prevented from entering the amorphous semiconductor layer.

Note that in the above description, the gate insulating layer 104 is formed by stacking a silicon oxynitride layer over a silicon nitride layer; therefore, cleaning treatment and pre-coating treatment are performed after formation of the gate insulating layer 104. However, this embodiment may be implemented in combination with Embodiment 2. That is, the gate insulating layer 104 may be formed of a silicon nitride layer, and the pre-coating treatment may be performed concurrently with the formation of the gate insulating layer 104, whereby a process can be simplified and throughput can be improved.

(Embodiment 4)

In this embodiment, a method for manufacturing a thin film transistor shown in FIGS. 1A and 1B which is different from Embodiments 1 to 3 is described. In this embodiment, an amorphous semiconductor layer including an NH radical with which dangling bonds are cross-linked is formed in a manner similar to Embodiment 1. However, a method for including nitrogen in an amorphous semiconductor layer is different.

In this embodiment, a gas including nitrogen is mixed into a gas at an early stage of deposition of the amorphous semiconductor layer or in deposition of the amorphous semiconductor layer, whereby the oxygen concentration is kept low and the nitrogen concentration is made higher than the nitrogen concentration. The steps of forming components from the gate insulating layer 104 up to the semiconductor layer 109 including an impurity element imparting one conductivity type are described with reference to FIG. 14.

Figure 14:
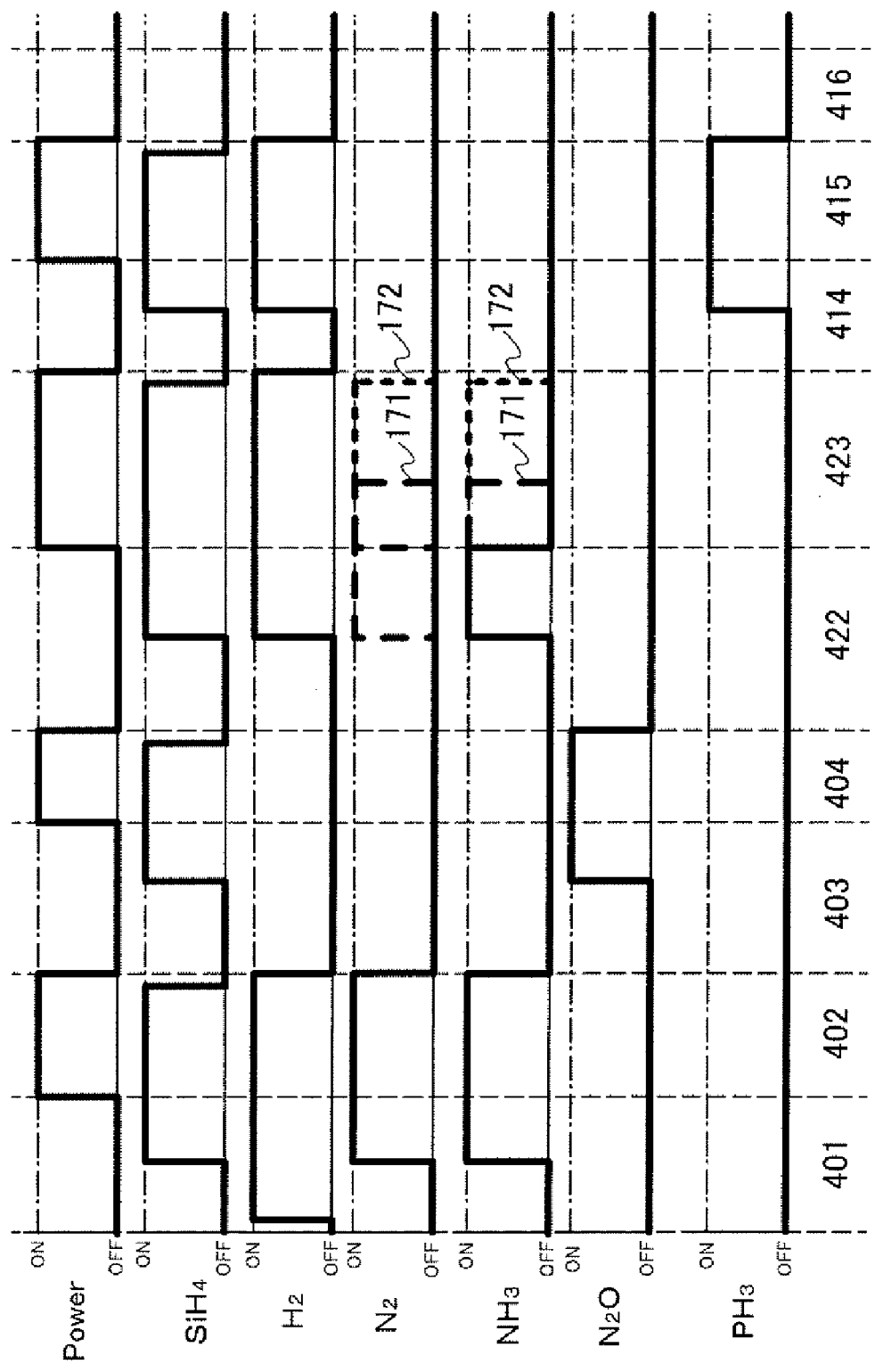
FIG. 14 is a diagram illustrating an example of a method for manufacturing a thin film transistor according to an embodiment of the present invention.

First, the substrate provided with the gate electrode layer 102 is heated in a treatment chamber (in a chamber) of a CVD apparatus, and source gases used for deposition of a silicon nitride layer are introduced into the treatment chamber (the preliminary treatment 401 in FIG. 14). Here, as an example, $SiH_4$, $H_2$, $N_2$, and $NH_3$ are introduced as source gases at flow rates of 40 sccm, 500 sccm, 550 sccm, and 140 sccm, respectively, and are stabilized. In addition, the pressure in the treatment chamber is set to be 100 Pa; the substrate temperature is set to be 280° C.; and plasma discharge is performed using an RF power source frequency of 13.56 MHz and power of an RF power source of 370 W. Thus, a silicon nitride layer with a thickness of about 110 nm is formed. After that, only the introduction of $SiH_4$ is halted, and several seconds later, plasma discharge is halted (the formation of SiN 402 in FIG. 14). Note that in the formation of SiN 402, as source gases used for deposition of the silicon nitride layer, at least one of $N_2$ and $NH_3$ may be used.

Next, the source gases used for deposition of the silicon nitride layer are exhausted, and source gases used for formation of a silicon oxynitride layer are introduced into the treatment chamber (the replacement of gases 403 in FIG. 14). Here, as an example, $SiH_4$ and $N_2O$ are introduced as source gases at flow rates of 30 sccm and 1200 sccm, respectively, and are stabilized. In addition, the pressure in the treatment chamber is set to be 40 Pa; the substrate temperature is set to be 280° C.; and plasma discharge is performed using an RF power source frequency of 13.56 MHz and power of an RF power source of 50 W. Thus, a silicon oxynitride layer with a thickness of about 110 nm is formed. After that, as in the case of the silicon nitride layer, only the introduction of $SiH_4$ is halted, and several seconds later, plasma discharge is halted (the formation of SiON 404 in FIG. 14). After that, these gases are exhausted, and gases used for formation of the amorphous semiconductor layer 105 are introduced (replacement of gases 422 in FIG. 14).

Next, the amorphous semiconductor layers 105a and 105b are stacked over an entire surface of the gate insulating layer 104 to form the amorphous semiconductor layer 105. The amorphous semiconductor layers 105a and 105b are patterned into the amorphous semiconductor layers 106a and 106b in later steps. Here, as an example, $SiH_4$, $H_2$, and $NH_3$ (diluted with H2) are introduced into the treatment chamber as source gases at flow rates of 280 sccm, 300 sccm, and 20 sccm, respectively, and are stabilized. In addition, the pressure in the treatment chamber is set to be 170 Pa; the substrate temperature is set to be 280° C.; and plasma discharge is performed using an RF power source frequency of 13.56 MHz and power of an RF power source of 60 W. Then, only the flow rate of $NH_3$ (diluted with $H_2$) is set to 0 sccm and an amorphous semiconductor layer is made to grow. Thus, the amorphous semiconductor layer 105a (amorphous silicon layer here) with a thickness of about 50 nm can be formed. In this step, the ammonia gas introduced into a reaction chamber at the time of formation of the SiN layer is dissociated by plasma discharge, so that an NH radical is generated.

Further, at the time of deposition of the amorphous semiconductor layer, different dangling bonds in the amorphous semiconductor layer can be cross-linked with the NH radical. Note that in the case where a nitrogen gas is introduced into the reaction chamber as a gas including nitrogen, reaction occurs between the nitrogen gas and a hydrogen gas which is a source gas for the amorphous semiconductor layer by plasma discharge, so that an NH radical is generated. Further, with the NH radical, different dangling bonds included in the amorphous semiconductor layer are cross-linked.

After gases including nitrogen (an ammonia gas and a nitrogen gas here) in the reaction chamber are consumed in formation of the amorphous semiconductor layer 105a, the amorphous semiconductor layer 105b is formed. After the amorphous semiconductor layer 105b is formed, as in the above-described formation of the silicon nitride layer or the like, only the introduction of $SiH_4$ is halted, and several seconds later, plasma discharge is halted (formation of a-Si layer 423 in FIG. 14). Then, these gases are exhausted, and gases used for formation of the semiconductor layer 109 including an impurity element imparting one conductivity type are introduced (the replacement of gases 414 in FIG. 14).

Note that, as indicated by a dashed line 171 in the formation of a-Si layer 423 in FIG. 14, the flow rate of the gas including nitrogen may be set to 0 sccm at the middle stage of deposition of the amorphous semiconductor layer after introduction into the reaction chamber. In this case, two layers, the amorphous semiconductor layer 105a including an NH radical with which dangling bonds are cross-linked and the amorphous semiconductor layer 105b without an NH radical with which dangling bonds are cross-linked, are formed.

Further, as indicated by a dashed line 172 in the formation of a-Si layer 423 in FIG. 14, a gas including nitrogen may be introduced into the reaction chamber during deposition of the amorphous semiconductor layer. In this case, the amorphous semiconductor layer 105 does not include the amorphous semiconductor layer 105b and only includes one layer, the amorphous semiconductor layer 105a including an NH radical with which dangling bonds are cross-linked.

In the case of using a method for introducing a gas including nitrogen which is shown by the dashed lines 171 and 172, it is preferable that the flow rate and the concentration of a gas including nitrogen be controlled so that the amorphous semiconductor layer does not have an insulating property.

In this embodiment, in a gas at the time of deposition of the amorphous semiconductor layer 105, a gas including nitrogen is included. A gas including nitrogen forms an NH radical by plasma discharge. Further, as described above, dangling bonds included in an amorphous silicon layer are cross-linked with an NH radical. Thus, by forming the amorphous semiconductor layer 105a over the gate insulating layer 104 in the reaction chamber to which a gas including nitrogen is supplied, an amorphous semiconductor layer including an NH radical with which dangling bonds are cross-linked can be formed.

Next, the semiconductor layer 109 including an impurity element imparting one conductivity type is formed over an entire surface of the amorphous semiconductor layer 105. The semiconductor layer 109 including an impurity element imparting one conductivity type is patterned into the source and drain regions 110 in later steps. First, source gases used for formation of the semiconductor layer 109 including an impurity element imparting one conductivity type are introduced into the treatment chamber. Here, as an example, $SiH_4$ and a mixed gas in which $PH_3$ is diluted with $H_2$ to 0.5 vol % are introduced as source gases at flow rates of 100 sccm and 170 sccm, respectively, and are stabilized. In addition, the pressure in the treatment chamber is set to be 280 Pa; the substrate temperature is set to be 280° C.; and plasma discharge is performed using an RF power source frequency of 13.56 MHz and power of an RF power source of 60 W. Thus, a semiconductor layer 109 including an impurity element imparting one conductivity type with a thickness of about 50 nm can be formed. After that, as in the above-described formation of the silicon nitride layer or the like, only the introduction of $SiH_4$ is halted, and several seconds later, plasma discharge is halted (the formation of impurity semiconductor layer 415 in FIG. 14). Then, these gases are exhausted (the exhaust 416 in FIG. 14).

As described above, by including nitrogen in a gas at an early stage of deposition or in deposition of the amorphous semiconductor layer, the oxygen concentration can be kept low and the nitrogen concentration can be made higher than the oxygen concentration, and thus, an amorphous semiconductor layer including an NH radical with which dangling bonds are cross-linked can be formed.

(Embodiment 5)

In this embodiment, a method for manufacturing a thin film transistor shown in FIGS. 1A and 1B which is different from Embodiments 1 to 4 is described. In this embodiment, an amorphous semiconductor layer in which dangling bonds are cross-linked with an NH radical is formed in a manner similar to Embodiments 1 to 4. However, a method for including nitrogen in an amorphous semiconductor layer is different.

In this embodiment, after formation of the amorphous semiconductor layer, treatment using plasma including nitrogen is performed, whereby nitrogen is included in the amorphous semiconductor layer. Thus, the oxygen concentration is kept low and the nitrogen concentration is made higher than the oxygen concentration. The steps of forming components from the gate insulating layer 104 up to the semiconductor layer 109 including an impurity element imparting one conductivity type are described with reference to FIG. 28.

Similar to Embodiment 4, steps from the preliminary treatment 401 through the formation of SiON 404 are performed, so that the gate electrode layer 102 and the gate insulating layer 104 are formed.

Next, similar to Embodiment 1, the replacement of gases 410 and the formation of a-Si layer 411 are performed, so that the amorphous semiconductor layer 105 is formed over the gate insulating layer 104.

Figure 28:
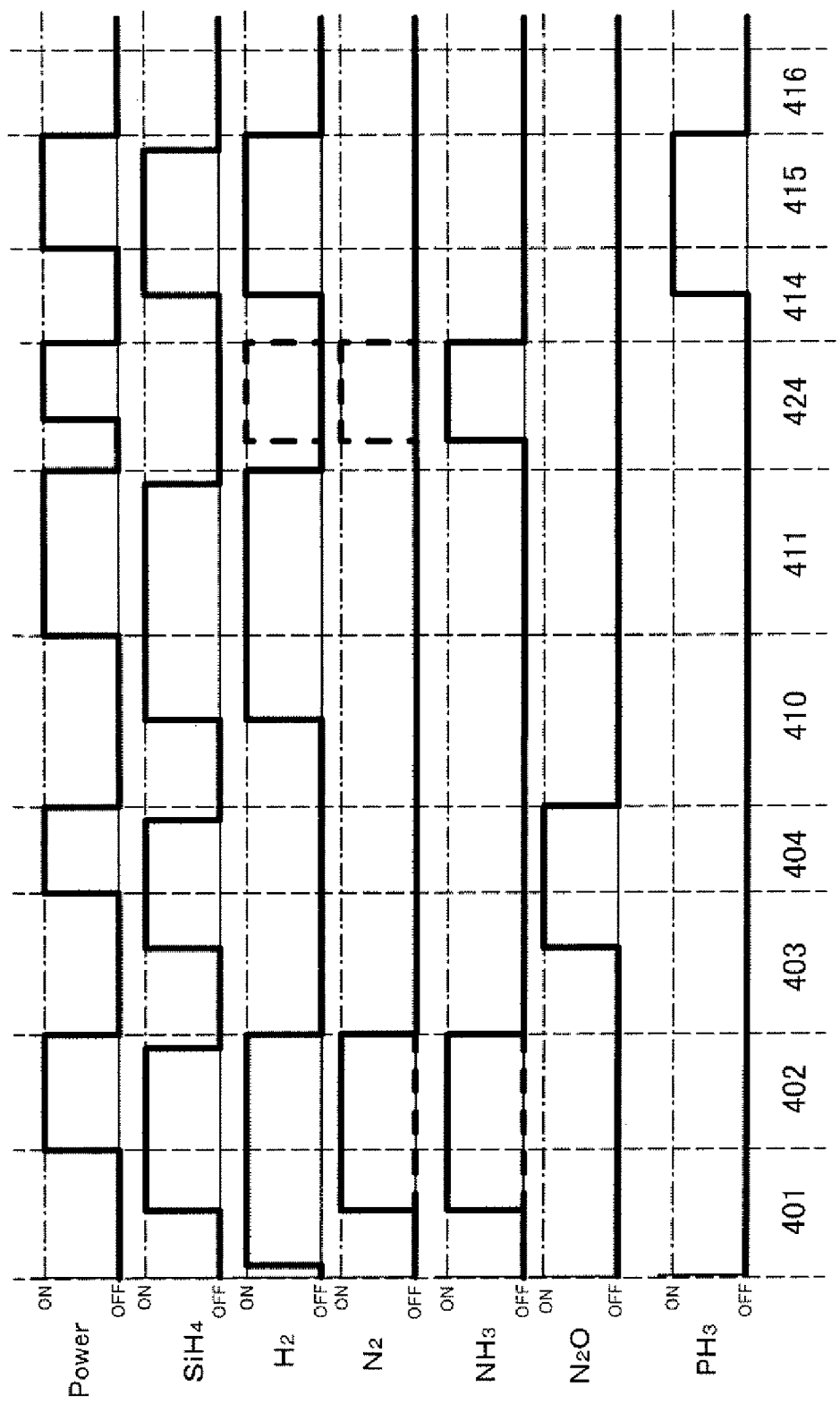
FIG. 28 is a diagram illustrating an example of a method for manufacturing a thin film transistor according to an embodiment of the present invention.

After the gas including nitrogen is introduced into the treatment chamber, plasma is produced (plasma treatment 424 in FIG. 28). Here, as an example, $NH_3$ is introduced; the pressure in the treatment chamber is set to be more than or equal to 100 Pa; the substrate temperature is set to be 280° C.; and plasma discharge is performed using an RF power source frequency of 13.56 MHz and power of an RF power source of less that or equal to 500 W. Thus, the amorphous semiconductor layer can be subjected to nitrogen plasma treatment. In this step, the ammonia gas introduced into the reaction chamber is dissociated by plasma discharge, so that an NH radical is generated. Further, the amorphous semiconductor layer is subjected to plasma treatment by the plasma discharge, so that different dangling bonds included in the amorphous semiconductor layer can be cross-linked with the NH radical. Note that nitrogen gas and hydrogen gas may be introduced into the treatment chamber instead of ammonia gas. Further, ammonia gas and nitrogen gas may be introduced into the treatment chamber.

After that, $SiH_4$ and $H_2$ may be introduced into the reaction chamber, so that an amorphous semiconductor layer may be further formed.

Then, these gases are exhausted, and gases used for formation of the semiconductor layer 109 including an impurity element imparting one conductivity type are introduced (the replacement of gases 414 in FIG. 28).

Next, the semiconductor layer 109 including an impurity element imparting one conductivity type is formed over an entire surface of the amorphous semiconductor layer 105 (the formation of impurity semiconductor layer 415 in FIG. 28). Then, these gases are exhausted (the exhaust 416 in FIG. 28).

As described above, by performing nitrogen plasma treatment after formation of the amorphous semiconductor layer, the oxygen concentration can be kept low and the nitrogen concentration can be made higher than the oxygen concentration, and thus, an amorphous semiconductor layer including an NH radical with which dangling bonds are cross-linked can be formed.

(Embodiment 6)

In this embodiment, an example of a mode of a thin film transistor according to this embodiment is described with reference to drawings. In this embodiment, a thin film transistor is formed without using a multi-tone mask.

Figure 15A:
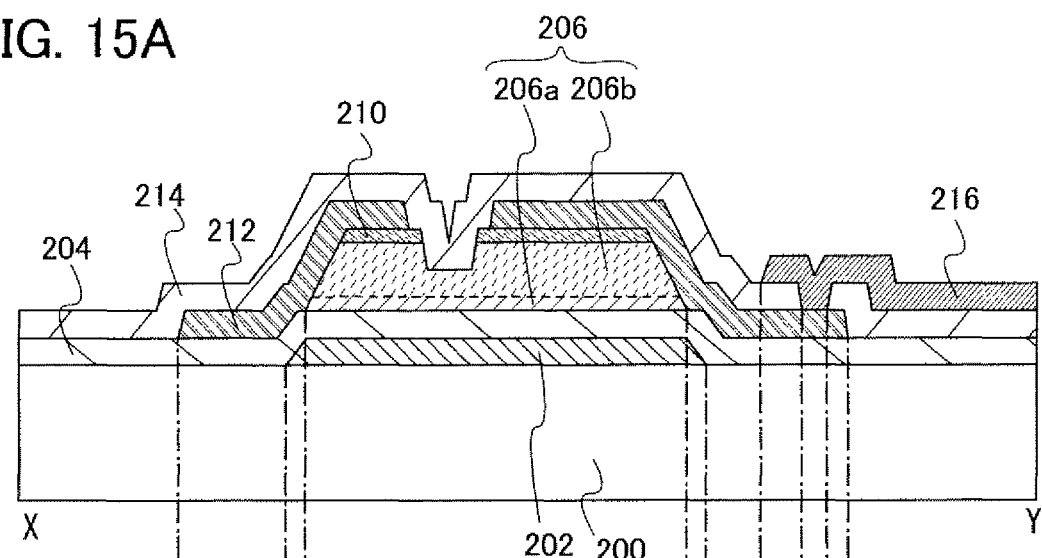
FIGS. 15A and 15B are diagrams illustrating an example of a thin film transistor according to an embodiment of the present invention.
Figure 15B:
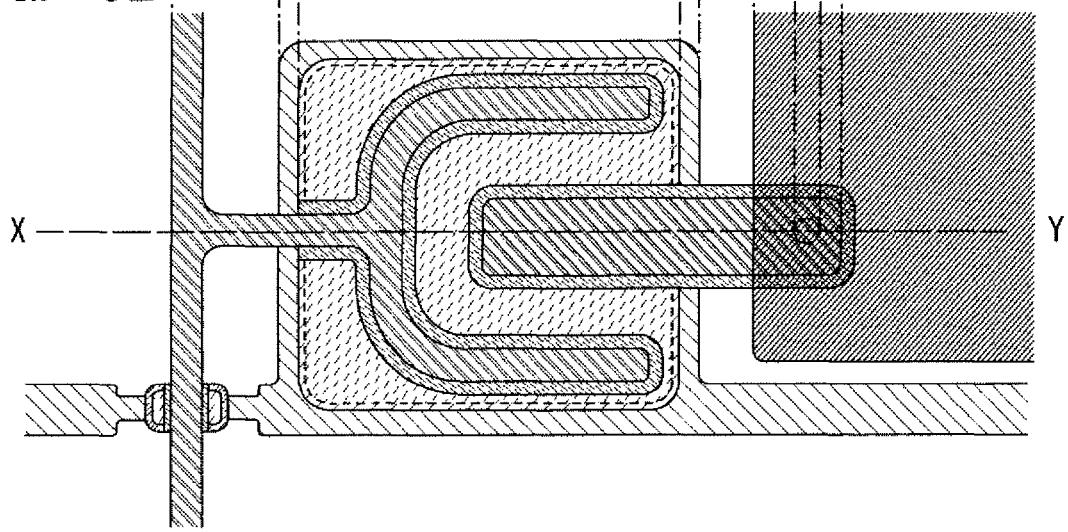

FIGS. 15A and 15B are a top view and a cross-sectional view of the thin film transistor according to this embodiment. The thin film transistor shown in FIG. 15A includes a gate electrode layer 202 over a substrate 200, a gate insulating layer 204 covering the gate electrode layer 202, an amorphous semiconductor layer 206 on and in contact with the gate insulating layer 204, and source and drain regions 210 on and in contact with part of the amorphous semiconductor layer 206. The amorphous semiconductor layer 206 includes an amorphous semiconductor layer 206a on the gate insulating layer 204 side and an amorphous semiconductor layer 206b on the source and drain regions 210 side. In addition, the thin film transistor includes wiring layers 212 on and in contact with the gate insulating layer 204 and the source and drain regions 210. The wiring layers 212 form source and drain electrodes. The thin film transistor further includes an insulating layer 214 which serves as a protective layer over the wiring layers 212. Each layer is patterned into a desired shape.

Note that the thin film transistor shown in FIGS. 15A and 15B can be applied to a pixel transistor provided in a pixel portion of a display device typified by a liquid crystal display device, a light-emitting device, or the like in a manner similar to the thin film transistor shown in FIGS. 1A and 1B. Therefore, in the shown example, an opening portion is provided in the insulating layer 214 and a pixel electrode layer 216 is provided over the insulating layer 214, so that the pixel electrode layer 216 and one of the wiring layers 212 are connected to each other.

Further, one of the source and drain electrodes formed with a U-shape (or a reversed C shape or a horseshoe shape) surrounds the other of the source and drain electrodes. The source electrode is kept at an almost uniform distance from the drain electrode (see FIG. 15B).

By forming source and drain electrodes of a thin film transistor with the above-described shape, the channel width of the thin film transistor can be increased, and the amount of current is increased. In addition, variations in electric characteristics can be reduced. Further, reduction of reliability due to the misalignment of mask patterns in a manufacturing process can be suppressed. However, this embodiment is not limited thereto, and one of the source and drain electrodes are not necessarily formed with a U-shape.

The amorphous semiconductor layer 206 according to this embodiment has a feature similar to the amorphous semiconductor layer 106 in Embodiment 1, and can he formed using a material and a method which are similar to those in Embodiment 1. Alternatively, the amorphous semiconductor layer 206 may be formed by any of the methods described in Embodiments 2 to 5. Therefore, in this embodiment, detailed description on formation of the amorphous semiconductor layer 206 is omitted.

A method for manufacturing the thin film transistor shown in FIGS. 15A and 15B is described. As for a thin film transistor, an n-channel transistor generally has higher mobility of carriers than a p-channel transistor. Further, it is preferable that all thin film transistors formed over the same substrate have the same polarity because the number of manufacturing steps can be reduced. Therefore, in this embodiment, a method for manufacturing an n-channel thin film transistor is described.

Figure 16A:
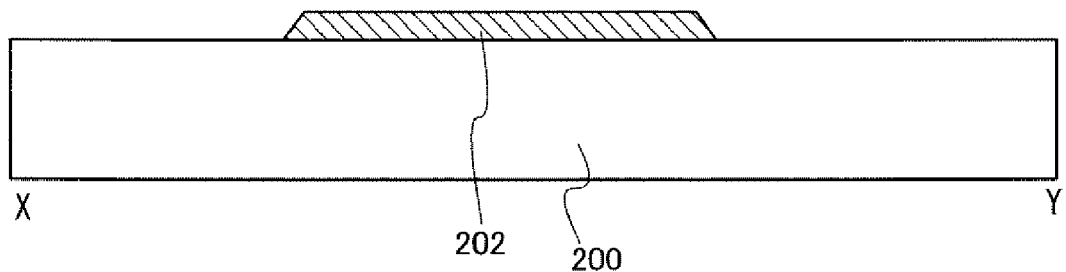
FIGS. 16A to 16C are diagrams illustrating an example of a method for manufacturing a thin film transistor according to an embodiment of the present invention.

First, the gate electrode layer 202 is formed over the substrate 200 (see FIG. 16A).

As the substrate 200, a substrate similar to the substrate 100 in Embodiment 1 can be used.

The gate electrode layer 202 can be formed using a material and a method which are similar to those used for the gate electrode layer 102 in Embodiment 1.

Figure 16B:
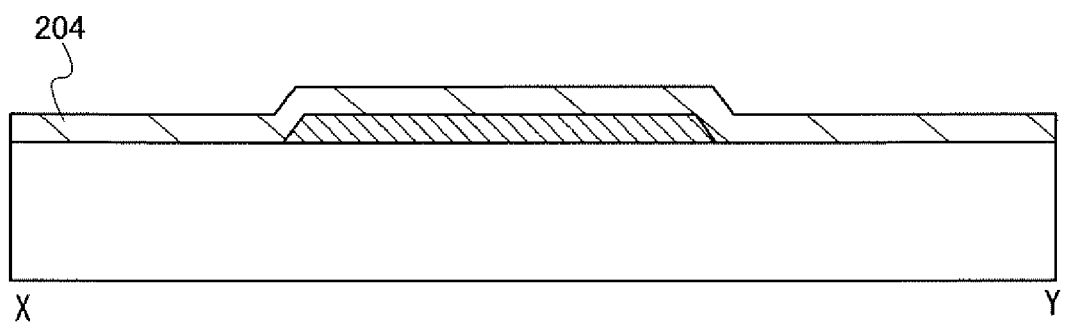

Next, the gate insulating layer 204 is formed to cover the gate electrode layer 202 (see FIG. 16B). The gate insulating layer 204 can be formed using a material and a method which are similar to those used for the gate electrode layer 104 in Embodiment 1.

Figure 16C:
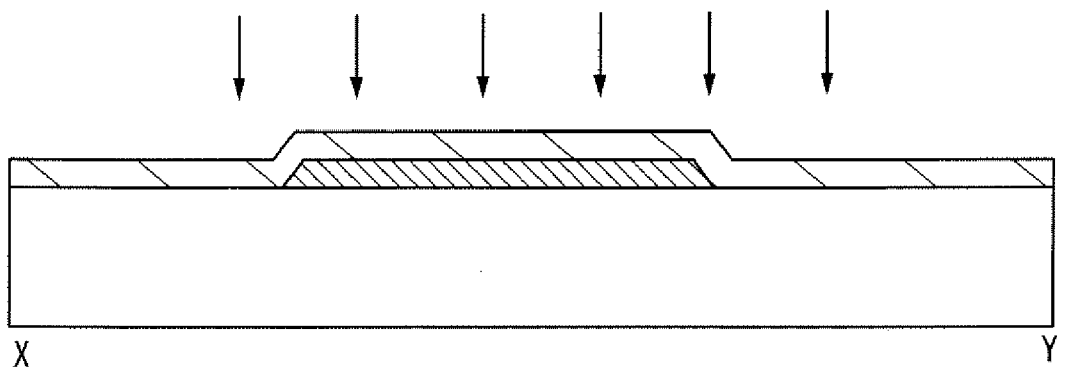

Here, treatment which supplies nitrogen to the gate insulating layer 204 may be performed (see FIG. 16C). As the treatment which supplies nitrogen, treatment in which the gate insulating layer 204 is exposed to an ammonia gas is given. The treatment is described in Embodiment 1.

Figure 17A:
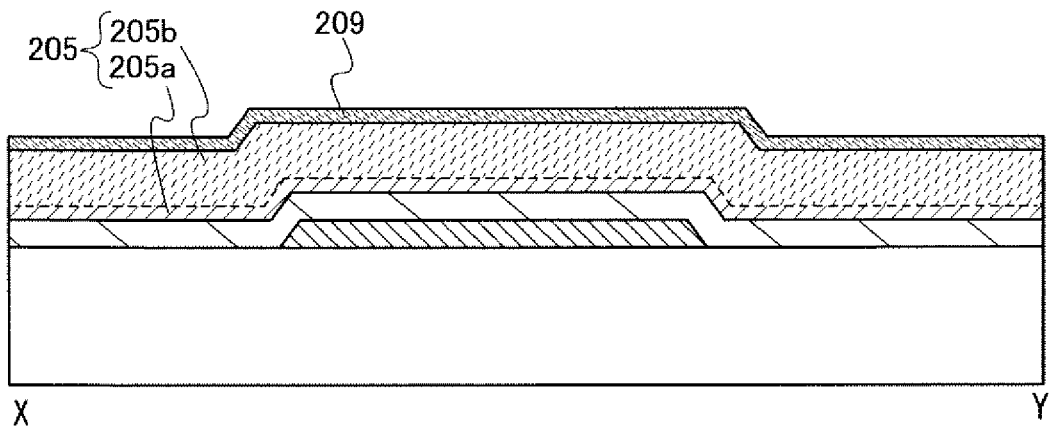
FIGS. 17A to 17C are diagrams illustrating an example of a method for manufacturing a thin film transistor according to an embodiment of the present invention.
Figure 17B:
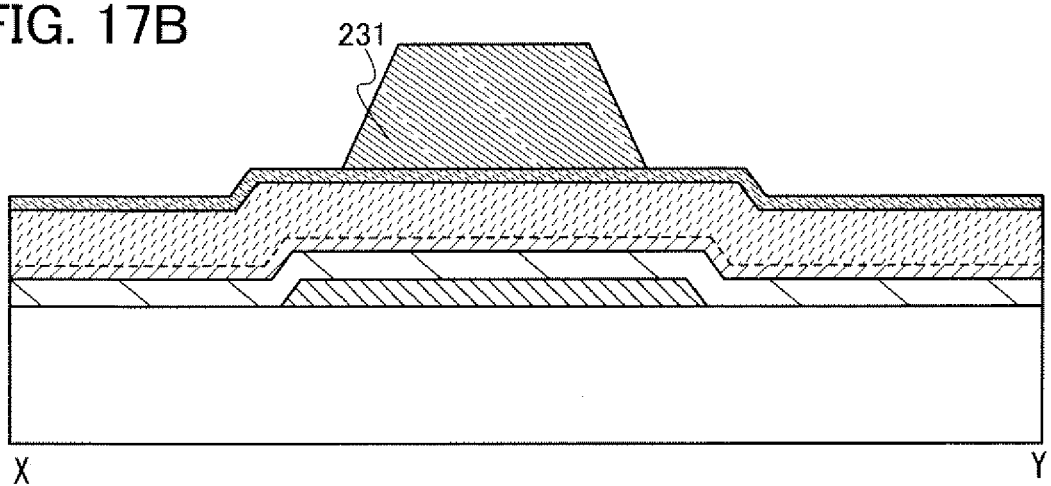

Next, an amorphous semiconductor layer 205 and an semiconductor layer 209 including an impurity element imparting one conductivity type are formed over the gate insulating layer 204 (see FIG. 17A). Then, a first resist mask 231 is formed over the semiconductor layer 209 including an impurity element imparting one conductivity type (see FIG. 17B).

The amorphous semiconductor layer 205 can be formed in a manner similar to the amorphous semiconductor layer 105 in Embodiment 1. The semiconductor layer 209 including an impurity clement imparting one conductivity type can be formed in a manner similar to the semiconductor layer 109 including an impurity element imparting one conductivity type in Embodiment 1.

Note that the amorphous semiconductor layer 205 may be formed by any of the methods described in Embodiments 2 to 4. In FIGS. 17(A), amorphous semiconductor layers 205a and 205b are stacked to form the amorphous semiconductor layer 205. Note that the amorphous semiconductor layers 205a and 205b are patterned into the amorphous semiconductor layers 206a and 206b in later steps.

Figure 17C:
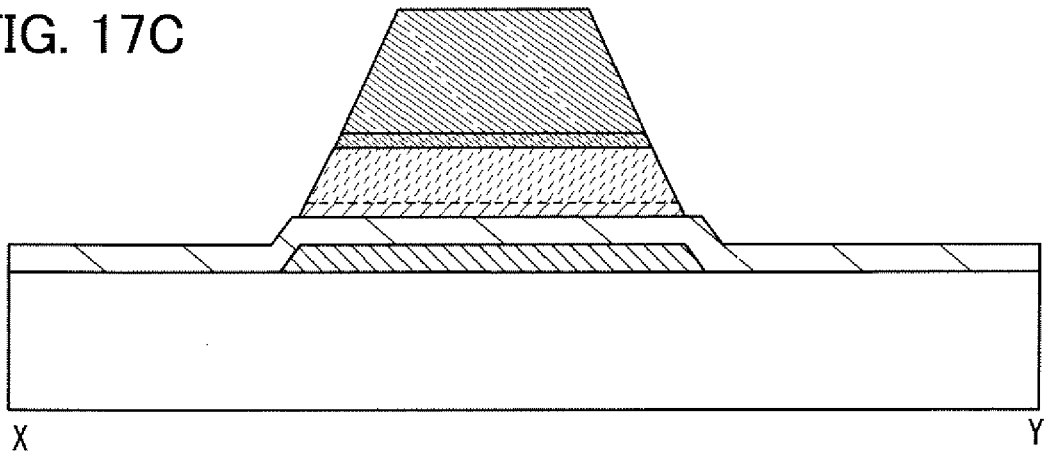
Figure 18A:
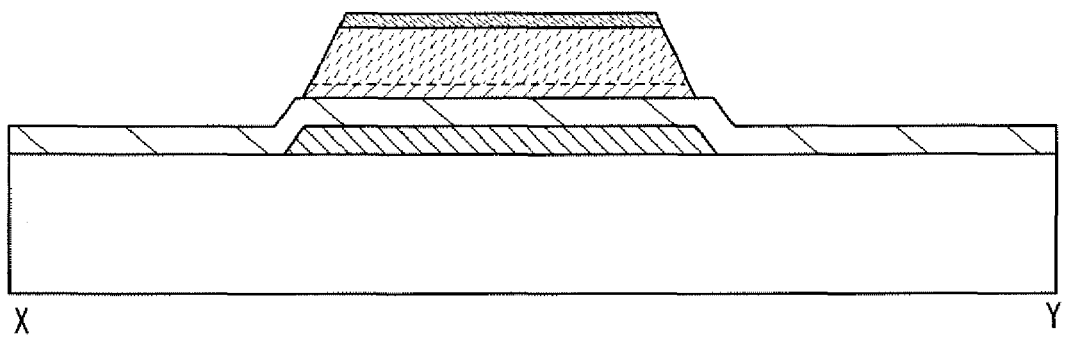
FIGS. 18A to 18C are diagrams illustrating an example of a method for manufacturing a thin film transistor according to an embodiment of the present invention.

The amorphous semiconductor layer 205 and the semiconductor layer 209 including an impurity element imparting one conductivity type are etched using the first resist mask 231, so that an island-like semiconductor layer is formed (see FIG. 17C). Then, the first resist mask 231 is removed (FIG. 18A).

Figure 18B:
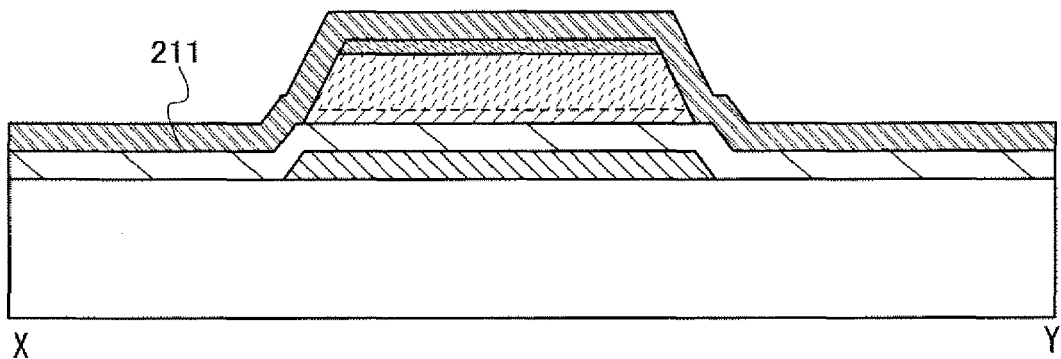
Figure 18C:
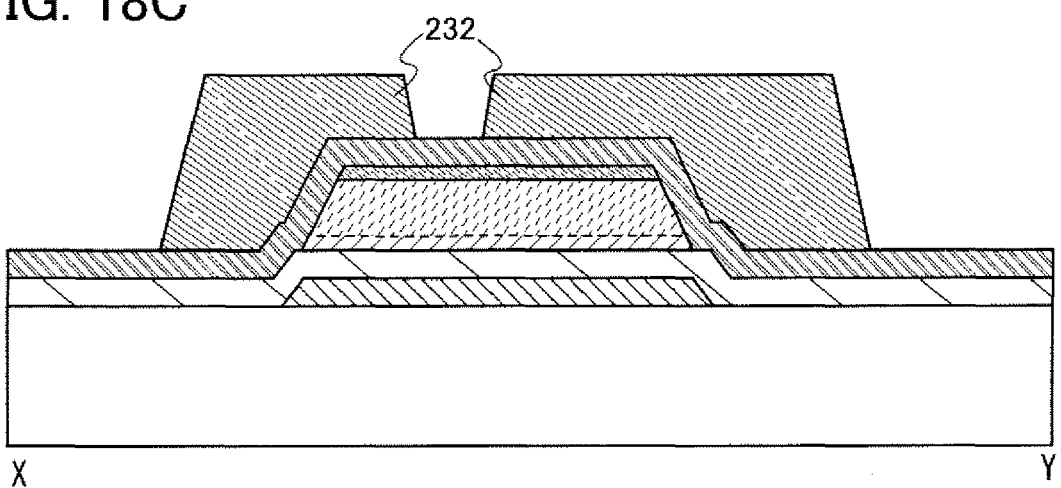

A conductive layer 211 is formed to cover the etched amorphous semiconductor layer 205 and semiconductor layer 209 including an impurity element imparting one conductivity type (see FIG. 18B). The conductive layer 211 can be formed using a material and a method which are similar to the conductive layer 111. Then, second resist masks 232 are formed over the conductive layer 211 (see FIG. 18C).

Figure 19A:
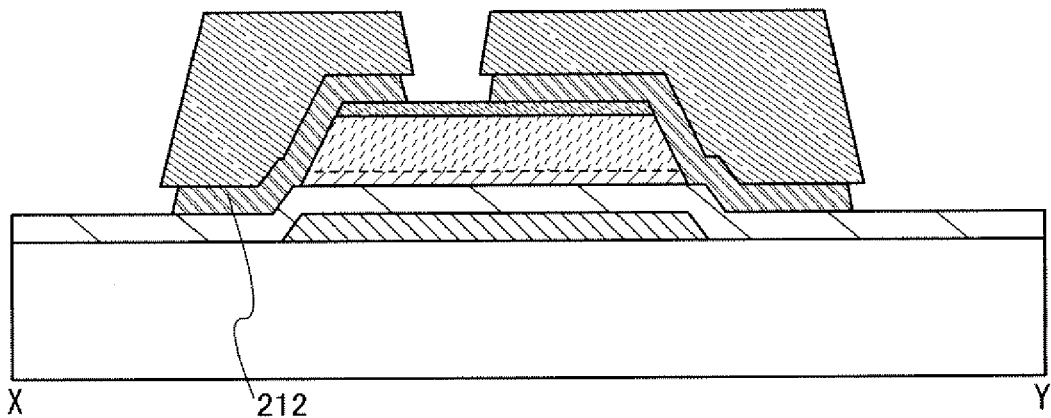
FIGS. 19A to 19C are diagrams illustrating an example of a method for manufacturing a thin film transistor according to an embodiment of the present invention.

The conductive layer 211 is etched using the second resist masks 232, so that the wiring layers 212 are formed (see FIG. 19A). The wiring layers 212 form source and drain electrodes. The etching of the conductive layer 211 is preferably wet etching. By wet etching, the side faces of the conductive layers are selectively etched. Thus, surfaces of the conductive layers recede to an inner side than that of the second resist masks 232, and the wiring layers 212 are formed. The wiring layers 212 also serve as signal lines as well as the source and drain electrodes. However, this embodiment is not limited thereto, and signal lines and the wiring layers 121 may be separately provided.

Figure 19B:
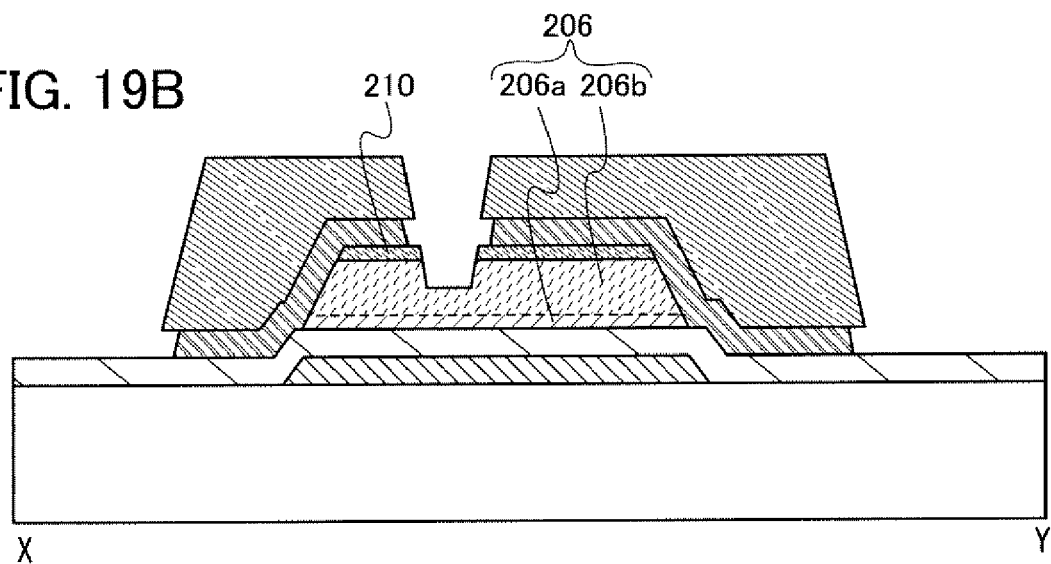

Part of the amorphous semiconductor layer 205 and the semiconductor layer 209 including an impurity element imparting one conductivity type are etched using the second resist mask 232 (see FIG. 19B). Through the above-described steps, the amorphous semiconductor layer 206 and the source and drain regions 210 are formed. Note that the side faces of the wiring layers 212 are not aligned with the side faces of the etched semiconductor layers 209 including an impurity element imparting one conductivity type, and the side faces of the source and drain regions 210 are formed on an outer side than the side faces of the wiring layers 212.

Figure 19C:
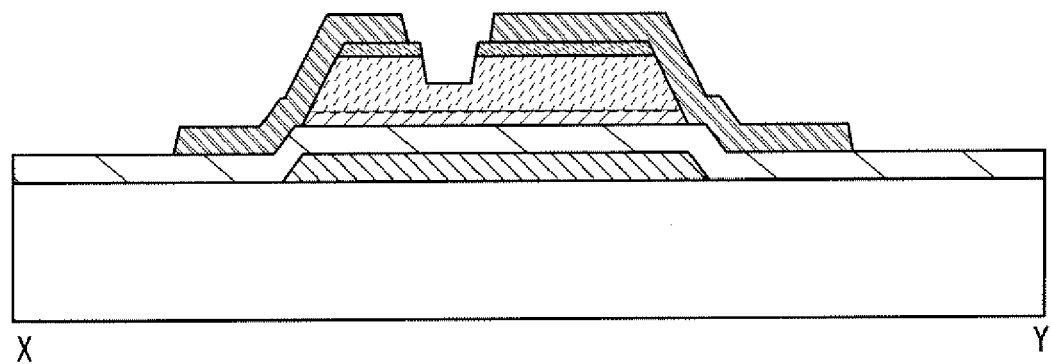

Next, dry etching may be performed under such a condition that the amorphous semiconductor layer 206 is not damaged and an etching rate with respect to the amorphous semiconductor layer 206 for forming a buffer layer is low, with the second resist mask 232 formed, in a manner similar to Embodiment 1. Further, the second resist mask 232 may be removed by water plasma treatment (see FIG. 19C).

Through the above-described steps, the thin film transistor according to this embodiment can be manufactured. Like the thin film transistor described in Embodiment 1, the thin film transistor according to this embodiment can be applied to a switching transistor in a pixel of a display device typified by a liquid crystal display device. Therefore, the insulating layer 214 is formed to cover the thin film transistor. In the insulating layer 214, an opening portion is formed to reach one of the wiring layers 212. This opening portion can be formed by a photolithography method. Then, the pixel electrode layer 216 is provided over the insulating layer 214 so that the pixel electrode layer 216 is connected to the one of the wiring layers 212 through the opening portion. The wiring layers 212 form the source and drain electrodes of the thin film transistor. Thus, a switching transistor in the pixel of the display device shown in FIGS. 15A and 15B can be manufactured.

Note that the insulating layer 214 can be formed in a manner similar to the insulating layer 114 in Embodiment 1, and the pixel electrode layer 216 can be formed in a manner similar to the pixel electrode layer 116 in Embodiment 1.

Although not shown, an insulating layer formed using an organic resin layer by a spin coating method or the like may be present between the insulating layer 214 and the pixel electrode layer 216.

Thus, as described in this embodiment, a thin film transistor in which the on-state current is high and the off-state current is low can be obtained without using a multi-tone mask.

(Embodiment 7)

In this embodiment, a liquid crystal display device having a thin film transistor described in Embodiment 6, as one mode of a display device, will be described below. Here, a vertical alignment (VA) liquid crystal display device is described with reference to FIG. 20, FIG. 21, and FIG. 22. The VA liquid crystal display device is a kind of mode in which alignment of liquid crystal molecules of a liquid crystal panel is controlled. The VA liquid crystal display device is a mode in which liquid crystal molecules are vertical to a panel surface when voltage is not applied. In this embodiment, it is devised to particularly separate pixels into some regions (sub-pixels) so that molecules are aligned in different directions in the respective regions. This is referred to as multi-domain or multi-domain design. In the following description, a liquid crystal display device with multi-domain design is described.

Figure 20:
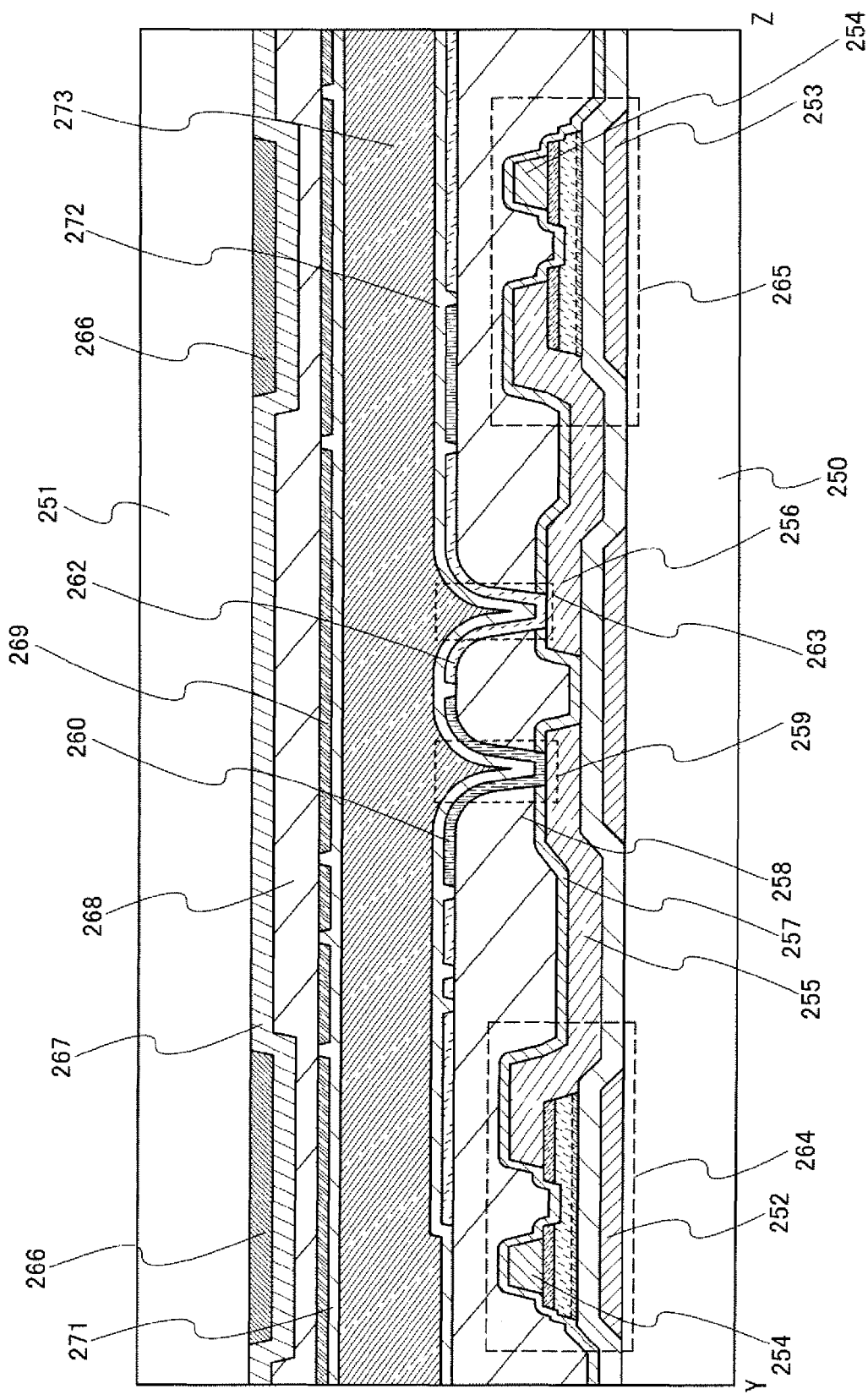
FIG. 20 is a diagram illustrating an electronic device or the like in which a thin film transistor of one embodiment of the present invention can be used.
Figure 21:
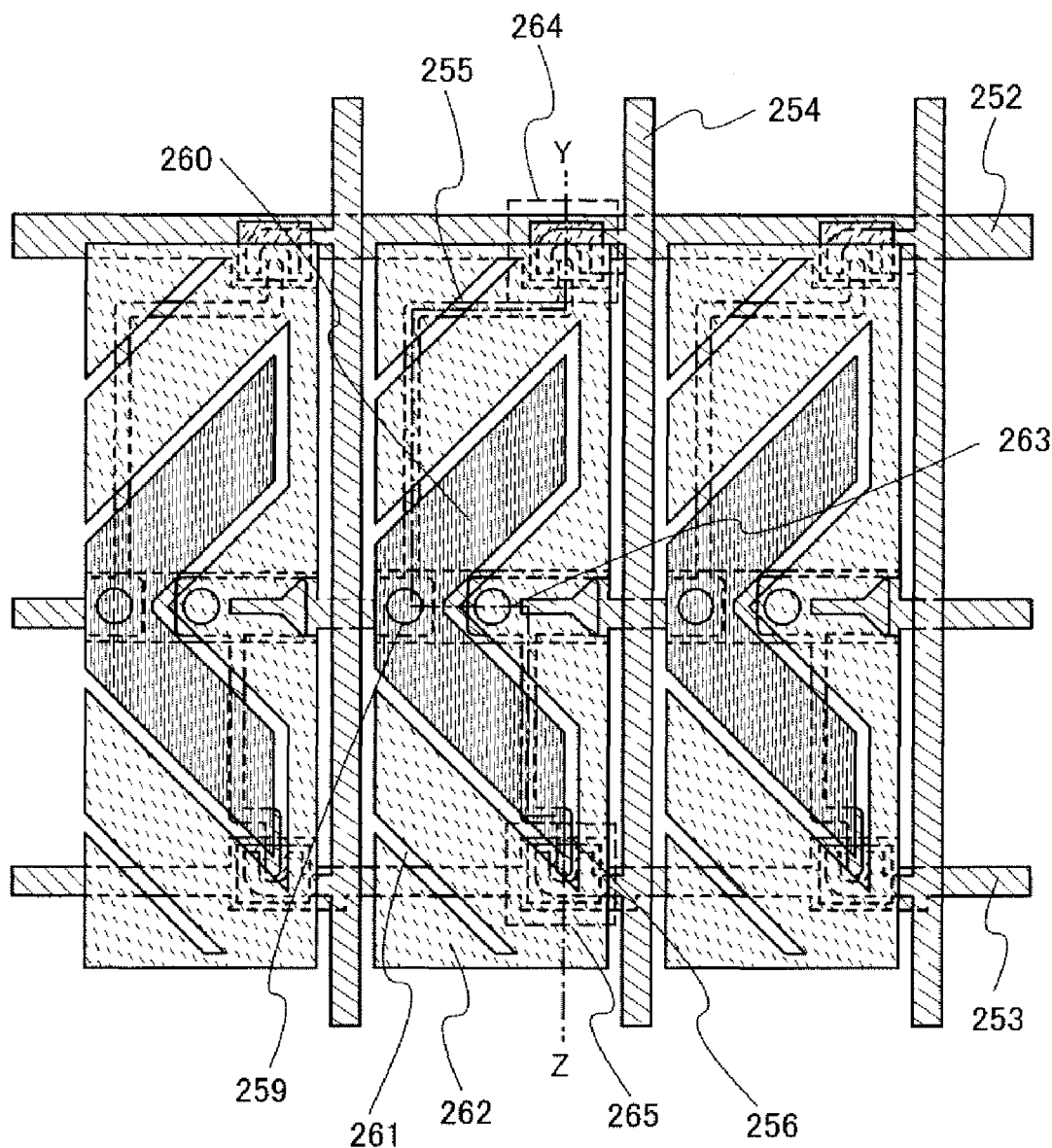
FIG. 21 is a diagram illustrating an electronic device or the like in which a thin film transistor of one embodiment of the present invention can be used.

FIG. 20 and FIG. 21 show a pixel structure of a VA-type liquid crystal display device. FIG. 21 is a plan view of a pixel structure described in this embodiment. FIG. 20 shows a cross-sectional structure along a line Y-Z in FIG. 21. Hereinafter, description is made with reference to FIG. 20 and FIG. 21.

In the pixel structure described in this embodiment, one pixel provided over a substrate 250 includes a plurality of pixel electrodes 260 and 262. Thin film transistors 264 and 265 are connected to pixel electrodes 260 and 262, respectively, with a planarizing layer 258 and an insulating layer 257 interposed therebetween. The thin film transistors 264 and 265 are driven by different gate signals. In other words, a multi-domain pixel has a structure in which signals applied to the pixel electrodes 260 and 262 are individually controlled.

The pixel electrode 260 is connected to the thin film transistor 264 in an opening portion 259 with a wiring 255 interposed therebetween. Further, the pixel electrode 262 is connected to the thin film transistor 265 in an opening portion 263 with a wiring 256 interposed therebetween. A gate electrode 252 of the thin film transistor 264 and a gate electrode 253 of the thin film transistor 265 are separated so that different gate signals can be given thereto. In contrast, a wiring 254 serving as a data line is used in common for the thin film transistors 264 and 265. The thin film transistors 264 and 265 can be manufactured by the method described in Embodiment 6.

The pixel electrodes 260 and 262 have different shapes, and they are separated by a slit 261. The pixel electrode 262 is formed so as to surround the external side of the pixel electrode 260 which is spread into a V shape. Timing of voltage application is made to vary between the pixel electrodes 260 and 262 by the thin film transistors 264 and 265 in order to control alignment of the liquid crystal. By giving different gate signals to the gate electrodes 252 and 253, operation timing of the thin film transistors 264 and 265 can be made different. In addition, an alignment film 272 is formed over the pixel electrodes 260 and 262.

Figure 22:
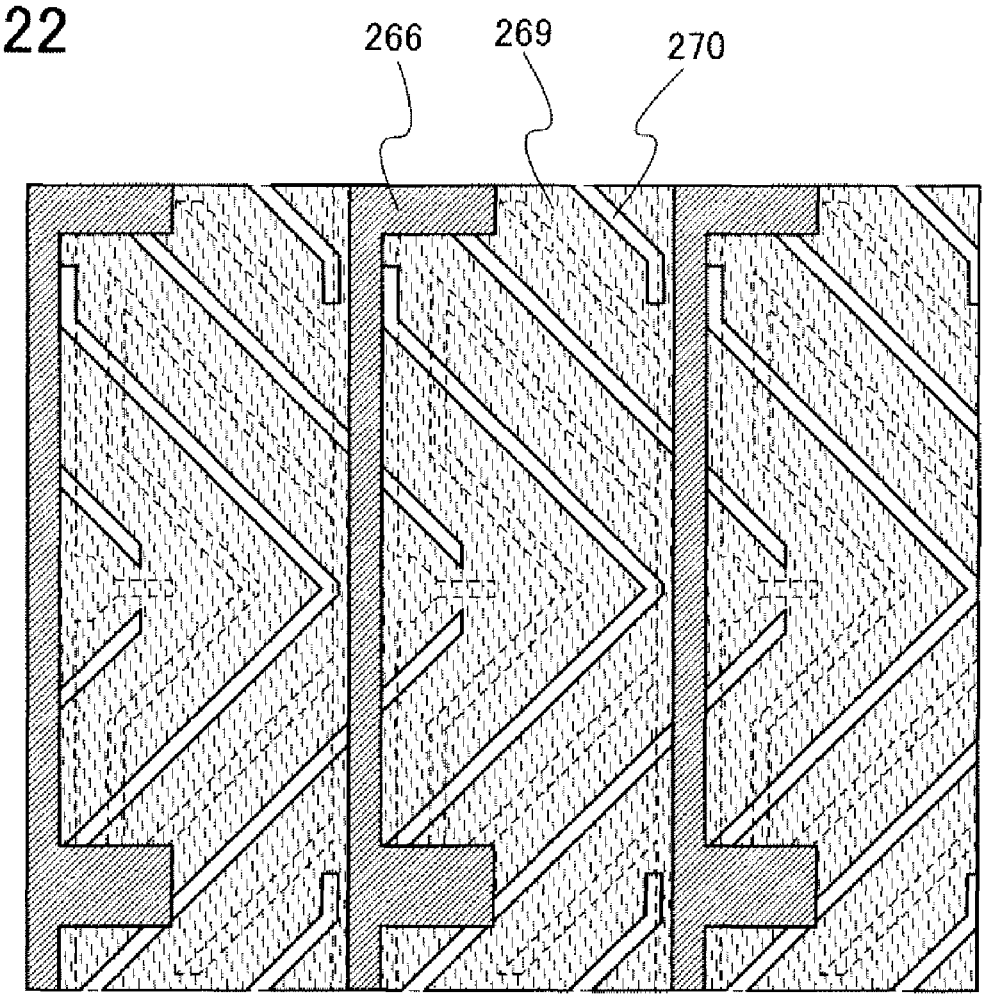
FIG. 22 is a diagram illustrating an electronic device or the like in which a thin film transistor of one embodiment of the present invention can be used.

A counter substrate 251 is provided with a light shielding layer 266, a coloring layer 267, and a counter electrode 269. Furthermore, a planarization layer 268 is formed between the coloring layer 267 and the counter electrode 269, whereby orientation disorder of liquid crystal is prevented. Further, an alignment film 271 is formed over the counter electrode 269. FIG. 22 shows a pixel structure on the counter substrate 251 side. The counter electrode 269 is commonly used in different pixels, and a slit 270 is included. The slit 270 and the slit 261 of the pixel electrodes 260 and 262 are alternately arranged, and thus, oblique electric fields can be generated and alignment of liquid crystal can be controlled well. Thus, an alignment direction of the liquid crystal can be varied depending on a place; therefore, the viewing angle can be widened.

Here, a substrate, a coloring layer, a light shielding layer, and a planarization layer form a color filter. Either the light shielding layer or the planarization layer, or both of them is not necessarily formed over the substrate.

The coloring layer has a function of preferentially transmitting light of a predetermined wavelength range, among light of the wavelength range of visible light. In general, a coloring layer which preferentially transmits light of a wavelength range of red light, a coloring layer which preferentially transmits light of a wavelength range of blue light, and a coloring layer which preferentially transmits light of a wavelength range of green light are combined to be used for a color filter. However, the combination of the coloring layer is not limited to the above combination.

A first liquid crystal element is formed by interposing a liquid crystal layer 273 between the pixel electrode 260 and the counter electrode 269. Further, a second liquid crystal element is formed by interposing the liquid crystal layer 273 between the pixel electrode 262 and the counter electrode 269. This is a multi-domain structure in which the first liquid crystal element and the second liquid crystal element are included in one pixel.

Although a vertical alignment (VA) liquid crystal display device has been described here as a liquid crystal display device, this embodiment is not limited to this. That is, an element substrate formed using the thin film transistor in accordance with Embodiment 6 can also be applied to an FFS mode liquid crystal display device, an IPS mode liquid crystal display device, a TN mode liquid crystal display device, and other modes of liquid crystal display devices.

Although the thin film transistor manufactured in accordance with Embodiment 6 is used in the above description, the thin film transistor manufactured in accordance with any of Embodiments 1 to 5 may be used.

As described above, a liquid crystal display device can be manufactured. In the liquid crystal display device of this embodiment, a thin film transistor in which the on-state current is high and the off-state current is low is used as a pixel transistor; therefore, the liquid crystal display device which performs image display with high image quality (for example, with high contrast) and consumes low power can be manufactured.

(Embodiment 8)

Figure 23A:
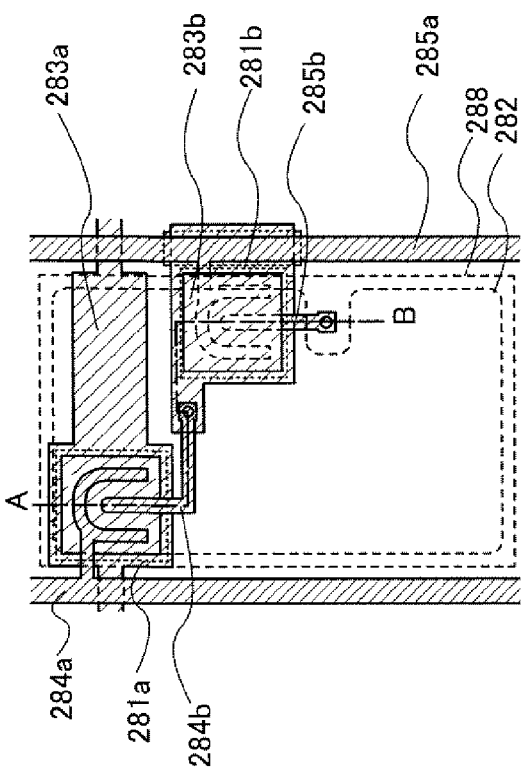
FIGS. 23A and 23B are diagrams illustrating an electronic device or the like in which a thin film transistor of one embodiment of the present invention can be used.
Figure 23B:
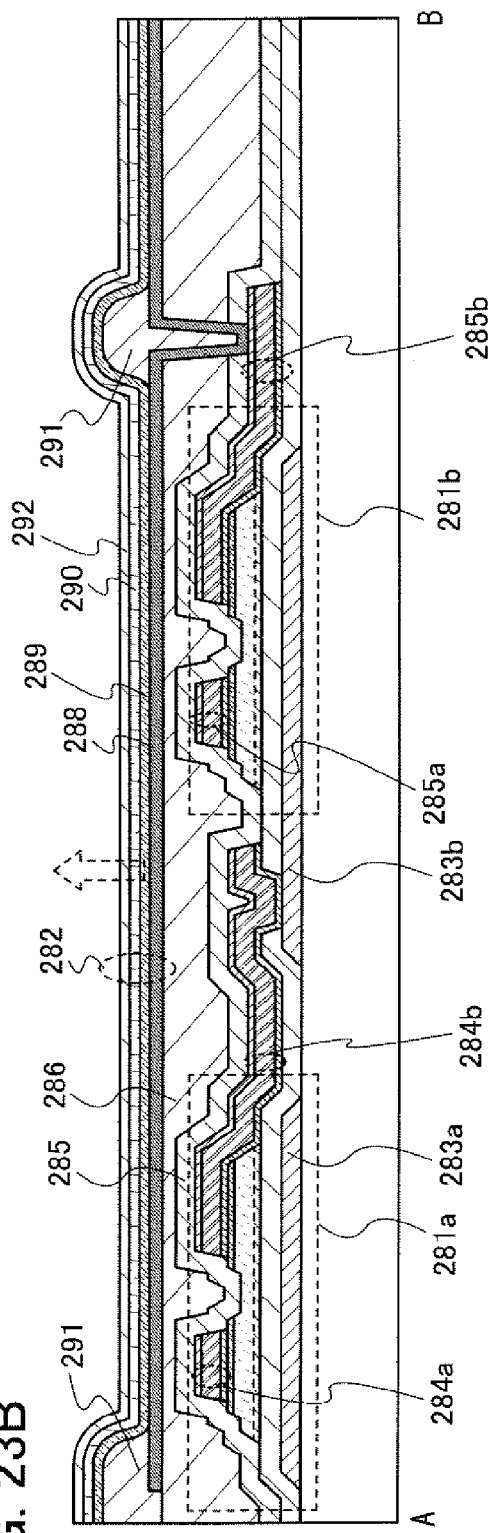

In this embodiment, a light-emitting display device including the thin film transistor in accordance with Embodiment 6 will be described as one mode of a display device. Here, a structure of a pixel included in the light-emitting display device will be described. FIG. 23A is a plan view of a pixel. FIG. 23B shows a cross-sectional structure along a line A-B in FIG. 23A.

In this embodiment, a display device including a light-emitting element utilizing electroluminescence is described as a light-emitting display device. Light-emitting elements utilizing electroluminescence are classified according to whether a light-emitting material is an organic compound or an inorganic compound. In general, the former is referred to as organic EL elements and the latter as inorganic EL elements. Although Embodiment 6 is used here as a manufacturing process of a thin film transistor, the present invention is not limited to this, and a thin film transistor may be manufactured by a manufacturing method described in any of Embodiment 1 to 5.

In an organic EL element, by application of a voltage to a light-emitting element, electrons and holes are separately injected from a pair of electrodes into a layer containing a light-emitting organic compound, so that current flows. Then, by recombination of these carriers (electrons and holes), the organic compound with a light-emitting property forms an excited state, and light is emitted when the excited state returns to a ground state. Due to such mechanism, such a light emitting element is called a current excitation light emitting element.

Inorganic EL elements are classified into a dispersion-type inorganic EL element and a thin-film-type inorganic EL element according to their element structures. A dispersion type inorganic EL element has a light-emitting layer where particles of a light-emitting material are dispersed in a binder, and its light emission mechanism is donor-acceptor recombination type light emission that utilizes a donor level and an acceptor level. The thin-film-type inorganic EL element has a structure in which a light-emitting layer is interposed between dielectric layers and the light-emitting layer interposed between the dielectric layers is further interposed between electrodes and adopts local emission in which inner shell electron transition of a metal ion is utilized. Note that description is made here using an organic EL element as a light-emitting element.

In FIGS. 23A and 23B, a first thin film transistor 281a is a switching thin film transistor for controlling input of a signal to a pixel electrode, and a second thin film transistor 281b is a driving thin film transistor for controlling current or voltage supply to a light-emitting element 282.

In the first thin film transistor 281a, a gate electrode is connected to a scan line 283a, one of source and drain regions is connected to a signal line 284a, and the other of the source and drain regions is connected to a gate electrode 283b of the second thin film transistor 281b through a wiring 284b. In the second thin film transistor 281b, one of source and drain regions is connected to a power supply line 285a, and the other of the source and drain regions is connected to a pixel electrode (cathode 288) of a light-emitting element through a wiring 285b. The gate electrode, a gate insulating layer, and the power supply line 285a of the second thin film transistor 281b form a capacitor, and the other of the source and drain regions of the first thin film transistor 281a is connected to the capacitor.

Note that the capacitor corresponds to a capacitor for holding a voltage between the gate electrode and the source electrode or between the gate electrode and the drain electrode of the second thin film transistor 281b (hereinafter referred to as a gate voltage) when the first thin film transistor 281a is off, and is not necessarily provided.

In this embodiment, both of the first thin film transistor 281a and the second thin film transistor 281b are formed using an n-channel thin film transistor; however, one or both of them may be formed using a p-channel thin film transistor.

A insulating layer 285 is formed over the first thin film transistor 281 a and the second thin film transistor 281b. A planarization layer 286 is formed over the insulating layer 285, and an opening portion is formed in the planarization layer 286 and the insulating layer 285. Further, a cathode 288 which is connected to the wiring 285b in the opening portion is formed. The planarization layer 286 is preferably formed using an organic resin such as an acrylic resin, polyimide, or polyamide, or a siloxane polymer. In the opening portion, the cathode 288 has unevenness; therefore, a partition wall 291 which covers the unevenness region and has an opening portion is provided. An EL layer 289 is formed to be in contact with the cathode 288 in the opening portion of the partition wall 291, and an anode 290 is formed to cover the EL layer 289. A protective insulating layer 292 is formed so as to cover the anode 290 and the partition wall 291.

Here, the light-emitting element 282 with a top emission structure is described as a light-emitting element. Note that the light-emitting element 282 with a top emission structure can emit light even in the case where it is over the first thin film transistor 281a or the second thin film transistor 281b; thus, a large light emission area can be obtained. However, if an under layer of the EL layer 289 is uneven, thickness of the EL layer 289 is nonuniform due to the unevenness and the anode 290 and the cathode 288 are short-circuited, and a display defect is caused. Therefore, a planarization layer 286 is preferably provided. By providing the planarization layer 286, yield can be improved.

A region where the EL layer 289 is sandwiched between the cathode 288 and the anode 290 corresponds to the light-emitting element 282. In the case of the pixel shown in FIGS. 23A and 23B, light from the light-emitting element 282 is emitted through the anode 290 side as shown by an outline arrow in FIG. 23B.

The cathode 288 is formed using any conductive layer as long as it has a low work function and reflects light, and a known material can be used. For example, Ca, Al, MgAg, AlLi, or the like is desirably used. The EL layer 289 may be formed using a single layer or by stacking a plurality of layers. In the case of using a plurality of layers, an electron injection layer, an electron transporting layer, a light-emitting layer, a hole transporting layer, and a hole injection layer are stacked in that order over the cathode 288. Note that all of the electron injecting layer, the electron transporting layer, the hole transporting layer, and the hole injecting layer other than the light-emitting layer are not necessarily provided, and the layer which is to be provided may be selected in accordance with need. The anode 290 is formed using a light-transmitting conductive material which transmits light. For example, a light-transmitting conductive layer of indium oxide containing tungsten oxide, indium zinc oxide containing tungsten oxide, indium oxide containing titanium oxide, indium tin oxide containing titanium oxide, ITO, indium zinc oxide, indium tin oxide to which silicon oxide is added, or the like may be used.

Here, a light-emitting element with a top emission structure in which light is extracted from a side opposite to a substrate is described here; however, the present invention is not limited to this. That is, a light-emitting element with a bottom emission structure in which light is extracted from the substrate side, or a light-emitting element with a dual emission structure in which light is extracted from both the substrate side and the side opposite to the substrate, can also be employed.

Note that although an organic EL element is described here as a light-emitting element, an inorganic EL element can also be used as a light-emitting element.

In this embodiment, an example is described in which a thin film transistor for controlling driving of a light-emitting element (the driving thin film transistor) is electrically connected to the light-emitting element. However, a thin film transistor for controlling current may be connected between the driving thin film transistor and the light-emitting element.

As described above, a light-emitting display device can be manufactured. In the light-emitting display device of this embodiment, a thin film transistor in which the on-state current is high and the off-state current is low is used as a pixel transistor; therefore, the light-emitting display device which performs image display with high image quality (for example, with high contrast) and consumes low power can be manufactured.

(Embodiment 9)

Next, an example of the structure of a display panel which is a display device to which the above embodiment can be applied is described.

Figure 24A:
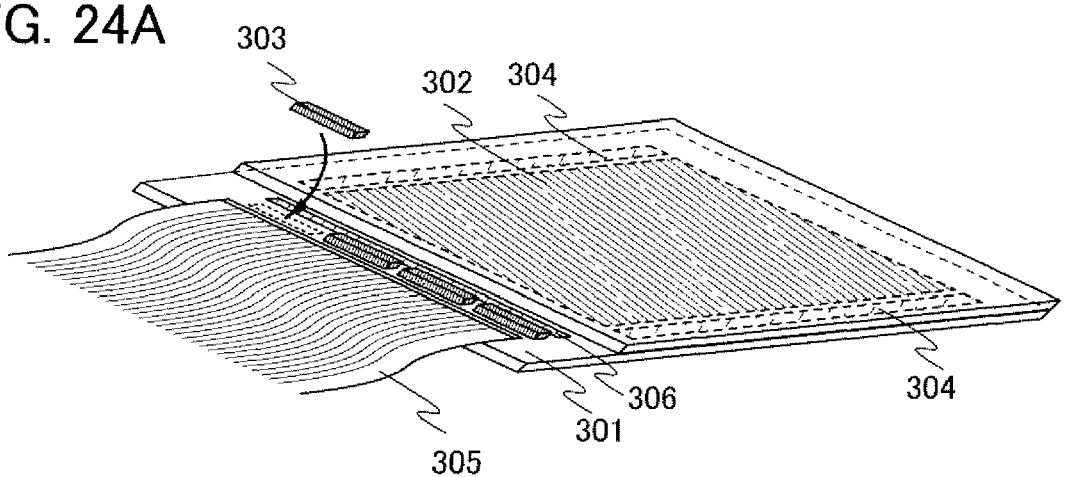
FIGS. 24A to 24C are diagrams illustrating electronic devices or the like in each of which a thin film transistor of one embodiment of the present invention can be used.

FIG. 24A illustrates a mode of a display panel in which a pixel portion 302 formed over a substrate 301 is connected to a signal line driver circuit 303 which is only formed separately. An element substrate provided with the pixel portion 302, a protection circuit 306, and a scan line driver circuit 304 is formed using any of the thin film transistors described in Embodiments 1 to 6. Note that the signal line driver circuit 303 may be formed using a transistor in which a single-crystal semiconductor is used for a channel formation region, a thin film transistor in which a polycrystalline semiconductor is used for a channel formation region, or a transistor in which silicon on insulator (SOI) is used for a channel formation region. The transistor in which SOI is used for a channel formation region includes a transistor in which a single crystal semiconductor layer provided over a glass substrate is used for a channel formation region. A potential of a power supply, various signals, and the like are supplied to the pixel portion 302, the signal line driver circuit 303, and the scan line driver circuit 304 through an FPC 305, respectively. Further, a protection circuit 306 formed using any of the thin film transistors described in Embodiments 1 to 6 may be provided between the signal line driver circuit 303 and the FPC 305 or/and between the signal line driver circuit 303 and the pixel portion 302. The protection circuit 306 may be formed using one or more elements selected from a thin film transistor with other structures, a diode, a resistor, a capacitor, and the like.

Note that the signal line driver circuit and the scan line driver circuit may both be formed over the same substrate as a pixel transistor of the pixel portion.

Figure 24B:
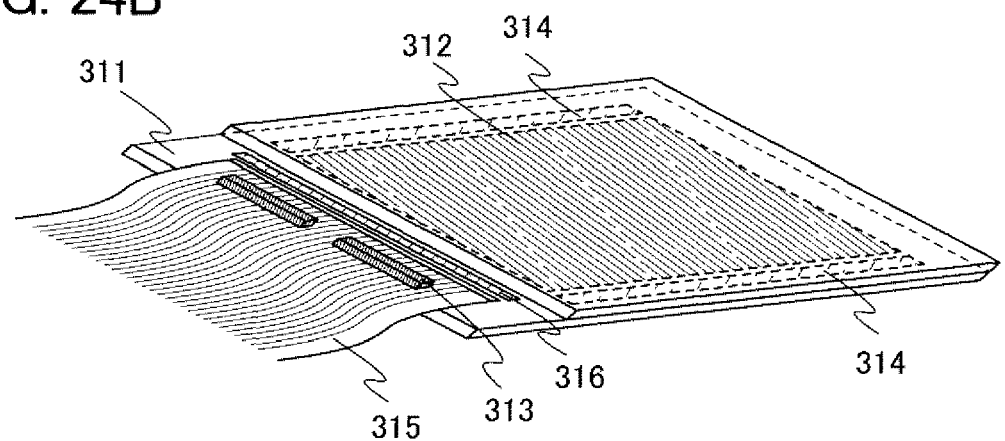

Further, when the driver circuit is separately formed, a substrate provided with the driver circuit is not always required to be attached to a substrate provided with the pixel portion, and may be attached to, for example, the FPC. FIG. 24B shows a mode of a display panel in which only a signal line driver circuit 313 is separately formed and an element substrate provided with a pixel portion 312, a protection circuit 316, and a scan line driver circuit 314 formed over a substrate 313 is connected to the FPC 315. The pixel portion 312, the protection circuit 316, and the scan line driver circuit 314 are formed using any of the thin film transistors presented in the preceding embodiments. The signal line driver circuit 313 is connected to the pixel portion 312 via the FPC 315 and the protection circuit 316. A potential of a power supply, various signals, and the like are supplied to the pixel portion 312, the signal line driver circuit 313, and the scan line driver circuit 314 through the FPC 315. The protection circuit 316 may be provided between the FPC 315 and the pixel portion 312.

Figure 24C:
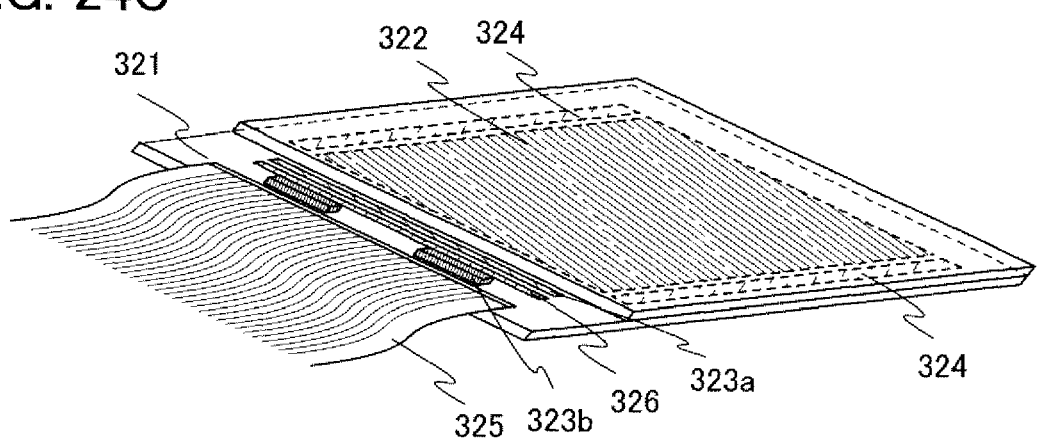

Furthermore, only part of the signal line driver circuit or only part of the scan line driver circuit may be formed over the same substrate as the pixel portion using any of the thin film transistor described in the above embodiments, and the rest may be formed separately and electrically connected to the pixel portion. FIG. 24C shows a mode of a display panel in which an analog switch 323a included in a signal line driver circuit is formed over a substrate 321 over which a pixel portion 322 and a scan line driver circuit 324 are formed, and a shift register 323b included in the signal line driver circuit is formed separately over a different substrate and then attached to the substrate 321. The pixel portion 322, the protection circuit 326, and the scan line driver circuit 324 are formed using any of the thin film transistors presented in the preceding embodiments. The shift register 323b included in the signal line driver circuit is connected to the pixel portion 322 via the FPC 325 and the protection circuit 326. A potential of a power supply, various signals, and the like are supplied to the pixel portion 322, the signal line driver circuit, and the scan line driver circuit 324 through the FPC 325, respectively. The protection circuit 326 may be provided between the shift register 323*b* and the analog switch 323*a*.

As illustrated in FIGS. 24A to 24C, in the display device of this embodiment, an entire driver circuit or part thereof can be formed over the same substrate as a pixel portion, using any of the thin film transistors presented in the preceding embodiments.

Note that a connection method of a substrate which is separately formed is not particularly limited, and a known COG method, wire bonding method, TAB method, or the like can be used. Further, a connection position is not limited to the position illustrated in FIGS. 24A to 24C, as long as electrical connection is possible. Also, a controller, a CPU, a memory, or the like may be formed separately and connected.

The signal line driver circuit used in this embodiment has the shift register and the analog switch. In addition to the shift register and the analog switch, another circuit such as a buffer, a level shifter, or a source follower may be included. Also, the shift register and the analog switch is not always required to be provided, and for example a different circuit such as a decoder circuit by which selection of signal line is possible may be used instead of the shift register, and a latch or the like may be used instead of the analog switch.

(Embodiment 10)

An element substrate which is formed of the thin film transistor described in any of the aforementioned embodiments and a display device or the like with the use of this element substrate can be applied to an active-matrix display panel. That is, the aforementioned embodiments can be applied to all electronic devices in each of which the element substrate is incorporated into a display portion.

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). Examples of these appliances are illustrated in FIGS. 25A to 25D.

FIG. 25A illustrates a television device. The television device can be completed by incorporating the display panel to which the aforementioned embodiment is applied into a housing. A main screen 333 is formed with the display panel, and a speaker portion 339, operation switches, or the like are provided as other additional accessories.

As illustrated in FIG. 25A, a display panel 332 utilizing a display element is incorporated into a housing 332. In addition to reception of general television broadcast by a receiver 335, communication of information in one direction (from a transmitter to a receiver) or in two directions (between a transmitter and a receiver or between receivers) can be performed by connection to a wired or wireless communication network through a modem 334. Operation of the television device can be performed by the switch incorporated into the housing or a remote control device 336. This remote control device 336 may also be provided with a display portion 337 for displaying output information, and the display portion 337 may also be provided with the thin film transistor of any of Embodiment 1 to Embodiment 6. Further, the television device may include a sub screen 338 formed with another display panel to display channels, volume, or the like, in addition to the main screen 333. In this structure, the thin film transistor of any of Embodiment 1 to Embodiment 6 can be applied to either or both the main screen 333 and the sub screen 338.

Figure 26:
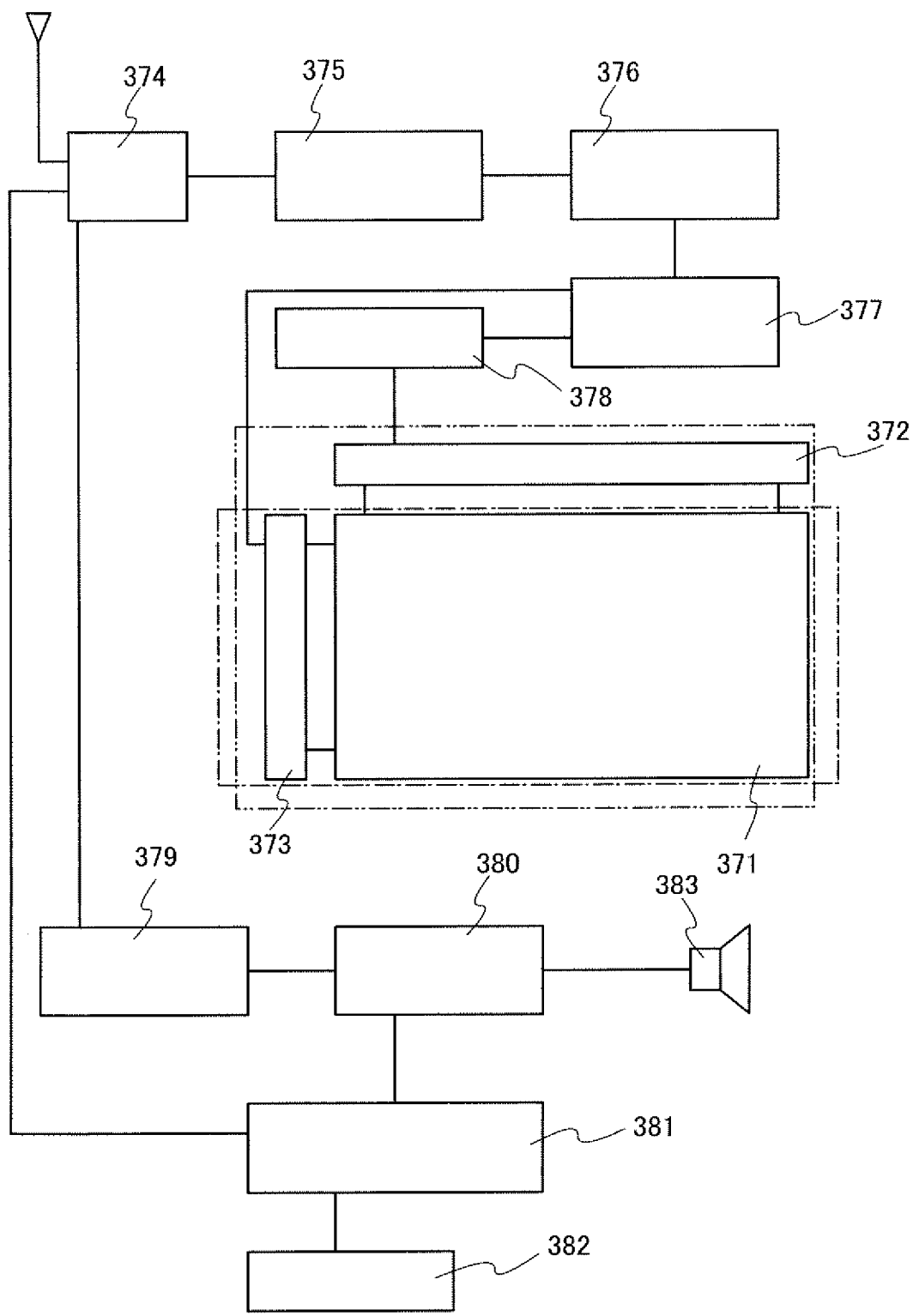
FIG. 26 is a diagram illustrating an electronic device or the like in which a thin film transistor of one embodiment of the present invention can be used.

FIG. 26 is a block diagram illustrating a main structure of a television device. A display panel is provided with a pixel portion 371. A signal line driver circuit 372 and a scan line driver circuit 373 may be mounted on the display panel by a COG method.

As another circuit, a video signal amplifier circuit 375 that amplifies a video signal among signals received by a tuner 374; a video signal processing circuit 376 that converts the signals outputted from the video signal amplifier circuit 375 into chrominance signals corresponding to respective colors of red, green, and blue; a control circuit 377 that converts the video signal into an input specification of the driver IC; and the like are provided on an input side of the video signal. The control circuit 377 outputs a signal to both a scan line side and a signal line side. In the case of digital driving, a structure may be employed in which a signal line dividing circuit 378 is provided on the signal line side and an input digital signal is divided into m pieces (m is an integer) to be inputted.

Among the signals received by the tuner 374, an audio signal is transmitted to an audio signal amplifier circuit 379, and an output thereof is inputted into a speaker 383 through an audio signal processing circuit 380. A control circuit 381 receives control information of a receiving station (received frequency) or a sound volume from an input portion 382, and transmits signals to the tuner 374 and the audio signal processing circuit 380.

Needless to say, an electronic device into which display panel according to this embodiment can be incorporated is not limited to a television device, and may be applied to monitors of personal computers, or display media having a large area, such as information display boards in railway stations, airports, and the like, and street-side advertisement display boards.

As described above, a television device having high image quality and low power consumption can be manufactured by applying the thin film transistor described in any of Embodiment 1 to Embodiment 6 to either or both the main screen 333 and the sub screen 338.

FIG. 25B illustrates one example of a cellular phone 341. The cellular phone 341 includes a display portion 342, an operation portion 343, and the like. The image quality thereof can be improved and the power consumption thereof can be reduced by applying, to the display portion 342, the thin film transistor described in any of Embodiment 1 to Embodiment 6.

A portable computer illustrated in FIG. 25C includes a main body 351, a display portion 352, and the like. The image quality thereof can be improved and the power consumption thereof can be reduced by applying, to the display portion 352, the thin film transistor described in Embodiment 1 or the like.

FIG. 25D illustrates a desk lamp, which includes a lighting portion 361, a shade 362, an adjustable arm 363, a support 364, a base 365, and a power source 366. The desk lamp is formed using, for the lighting portion 361, the light-emitting device which is described in the above embodiment. The image quality thereof can be improved and the power consumption thereof can be reduced by applying, to the lighting portion 361, the thin film transistor described in any of Embodiment 1 to Embodiment 6.

Figure 27A:
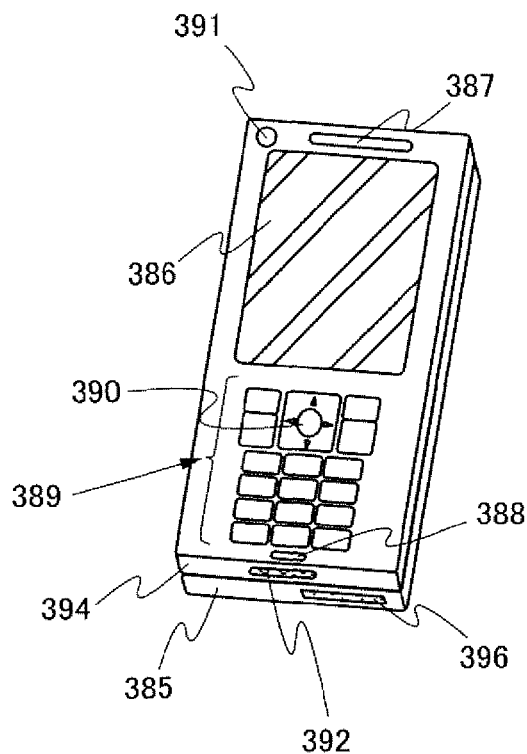
FIGS. 27A to 27C are diagrams illustrating electronic devices or the like in each of which a thin film transistor of one embodiment of the present invention can be used.
Figure 27B:
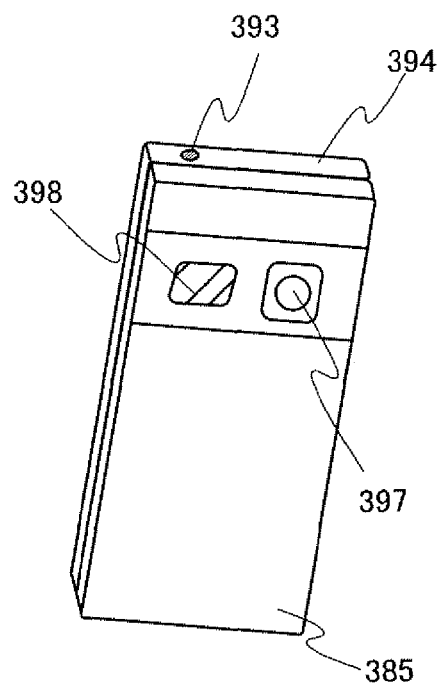
Figure 27C:
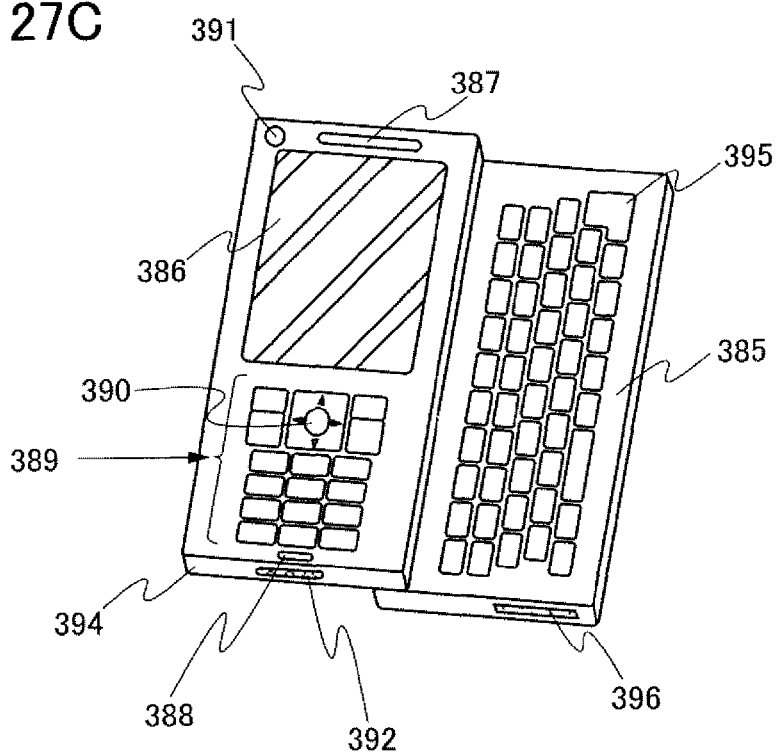

FIGS. 27A to 27C illustrate a structural example of a cellular phone, and the element substrate having the thin film transistor described in any of Embodiment 1 to Embodiment 6 and the display device having the element substrate are applied to, for example, a display portion thereof. FIG. 27A is a front view, FIG. 27B is a rear view, and FIG. 27C is a development view. The cellular phone illustrated in FIG. 27A to 27C includes two housings, a housing 394 and a housing 385. The cellular phone illustrated in FIGS. 27A to 27C, which is also referred to as a smartphone, has both of functions of a cellular phone and a portable information terminal, incorporates a computer, and can perform a variety of data processing in addition to voice calls.

The cellular phone includes two housings, the housing 394 and the housing 385. The housing 394 includes a display portion 386, a speaker 387, a microphone 388, operation keys 389, a pointing device 390, a front camera lens 391, a jack 392 for an external connection terminal, an earphone terminal 393, and the like, while the housing 385 includes a keyboard 395, an external memory slot 396, a rear camera 397, a light 398, and the like. In addition, an antenna is incorporated into the housing 394.

In addition to the structure described above, a non-contact IC chip, a small size memory device, or the like can be incorporated into the cellular phone.

The housings 394 and 385 are overlapped with each other in FIG. 27A and slid, and the cellular phone is developed as illustrated in FIG. 27C. In the display portion 386, the display device having a thin film transistor described in any of Embodiment 1 to Embodiment 6 can be incorporated, and display direction can be changed as appropriate depending on a use mode. Note that since the front camera lens 391 is provided in the same plane as the display portion 386, the cellular phone can be used as a videophone. A still image and a moving image can be taken by the rear camera 397 and the light 398 by using the display portion 386 as a viewfinder.

The speaker 387 and the microphone 388 can be used for videophone, recording and playing sound, and the like in addition to voice calls. With the use of the operation keys 389, operation of incoming and outgoing calls, simple information input such as electronic mail, operation of scrolling of a screen, cursor motion displayed on the display portion 386, and the like are possible.

If much information needs to be treated, such as documentation, use as a portable information terminal, and the like, it is convenient to use the keyboard 395. The housings 394 and 385 that overlap with each other (FIG. 27A) is slid and the cellular phone is developed as illustrated in FIG. 27C, so that the cellular phone can be used as an information terminal. In addition, with the use of the keyboard 395 and the pointing device 390, a cursor can be moved smoothly. An AC adaptor and various types of cables such as a USB cable can be connected to the jack 392 for an external connection terminal, through which charging and data communication with a personal computer or the like are possible. Moreover, by inserting a recording medium into the external memory slot 396, a large amount of data can be stored and moved.

In the rear surface of the housing 385 (FIG. 27B), the rear camera 397 and the light 398 are provided, and a still image and a moving image can be taken by using the display portion 386 as a viewfinder.

Further, the cellular phone may have an infrared communication function, a USB port, a function of receiving one segment television broadcast, a non-contact IC chip, an earphone jack, or the like, in addition to the aforementioned functional structures.

The image quality thereof can be improved and the power consumption thereof can be reduced by applying, to a pixel, the thin film transistor described in any of Embodiment 1 to Embodiment 6.

EXAMPLE 1

In this example, a state of LUMO in the case where a crystal grain boundary of Si is cross-linked with an NH radical in the simulation described in Embodiment 1 is described below.

FIG. 4 illustrates a state of LUMO (lowest unoccupied molecular orbital) of a model (model 1) in which a crystal grain boundary of Si is cross-linked with an O atom and FIG. 5 illustrates a state of LUMO of a model (model 2) in which the crystal grain boundary of Si is cross-linked with the NH radical. Here, LUMO is a molecular orbital of the lowest energy, where electrons in an excited state enter, and corresponds to an orbital of a bottom edge of conduction band (CB) in a band theory. Therefore, LUMO can be interpreted as a wave function of an electron contributed to carrier conduction and an orbital which determines carrier mobility.

Next, an atom and an orbital of the atom from which LUMO in each of the model 1 and the model 2 was derived were examined. A wave function of LUMO can be expressed by a linear combination (that is, a sum of scalar multiples) of an atomic orbital of an atom included in a film.

Note that respective existence probabilities of atomic orbitals can be obtained by the square of their respective absolute values of factors of the linear combination and the each sign proves whether the atomic orbitals are bonding orbitals (the same sign) or antibonding orbitals (different signs).

Figure 29A:
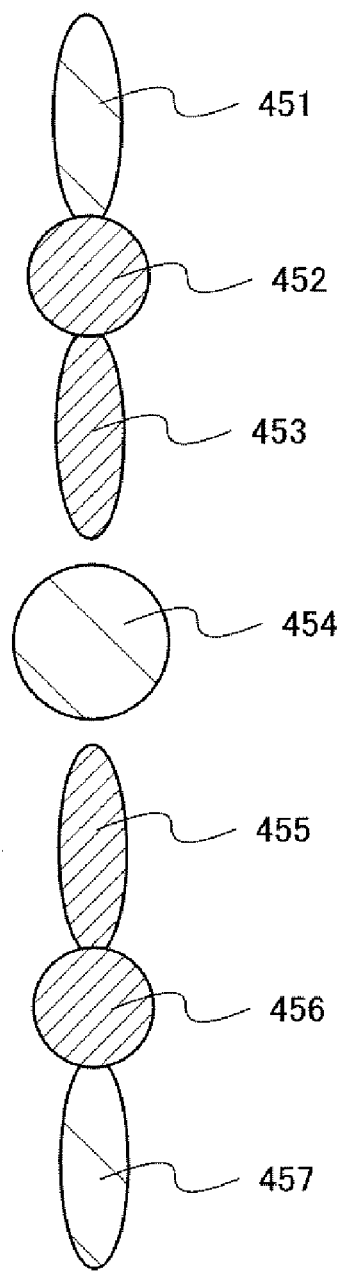
FIGS. 29A and 29B are diagrams illustrating a semiconductor layer included in a thin film transistor according to an embodiment of the present invention.
Figure 29B:
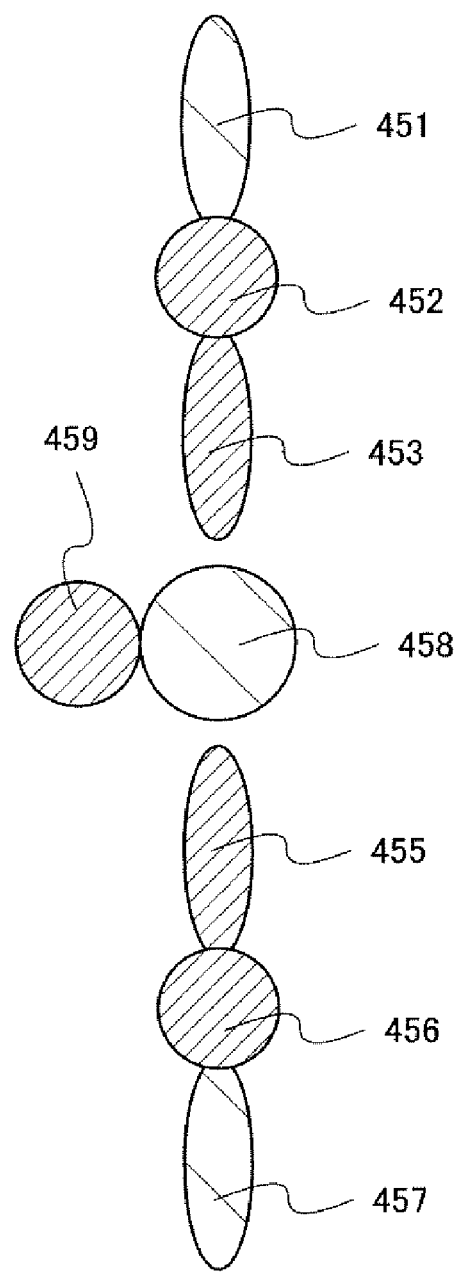

Next, FIG. 29A is a schematic view of a main atomic orbital forming LUMO at the periphery of the crystal grain boundary in the model 1, and FIG. 29B is a schematic view of a main atomic orbital forming LUMO at the periphery of the crystal grain boundary in the model 2. Here, regions with different hatchings have opposite signs of the wave function. Here, s orbitals 452 and 456 of a Si atom, p orbitals 451, 453, 455, and 457 of a Si atom, a 2s orbital 454 of an O atom, and a 2s orbital 458 of an N atom, and a 1s orbital 459 of an H atom are illustrated.

As illustrated in FIG. 29A, in the case where the crystal grain boundary of Si is cross-linked with the O atom, when the 2s orbital 454 of the O atom is focused, the phase of the 2s orbital 454 of the O atom is different from that of $sp^3$ orbitals (3s orbital 452+3p orbital 453 and 3s orbital 456+3p orbital 455) of the Si atom which are in opposite sides of the crystal grains. That is, the 2s orbital 454 of the O atom contributes to a combination between atoms; however, the 2s orbital 454 of the O atom cannot connect electron clouds because of a narrow spread of the wave function. Therefore, it is considered that the 2s orbital 454 of the O atom does not contribute to improvement of conductance.

On the other hand, as illustrated in FIG. 29B, in the case where the crystal grain boundary of Si is cross-linked with the NH radical, when the 2s orbital 458 of the N atom is focused, the phase of the 2s orbital 458 of the N atom is different from that of $sp^3$ orbitals (the 3s orbital 452+the 3p orbital 453 and the 3s orbital 456+the 3p orbital 455) of the Si atom which are in opposite sides of the crystal grains. That is, the 2s orbital 458 of the N atom cannot connect electron clouds. However, by mixing the 2s orbital 458 of the N atom with the 1s orbital 459 of the H atom, the $sp^3$ orbitals (the 3s orbital 452+the 3p orbital 453) of the Si atom, the 1s orbital 459 of the H atom, and the $sp^3$ orbitals (the 3s orbital 456+the 3p orbital 455) of the Si atom, which have the same sign, become bonding orbitals, whereby the electron clouds can be connected to each other. Accordingly, the conductance is improved.

Figure 30A:
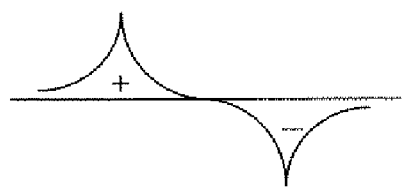
FIGS. 30A and 30B are diagrams illustrating a semiconductor layer included in a thin film transistor according to an embodiment of the present invention.
Figure 30B:

The aforementioned results can be interpreted as follows. That is, LUMO is an exited state (has high energy); therefore, in general, LUMO has antibonding orbital of the atomic orbital as illustrated in FIG. 30A. In the cross-link of the Si crystal grain boundary with the O atom in the model 1 illustrated in FIG. 29A and the cross-link of the Si crystal grain boundary with the NH radical in the model 2 illustrated in FIG. 29B, the 2s orbital 454 of the O atom and the 2s orbital 458 of the N atom have antibonding with (have phases opposite to) the sp³ orbitals (the 3s orbital 452+the 3p orbital 453, the 3s orbital 456+the 3p orbital 455) of the Si atom. The antibonding orbital indicates that a joint is formed between electron clouds. Accordingly, in the case of the cross-link of the Si crystal grain boundary with the O atom in the model 1 illustrated in FIG. 29A, the electron clouds are not connected to each other. Meanwhile, in the ease of the cross-link of the Si crystal grain boundary with the NH radical in the model 2 illustrated in FIG. 29B, although the 2s orbital 458 of the N atom and the sp³ orbitals (the 3s orbital 452+the 3p orbital 453 and the 3s orbital 456+the 3p orbital 455) of the Si atom form an antibonding orbital, the 1s orbital 459 of the H atom and the sp³ orbitals (the 3s orbital 452+the 3p orbital 453 and the 3s orbital 456+the 3p orbital 455) of the Si atom can form a bonding orbital as illustrated in FIG. 30B because of existence of the H atom. That is, the electron clouds can be connected to each other because of existence of the H atom.

Note that although a $CH_2$ radical includes an H atom, a molecular orbital formed by combine an atomic orbital of a C atom and an H atom in the $CH_2$ radical forms a molecular orbital with higher energy and therefore the molecular orbital is not included in the atomic orbital included in LUMO (lowest unoccupied molecular orbital). Thus, it is considered that even with a cross-link of the Si crystal grain boundary with the $CH_2$ radical, the electron clouds are not connected to each other.

Accordingly, in LUMO of the Si crystal grain boundary cross-linked with the NH radical, the sp³ orbitals of the Si atom in the opposite sides of the crystal grain boundary have phases which are opposite to the phase of the 2s orbital of the N atom and the same as the phase of the 1s orbital of the H atom. Thus, the 1s orbital of the H atom functions as a bridge between the electron clouds. As a result, the electron clouds are connected to each other and thus a carrier path is formed. Further, it is estimated that, in order to connect the electron clouds at the Si crystal grain boundary, an atom of which an atomic orbital in a cross-linking radical forms LUMO (for example. an O atom in the O cross-link, or the N atom and the H atom in the NH radical) and an atom having the same phase as the sp³ orbital of the Si atom (for example, the H atom in the NH radical) are needed.

This application is based on Japanese Patent Application serial no. 2008-130169 filed with Japan Patent Office on May 16, 2008, the entire contents of which are hereby incorporated by reference.

What is claimed is:

1. A thin film transistor comprising:
a gate electrode over a substrate having an insulating surface;
a gate insulating layer over the gate electrode;
an amorphous semiconductor layer over the gate insulating layer; and
a semiconductor layer including an impurity element imparting one conductivity type over the amorphous semiconductor layer,
wherein NH radicals are comprised in the amorphous semiconductor layer, such that a density of the NH radicals is higher in a bottom region of the amorphous semiconductor layer than in a region of the amorphous semiconductor layer over the bottom region.

2. The thin film transistor according to claim 1,
wherein dangling bonds of Si atoms included in the amorphous semiconductor layer are cross-linked with the NH radical.

3. The thin film transistor according to claim 1,
wherein the semiconductor layer comprises an NH radical; and
wherein dangling bonds included in the semiconductor layer are cross-linked with the NH radical.

4. The thin film transistor according to claim 1,
wherein a nitrogen atom of the NH radical is bonded to a first semiconductor atom, a second semiconductor atom, and a hydrogen atom of the amorphous semiconductor layer.

5. The thin film transistor according to claim 1,
wherein the amorphous semiconductor layer has an oxygen concentration measured by secondary ion mass spectroscopy of $5 \times 10^{18}$ cm$^{-3}$ or less.

6. The thin film transistor according to claim 1,
wherein the amorphous semiconductor layer forms a channel formation region; and
wherein the semiconductor layer including an impurity element imparting one conductivity type forms one of a source region and a drain region.

7. The electronic device including the thin film transistor according to claim 1.

8. A thin film transistor comprising:
a gate electrode over a substrate having an insulating surface;
a gate insulating layer over the gate electrode;
a first amorphous semiconductor layer comprising NH radicals over the gate insulating layer;
a second amorphous semiconductor layer over the first semiconductor layer; and
a semiconductor layer including an impurity element imparting one conductivity type over the second amorphous semiconductor layer,
wherein a density of NH radicals is higher in the first amorphous semiconductor layer than in the second amorphous semiconductor layer.

9. The thin film transistor according to claim 8,
wherein dangling bonds included in the first amorphous semiconductor layer are cross-linked with the NH radical.

10. The thin film transistor according to claim 8,
wherein the semiconductor layer comprises an NH radical; and
wherein dangling bonds included in the semiconductor layer are cross-linked with the NH radical.

11. The thin film transistor according to claim 8,
wherein a nitrogen atom of the NH radical is bonded to a first semiconductor atom, a second semiconductor atom, and a hydrogen atom of the first amorphous semiconductor layer.

12. The thin film transistor according to claim 8,
wherein the first amorphous semiconductor layer has an oxygen concentration measured by secondary ion mass spectroscopy of $5 \times 10^{18}$ cm$^{-3}$ or less.

13. The electronic device including the thin film transistor according to claim 8.

14. The thin film transistor according to claim 8,
wherein the semiconductor layer including an impurity element imparting one conductivity type forms one of a source and a drain region.

15. A thin film transistor comprising:
a gate electrode over a substrate having an insulating surface;
a gate insulating layer over the gate electrode; and
an amorphous semiconductor layer over the gate insulating layer,
wherein NH radicals are comprised in the amorphous semiconductor layer, such that a density of the NH radicals is higher in a region of the amorphous semiconductor layer on the gate insulating layer side than in a region of the amorphous semiconductor layer over the region on the gate insulating layer side.

16. The thin film transistor according to claim 15, wherein the amorphous semiconductor layer has an oxygen concentration measured by secondary ion mass spectroscopy of $5 \times 10^{18}$ cm$^{-3}$ or less at the interface with the gate insulating layer.

17. The thin film transistor according to claim 15, wherein a concentration of nitrogen is greater than a concentration of oxygen as an impurity in the amorphous semiconductor layer.

18. The electronic device including the thin film transistor according to claim 15.

* * * * *